(12) United States Patent
Hatakeyama et al.

(10) Patent No.: US 8,507,173 B2
(45) Date of Patent: *Aug. 13, 2013

(54) PATTERNING PROCESS

(75) Inventors: Jun Hatakeyama, Joetsu (JP);
Kazuhiro Katayama, Joetsu (JP)

(73) Assignee: Shin-Etsu Chemical Co., Ltd., Tokyo (JP)

(*) Notice: Subject to any disclaimer, the term of this patent is extended or adjusted under 35 U.S.C. 154(b) by 342 days.

This patent is subject to a terminal disclaimer.

(21) Appl. No.: 12/633,423

(22) Filed: Dec. 8, 2009

(65) Prior Publication Data

US 2010/0159404 A1 Jun. 24, 2010

(30) Foreign Application Priority Data

Dec. 12, 2008 (JP) .................................. 2008-316688
Apr. 3, 2009 (JP) .................................. 2009-090895

(51) Int. Cl.
*G03F 7/00* (2006.01)
*G03F 7/004* (2006.01)

(52) U.S. Cl.
USPC ........ 430/270.1; 430/312; 430/330; 430/331; 430/945

(58) Field of Classification Search
USPC ................... 430/270.1, 312, 330, 331, 945
See application file for complete search history.

(56) References Cited

U.S. PATENT DOCUMENTS

| | | | |
|---|---|---|---|
| 5,686,223 A * | 11/1997 | Cleeves | 430/312 |
| 6,448,420 B1 | 9/2002 | Kinsho et al. | |
| 6,605,814 B1 | 8/2003 | Tadika et al. | |
| 6,891,596 B2 * | 5/2005 | Rostalski et al. | 355/53 |
| 7,047,994 B2 * | 5/2006 | McPeak et al. | 137/15.24 |
| 7,067,231 B2 * | 6/2006 | Harada et al. | 430/270.1 |
| 7,449,277 B2 | 11/2008 | Hatakeyama et al. | |
| 7,537,880 B2 | 5/2009 | Harada et al. | |
| 7,598,016 B2 | 10/2009 | Kobayashi et al. | |
| 7,741,015 B2 * | 6/2010 | Hatakeyama et al. | 430/312 |
| 7,993,811 B2 * | 8/2011 | Ohsawa et al. | 430/270.1 |
| 8,003,295 B2 * | 8/2011 | Hatakeyama | 430/270.1 |
| 8,021,822 B2 * | 9/2011 | Ohsawa et al. | 430/270.1 |
| 8,057,982 B2 * | 11/2011 | Hatakeyama et al. | 430/270.1 |
| 2003/0096196 A1 | 5/2003 | Mimura et al. | |

(Continued)

FOREIGN PATENT DOCUMENTS

| | | |
|---|---|---|
| JP | 5-102029 A | 4/1993 |
| JP | 5-190444 A | 7/1993 |

(Continued)

OTHER PUBLICATIONS

S. Hsu et al, "Double Exposure Technique for 45nm node and Beyond," Proceedings of SPIE, vol. 5992, 5992Q-1-16.

(Continued)

*Primary Examiner* — Amanda C. Walke
(74) *Attorney, Agent, or Firm* — Westerman, Hattori, Daniels & Adrian, LLP

(57) ABSTRACT

A pattern is formed by applying a first positive resist composition onto a substrate, heat treatment, exposure, heat treatment and development to form a first resist pattern; causing the first resist pattern to crosslink and cure by irradiation of high-energy radiation of 200-320 nm wavelength; further applying a second positive resist composition onto the substrate, heat treatment, exposure, heat treatment and development to form a second resist pattern. The double patterning process reduces the pitch between patterns to one half.

14 Claims, 9 Drawing Sheets

(56) References Cited

U.S. PATENT DOCUMENTS

| | | |
|---|---|---|
| 2008/0032232 A1 | 2/2008 | Bae et al. |
| 2008/0090172 A1 | 4/2008 | Hatakeyama et al. |
| 2008/0096134 A1* | 4/2008 | Sugimoto et al. .......... 430/287.1 |
| 2009/0079948 A1 | 3/2009 | Kitano et al. |
| 2009/0087786 A1* | 4/2009 | Hatakeyama .............. 430/285.1 |
| 2009/0226843 A1* | 9/2009 | Hatakeyama et al. ..... 430/286.1 |
| 2010/0009286 A1* | 1/2010 | Takeda et al. .............. 430/270.1 |
| 2011/0171529 A1* | 7/2011 | Kono et al. .................. 429/223 |

FOREIGN PATENT DOCUMENTS

| | | |
|---|---|---|
| JP | 9-063921 A | 3/1997 |
| JP | 2000-327633 A | 11/2000 |
| JP | 2000-331910 A | 11/2000 |
| JP | 2003-158057 A | 5/2003 |
| JP | 2004-163877 A | 6/2004 |
| JP | 2005-189842 A | 7/2005 |
| JP | 3796568 B2 | 7/2006 |
| JP | 3829913 B2 | 10/2006 |
| JP | 2007-114728 A | 5/2007 |
| JP | 2007119678 A * | 5/2007 |
| JP | 2008-111103 A | 5/2008 |
| JP | 2008-122932 A | 5/2008 |
| JP | 2008-239918 A | 10/2008 |

OTHER PUBLICATIONS

B. J. Lin et al, "Semiconductor Foundry, Lithography, and Partners," Proceedings of SPIE, vol. 4690, xxix.

S. Owa et al, "Immersion lithography; its potential performance and issues," Proceedings of SPIE, vol. 5040, p. 724.

M. Shibuya et al, "Performance of Resolution Enhancement Technique Using Both Multiple Exposure and Nonlinear Resist," Japan Journal of Applied Physics, vol. 33, 1994, pp. 6874-6877.

* cited by examiner

APPLY PHOTORESIST

EXPOSE AND DEVELOP
PHOTORESIST

ETCH HARD MASK

APPLY, EXPOSE AND DEVELOP
2ND PHOTORESIST

ETCH PROCESSABLE
SUBSTRATE

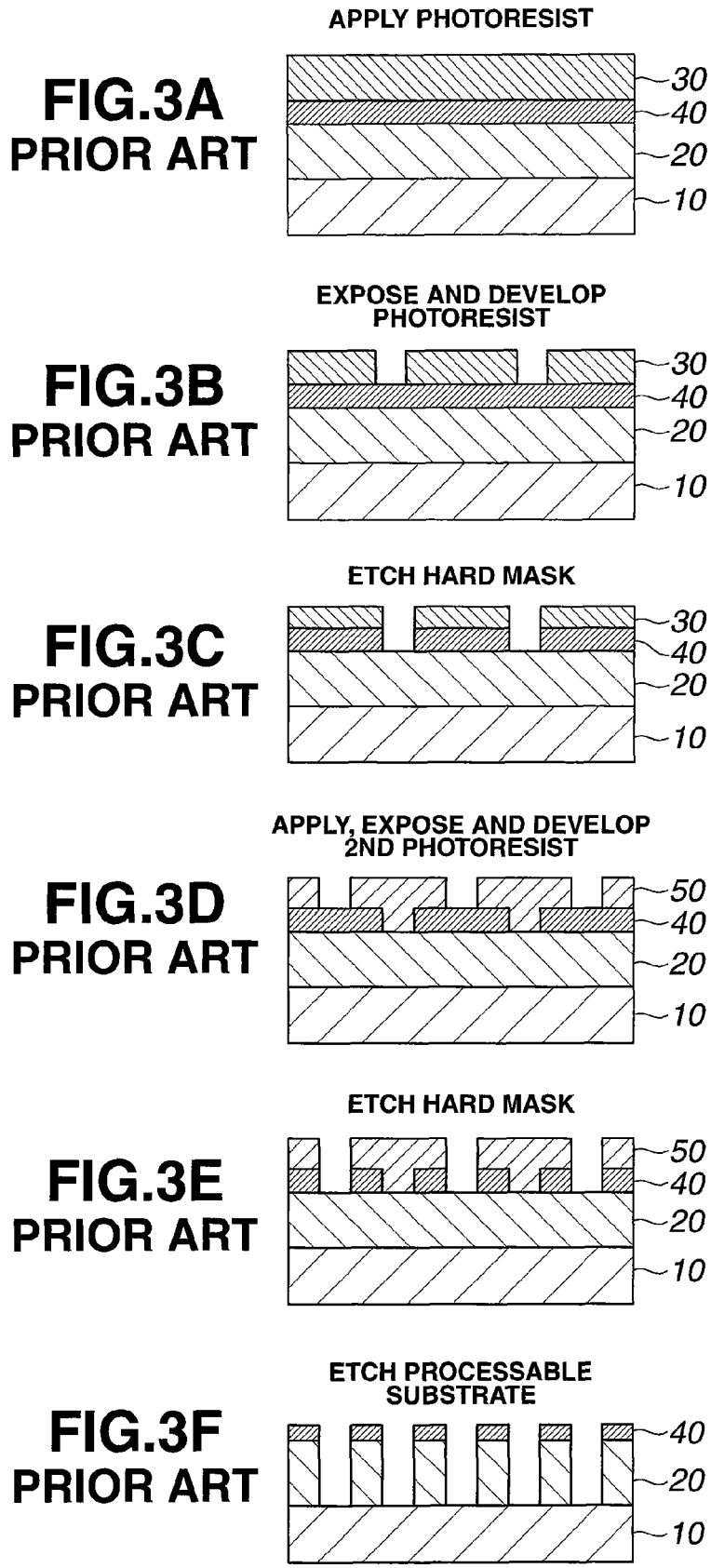

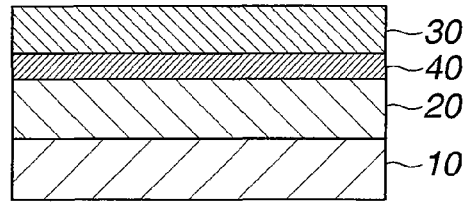
FIG.4A APPLY PHOTORESIST
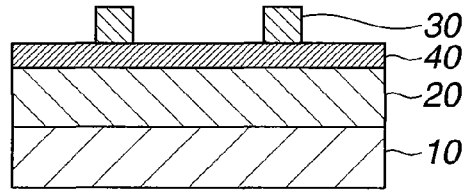
FIG.4B EXPOSE AND DEVELOP PHOTORESIST
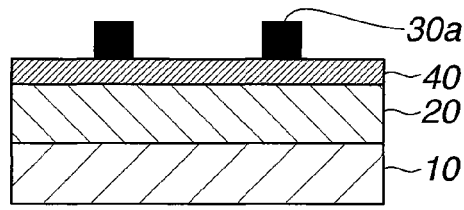
FIG.4C CURE PHOTORESIST PATTERN
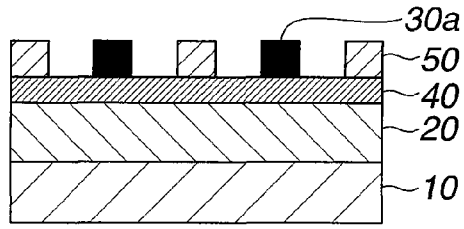
FIG.4D APPLY, EXPOSE AND DEVELOP 2ND PHOTORESIST
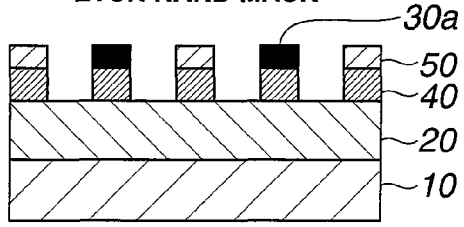
FIG.4E ETCH HARD MASK
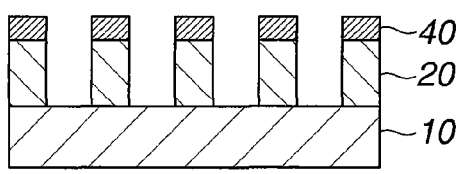
FIG.4F ETCH PROCESSABLE SUBSTRATE

FIRST PATTERN

SECOND PATTERN

FIRST PATTERN

SECOND PATTERN

WAGE LENGTH (nm)

WAGE LENGTH (nm)

A
FIRST PATTERN

B
SECOND PATTERN

PATTERNING PROCESS

CROSS-REFERENCE TO RELATED APPLICATION

This non-provisional application claims priority under 35 U.S.C. §119(a) on Patent Application Nos. 2008-316688 and 2009-090895 filed in Japan on Dec. 12, 2008 and Apr. 3, 2009, respectively, the entire contents of which are hereby incorporated by reference.

TECHNICAL FIELD

This invention relates to a process for forming a pattern by forming a first pattern through first exposure, rendering the first pattern insoluble in organic solvent or alkaline water by irradiation of ultraviolet radiation, and forming a line pattern in spaces of the first pattern through second exposure, for thereby reducing the distance between the patterns.

BACKGROUND ART

In the recent drive for higher integration and operating speeds in LSI devices, the pattern rule is made drastically finer. The photolithography which is currently on widespread use in the art is approaching the essential limit of resolution determined by the wavelength of a light source. As the light source used in the lithography for resist pattern formation, g-line (436 nm) or i-line (365 nm) from a mercury lamp was widely used in 1980's. Reducing the wavelength of exposure light was believed effective as the means for further reducing the feature size. For the mass production process of 64 MB dynamic random access memories (DRAM, processing feature size 0.25 µm or less) in 1990's and later ones, the exposure light source of i-line (365 nm) was replaced by a KrF excimer laser having a shorter wavelength of 248 nm. However, for the fabrication of DRAM with a degree of integration of 256 MB and 1 GB or more requiring a finer patterning technology (processing feature size 0.2 or less), a shorter wavelength light source was required. Over a decade, photolithography using ArF excimer laser light (193 nm) has been under active investigation. It was expected at the initial that the ArF lithography would be applied to the fabrication of 180-nm node devices. However, the KrF excimer lithography survived to the mass-scale fabrication of 130-nm node devices. So, the full application of ArF lithography started from the 90-nm node. The ArF lithography combined with a lens having an increased numerical aperture (NA) of 0.9 is considered to comply with 65-nm node devices. For the next 45-nm node devices which required an advancement to reduce the wavelength of exposure light, the $F_2$ lithography of 157 nm wavelength became a candidate. However, for the reasons that the projection lens uses a large amount of expensive $CaF_2$ single crystal, the scanner thus becomes expensive, hard pellicles are introduced due to the extremely low durability of soft pellicles, the optical system must be accordingly altered, and the etch resistance of resist is low; the postponement of $F_2$ lithography and the early introduction of ArF immersion lithography were advocated (see Proc. SPIE, Vol. 4690 xxix, 2002).

In the ArF immersion lithography, the space between the projection lens and the wafer is filled with water. Since water has a refractive index of 1.44 at 193 nm, pattern formation is possible even using a lens having a numerical aperture (NA) of 1.0 or greater. Theoretically, it is possible to increase the NA to nearly 1.44. It was initially recognized that the resolution could be degraded and the focus be shifted by a variation of water's refractive index with a temperature change. The problem of refractive index variation could be solved by controlling the water temperature within a tolerance of 1/100° C. while it was recognized that the impact of heat from the resist film upon light exposure drew little concern. There was a likelihood that micro-bubbles in water could be transferred to the pattern. The risk of bubble generation could be obviated by thorough deaeration of water, and the risk of bubble generation from the resist film upon light exposure is substantially nil. At the initial phase in 1980's of the immersion lithography, a method of immersing an overall stage in water was proposed. Later proposed was a partial-fill method of using a water feed/drain nozzle for introducing water only between the projection lens and the wafer so as to comply with the operation of a high-speed scanner. In principle, the immersion technique using water enabled lens design to a NA of 1 or greater. In optical systems based on traditional refractive index materials, this leads to giant lenses, which would deform by their own weight. For the design of more compact lenses, a catadioptric system was proposed, accelerating the lens design to a NA of 1.0 or greater. A combination of a lens having NA of 1.2 or greater with strong resolution enhancement technology suggests a way to the 45-nm node (see Proc. SPIE, Vol. 5040, p 724, 2003). Efforts have also been made to develop lenses of NA 1.35.

One candidate for the 32-nm node lithography is lithography using extreme ultraviolet (EUV) radiation with wavelength 13.5 nm. The EUV lithography has many accumulative problems to be overcome, including increased laser output, increased sensitivity, increased resolution and minimized line-width roughness (LWR) of resist coating, defect-free MoSi laminate mask, reduced aberration of reflection mirror, and the like.

The water immersion lithography using a NA 1.35 lens achieves an ultimate resolution of 40 to 38 nm at the maximum NA, but cannot reach 32 nm. Efforts have been made to develop higher refractive index materials in order to further increase NA. It is the minimum refractive index among projection lens, liquid, and resist film that determines the NA limit of lenses. In the case of water immersion, the refractive index of water is the lowest in comparison with the projection lens (refractive index 1.5 for synthetic quartz) and the resist film (refractive index 1.7 for prior art methacrylate-based film). Thus the NA of projection lens is determined by the refractive index of water. Recent efforts succeeded in developing a highly transparent liquid having a refractive index of 1.65. In this situation, the refractive index of projection lens made of synthetic quartz is the lowest, suggesting a need to develop a projection lens material with a higher refractive index. LuAG (lutetium aluminum garnet $Lu_3Al_5O_{12}$) having a refractive index of at least 2 is the most promising material, but has the problems of birefringence and noticeable absorption. Even if a projection lens material with a refractive index of 1.8 or greater is developed, the liquid with a refractive index of 1.65 limits the NA to 1.55 at most, failing in resolution of 32 nm. For resolution of 32 nm, a liquid with a refractive index of 1.8 or greater is necessary. Such a material has not been discovered because a tradeoff between absorption and refractive index is recognized in the art. In the case of alkane compounds, bridged cyclic compounds are preferred to linear ones in order to increase the refractive index, but the cyclic compounds undesirably have too high a viscosity to follow high-speed scanning on the exposure tool stage. If a liquid with a refractive index of 1.8 is developed, then the component having the lowest refractive index is the resist film, suggesting a need to increase the refractive index of a resist film to 1.8 or higher.

The process that now draws attention under the above-discussed circumstances is a double patterning process involving a first set of exposure and development to form a first pattern and a second set of exposure and development to form a pattern between the first pattern features. See Proc. SPIE, Vol. 5992, 59921Q-1-16. A number of double patterning processes are proposed. One exemplary process involves a first set of exposure and development to form a photoresist pattern having lines and spaces at intervals of 1:3, processing the underlying layer of hard mask by dry etching, applying another layer of hard mask thereon, a second set of exposure and development of a photoresist film to form a line pattern in the spaces of the first exposure, and processing the hard mask by dry etching, thereby forming a line-and-space pattern at half pitch of the first pattern. An alternative process involves a first set of exposure and development to form a photoresist pattern having spaces and lines at intervals of 1:3, processing the underlying layer of hard mask by dry etching, applying a photoresist layer thereon, a second set of exposure and development to form a second space pattern on the remaining hard mask portion, and processing the hard mask by dry etching. In either process, the hard mask is processed by two dry etchings.

While the former process requires two applications of hard mask, the latter process uses only one layer of hard mask, but requires to form a trench pattern which is difficult to resolve as compared with the line pattern. The latter process includes the use of a negative resist material in forming the trench pattern. This allows for use of high contrast light as in the formation of lines as a positive pattern. Since the negative resist material has a lower dissolution contrast than the positive resist material, a comparison of the formation of lines from the positive resist material with the formation of a trench pattern of the same size from the negative resist material reveals that the resolution achieved with the negative resist material is lower. After a wide trench pattern is formed from the positive resist material by the latter process, there may be applied a thermal flow method of heating the substrate for shrinkage of the trench pattern, or a RELACS method of coating a water-soluble film on the trench pattern as developed and heating to induce crosslinking at the resist film surface for achieving shrinkage of the trench pattern. These have the drawbacks that the proximity bias is degraded and the process is further complicated, leading to a reduced throughput.

Both the former and latter processes require two etchings for substrate processing, leaving the issues of a reduced throughput and deformation and misregistration of the pattern by two etchings.

To proceed with a single etching, one method is by using a negative resist material in a first exposure and a positive resist material in a second exposure. Another method is by using a positive resist material in a first exposure and a negative resist material in a higher alcohol of more than 3 carbon atoms, in which the positive resist material is not dissolvable, in a second exposure. In these methods using negative resist materials with low resolution, degradation of resolution occurs.

A method which does not involve post-exposure bake (PEB) and development between first and second exposures is the simplest method. This method involves first exposure, replacement by a mask having a shifted pattern drawn, second exposure, PEB, development and dry etching. Since the throughput is substantially reduced by mask replacement on every exposure, the first exposure is carried out in a somewhat integrated manner before the second exposure is carried out. Then, depending on the holding time between the first exposure and the second exposure, a dimensional variation due to acid diffusion and a profile variation such as T-top profile formation occur. To suppress the T-top formation, application of a resist protective film is effective. Application of a resist protective film for immersion lithography enables a process involving two exposures, one PEB, development and dry etching. First exposure and second exposure may be consecutively carried out by two scanners arranged side by side. This gives rise to such problems as misregistration due to lens aberration between the two scanners and the doubled scanner cost.

If a common resist surface is subjected to exposure under the condition that the first exposure and the second exposure are shifted half-pitch, the contrast becomes zero because the energy of second exposure offsets the energy of first exposure. If a contrast enhancement layer (CEL) is applied onto the resist film, the light incident on the resist film becomes nonlinear so that no offset occurs between the first and second exposures, forming a half-pitch image. See Jpn. J. Appl. Phy., Vol. 33 (1994), p 6874-6877. It is also expected that a similar effect may be achieved by using an acid generator capable of two-photon absorption in the resist to produce a nonlinear contrast.

The most critical issue associated with double patterning is an overlay accuracy between first and second patterns. Since the magnitude of misregistration is reflected by a variation of line size, an attempt to form 32-nm lines at an accuracy of 10%, for example, requires an overlay accuracy within 3.2 nm. Since currently available scanners have an overlay accuracy of the order of 8 nm, a significant improvement in accuracy is necessary. With a further progress in miniaturization of transistors, it becomes difficult to provide capacitors with a sufficient capacitance for electricity storage. As a result of transition from planar capacitors to vertical capacitors, vertical capacitors having a considerably high aspect ratio are now formed whether they are trench or stacked capacitors. Since capacitors must occupy a certain area in plane, a rectangular shape is preferred to a circular shape. However, the lithography is difficult to form rectangular holes by a single step of light exposure. A problem arises that corners are rounded by the impact of optical interference. In the prior art, an attempt was made to form a rectangular capacitor contact pattern by combining orthogonal two lines. One proposal involves forming first resist lines through first light exposure and development, insolubilizing the lines by light exposure or ion implantation, coating another resist directly thereon, and forming lines extending perpendicular to the first lines through second light exposure and development.

While the technique of modifying a photoresist film by light irradiation is well known in the art, studies have been made thereon for improving etch resistance. In JP-A H05-102029, for example, light of short wavelength is irradiated to a photoresist film on a substrate in vacuum while heating the substrate on a hot plate. JP-A H05-190444, JP-A H09-63921, JP-A 2000-331910, and JP-A 2003-158057 disclose suitable light irradiating systems. JP-A 2005-189842 describes means for preventing a resist pattern from collapsing by supplying a solution containing a photo-crosslinkable agent onto a photoresist film as developed, and irradiating light of short wavelength to render the photoresist film hydrophobic.

A phenomenon is well known that when novolac resin or polyhydroxystyrene is irradiated with light having a short wavelength of less than 200 nm, crosslinking takes place so that the resin becomes insoluble in organic solvents or alkaline developers. It is believed that phenolic hydroxyl groups undergo crosslinking reaction upon exposure to short wavelength light. By irradiating short wavelength light from the irradiating systems as mentioned above, patterns of i-line resist and KrF resist having phenolic hydroxyl groups after development are crosslinked whereby the patterns are improved in etch resistance.

Naphthalene ring is an aromatic having low absorption at wavelength 193 nm. ArF resist compositions based on hydroxyvinyl-naphthalene copolymers, naphthol-methacrylate copolymers, and hydroxyacenaphthylene are proposed in JP-A 2004-163877, JP 3829913, JP-A 2007-114728, and JP 3796568.

Citation List
Patent Document 1: JP-A H05-102029
Patent Document 2: JP-A H05-190444
Patent Document 3: JP-A H09-63921
Patent Document 4: JP-A 2000-331910
Patent Document 5: JP-A 2003-158057
Patent Document 6: JP-A 2005-189842
Patent Document 7: JP-A 2004-163877
Patent Document 8: JP 3829913
Patent Document 9: JP-A 2007-114728
Patent Document 10: JP 3796568
Non-Patent Document 1: Proc. SPIE, Vol. 4690, xxix, 2002
Non-Patent Document 2: Proc. SPIE, Vol. 5040, p 724, 2003
Non-Patent Document 3: Proc. SPIE, Vol. 5992, 59921Q-1-16
Non-Patent Document 4: Jpn. J. Appl. Phy., Vol. 33 (1994), p 6874-6877

DISCLOSURE OF THE INVENTION

As discussed above, when substrate processing is carried out by double dry etchings using resist patterns fabricated by double exposures and developments, the throughput is reduced to one half. Also an issue of pattern misregistration by dry etchings occurs.

An object of the invention is to provide a pattern forming process which involves curing of a first resist film by irradiation of light with a wavelength of more than 200 nm to 320 nm, for preventing intermixing between first and second resist films and dissolution of the first resist pattern in a developer in the second development, in order to enable a double patterning process of processing a substrate by a single dry etching.

It has been found that a double patterning process comprising a first set of coating, exposure and development steps to form a first resist pattern, and a second set of coating, exposure and development steps to form a second resist pattern in spaces of the first resist pattern is improved by the following measure.

The above and other objects can be achieved by a pattern forming process as defined below.

The invention provides a process for forming a pattern, comprising the steps of:
applying a first positive resist composition comprising a copolymer comprising recurring units having hydroxynaphthyl and/or hydroxyacenaphthylene and recurring units having an alkaline solubility that increases under the action of acid onto a substrate to form a first resist coating, heat treating, exposing the first resist coating to high-energy radiation, heat treating, and developing the exposed resist coating with a developer to form a first resist pattern,
causing the first resist coating to crosslink and cure,
applying a second positive resist composition onto the first resist pattern-bearing substrate to form a second resist coating, heat treating, exposing the second resist coating to high-energy radiation, heat treating, and developing the second resist coating with a developer to form a second resist pattern.

In a first embodiment, the step of causing the first resist coating to crosslink and cure is by irradiation of high-energy radiation having a wavelength of more than 200 nm to 320 nm. In a second embodiment, the step of causing the first resist coating to crosslink and cure is by irradiation of high-energy radiation having a wavelength of more than 200 nm to 320 nm and application of heat. In a second embodiment, the step of causing the first resist coating to crosslink and cure is by application of heat and subsequent irradiation of high-energy radiation having a wavelength of more than 200 nm to 320 nm.

In a preferred embodiment, the high-energy radiation having a wavelength of more than 200 nm to 320 nm used in the step of causing the first resist coating to crosslink and cure is KrBr excimer light of 206 nm wavelength, KrCl excimer light of 222 nm wavelength, KrF excimer light of 248 nm wavelength, XeBr excimer light of 283 nm wavelength, XeCl excimer light of 308 nm wavelength, or emission spanning 254 nm wavelength from a low-pressure mercury lamp, high-pressure mercury lamp or metal halide lamp.

In a preferred embodiment, the exposure steps to form the first and second resist patterns are by immersion lithography using an ArF excimer laser of 193 nm wavelength and a liquid having a refractive index of at least 1.4 interposed between a lens and the substrate. Typically the liquid is water.

In a preferred embodiment, the first resist pattern includes spaces, the second resist pattern is formed in the spaces of the first resist pattern, whereby the distance between the first and second patterns is reduced. In another preferred embodiment, the first resist pattern crosses the second resist pattern. In a further preferred embodiment, the second resist pattern is formed in a space area where the first resist pattern is not formed and in a different direction from the first resist pattern.

In a preferred embodiment, the copolymer comprising recurring units having hydroxynaphthyl and/or hydroxyacenaphthylene and recurring units having an alkaline solubility that increases under the action of acid comprises recurring units (a1) and/or (a2) and recurring units (b) shown by the general formula (1).

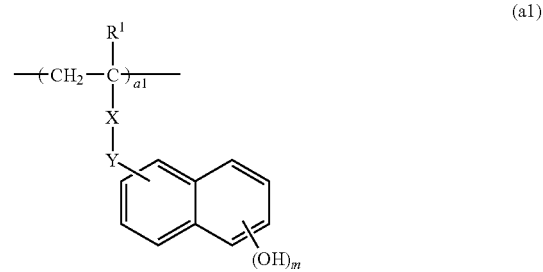

(a1)

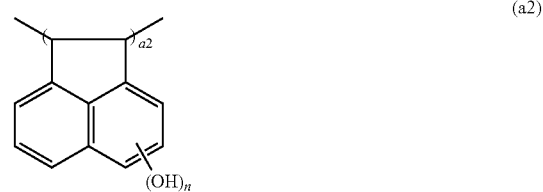

(a2)

(1)

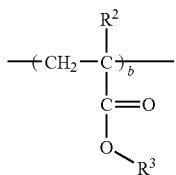

Herein $R^1$ and $R^2$ are each independently hydrogen or methyl, X is a single bond or —C(=O)—O—, Y is a single bond or a straight or branched $C_1$-$C_6$ alkylene group which may contain an ester or ether radical, m and n are 1 or 2, $R^3$ is an acid labile group, a1, a2 and b are numbers in the range: $0 \leq a1 < 1.0$, $0 \leq a2 < 1.0$, $0 < b < 1.0$, $0 < a1+a2 < 1.0$, and $0 < a1+a2+b \leq 1.0$.

In a more preferred embodiment, the copolymer comprises recurring units (a1), (a2), (b), (c1), and (c2) shown by the general formula (2).

(a1)

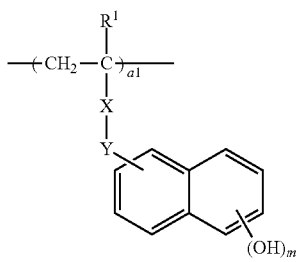

(a2)

(2)

(b)

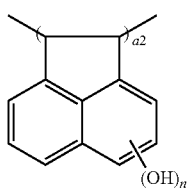

(c1)

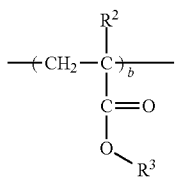

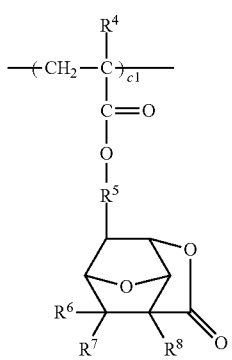

(c2)

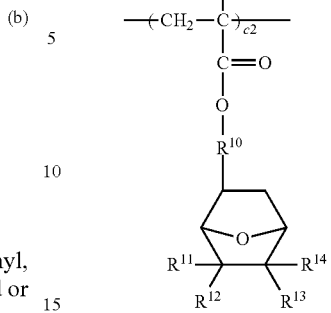

Herein $R^1$, $R^2$, $R^4$ and $R^9$ are each independently hydrogen or methyl, X is a single bond or —C(=O)—O—, Y is a single bond or a straight or branched $C_1$-$C_6$ alkylene group which may contain an ester or ether radical, m and n are 1 or 2, $R^3$ is an acid labile group, $R^5$ and $R^{10}$ are each independently a single bond or a straight, branched or cyclic $C_1$-$C_6$ alkylene group which may contain an ether or ester radical, the straight, branched or cyclic $C_1$-$C_6$ alkylene group having a primary or secondary carbon atom bonded to the ester moiety in the formula, $R^6$, $R^7$, $R^8$, $R^{11}$, $R^{12}$, $R^{13}$, and $R^{14}$ are each independently hydrogen or a straight, branched or cyclic $C_1$-$C_6$ alkyl group, a1, a2, b, c1, and c2 are numbers in the range: $0 \leq a1 < 1.0$, $0 \leq a2 < 1.0$, $0 < a1+a2 < 1.0$, $0 < b < 1.0$, $0 \leq c1 < 1.0$, $0 \leq c2 < 1.0$, $0 < c1+c2 < 1.0$, and $0 < a1+a2+b+c1+c2 \leq 1.0$.

ADVANTAGEOUS EFFECTS OF INVENTION

According to the invention, a first resist pattern is formed through exposure and development from a first positive resist composition. Through crosslinking reaction induced by high-energy radiation with a wavelength of more than 200 nm to 300 nm, specifically KrBr excimer light of 206 nm wavelength, KrCl excimer light of 222 nm wavelength, KrF excimer light of 248 nm wavelength, XeBr excimer light of 283 nm wavelength, XeCl excimer light of 308 nm wavelength, or emission spanning 254 nm wavelength from a low- or high-pressure mercury lamp or metal halide lamp, the first pattern is insolubilized in alkaline developer and resist solvent. A second resist composition is further applied onto the first resist pattern and substrate, exposed and developed to form a second resist pattern in the space area of the first resist pattern. This double patterning process reduces the pitch between pattern features to one half. The substrate can be processed by a single dry etching.

BRIEF DESCRIPTION OF THE DRAWINGS

FIG. 1 is a cross-sectional view of an exemplary prior art double patterning process.

FIG. 2 is a cross-sectional view of another exemplary prior art double patterning process.

FIG. 3 is a cross-sectional view of a further exemplary prior art double patterning process. FIG. 3A shows a laminate of substrate, processable substrate, hard mask and resist film, FIG. 3B shows the resist film being exposed and developed, FIG. 3C shows the hard mask being etched, FIG. 3D shows, after removal of the first resist film, a second resist film being formed, exposed and developed, FIG. 3E shows the hard mask being etched, and FIG. 3F shows the processable substrate being etched.

FIG. 4 is a cross-sectional view of a double patterning process according one embodiment of the invention. FIG. 4A shows a laminate of substrate, processable substrate, hard mask and resist film, FIG. 4B shows the resist film being exposed and developed, FIG. 4C shows the resist film being crosslinked, FIG. 4D shows a second resist film being formed, exposed and developed, FIG. 4E shows the hard mask being etched, and FIG. 4F shows the processable substrate being etched.

DESCRIPTION OF THE PREFERRED EMBODIMENT

Figure 1A:
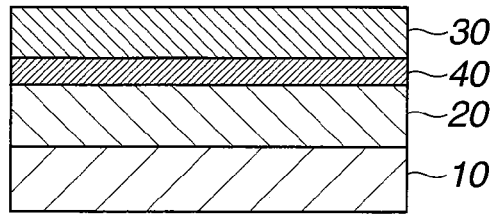
FIG. 1A shows a laminate of substrate, processable substrate, hard mask and resist film.
Figure 1B:
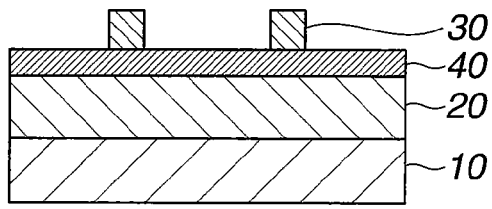
FIG. 1B shows the resist film being exposed and developed.
Figure 1C:
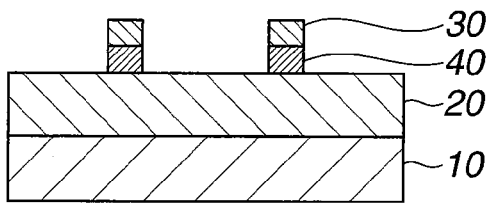
FIG. 1C shows the hard mask being etched.
Figure 1D:
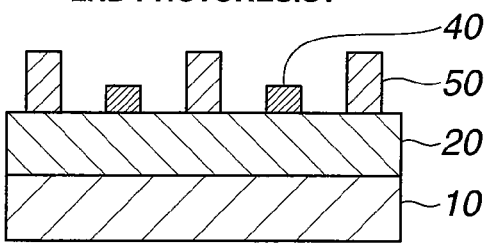
FIG. 1D shows a second resist film being formed, exposed and developed.
Figure 1E:
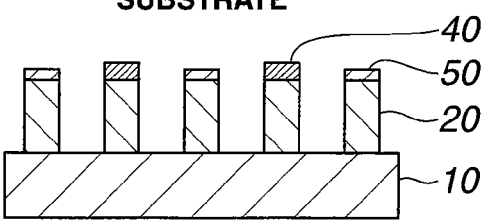
FIG. 1E shows the processable substrate being etched.
Figure 2A:
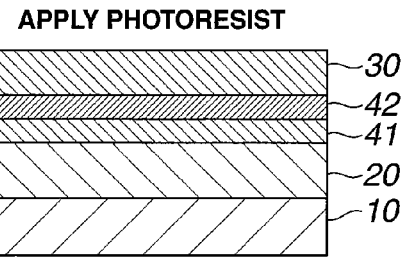
FIG. 2A shows a laminate of substrate, processable substrate, 1st and 2nd hard masks and resist film.
Figure 2B:
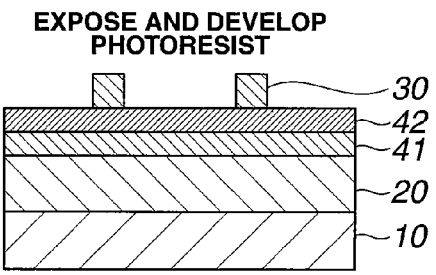
FIG. 2B shows the resist film being exposed and developed.
Figure 2C:
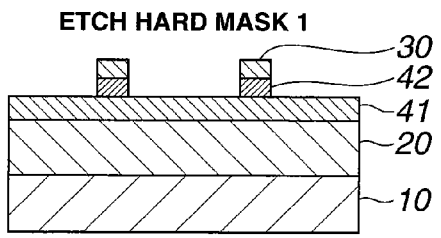
FIG. 2C shows the 2nd hard mask being etched.
Figure 2D:
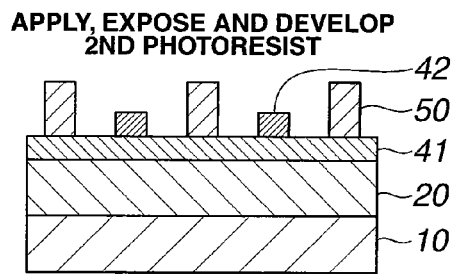
FIG. 2D shows, after removal of the first resist film, a second resist film being formed, exposed and developed.
Figure 2E:
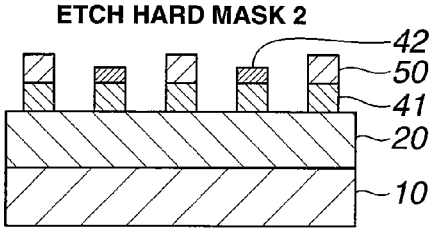
FIG. 2E shows the 1st hard mask being etched.
Figure 2F:
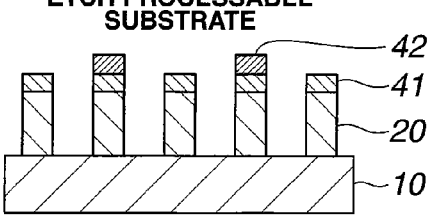
FIG. 2F shows the processable substrate being etched.

The singular forms "a," "an" and "the" include plural referents unless the context clearly dictates otherwise. As used herein, the terminology "($C_x$-$C_y$)", as applied to a particular unit, such as, for example, a chemical compound or a chemical substituent group, means having a carbon atom content of from "x" carbon atoms to "y" carbon atoms per such unit. As used herein, the term "film" is used interchangeably with "coating" or "layer." The term "processable substrate" is interchangeable with patternable substrate and refers to a substrate that can be processed such as by etching to form a pattern therein.

In connection with the double patterning lithography involving double exposures and developments to form a half-pitch pattern, the inventors made efforts to develop a positive resist material which enables to process a substrate by a single dry etching.

The inventors have discovered that a double patterning process capable of reducing the pitch between pattern features to one half can be practiced by applying a first positive resist composition onto a substrate and effecting exposure and development to form a first resist pattern. In the first resist pattern, crosslinking reaction is then induced by irradiation of high-energy radiation with a wavelength of more than 200 nm to 300 nm, specifically KrBr excimer light of 206 nm wavelength, KrCl excimer light of 222 nm wavelength, KrF excimer light of 248 nm wavelength, XeBr excimer light of 283 nm wavelength, XeCl excimer light of 308 nm wavelength, or emission spanning 254 nm wavelength from a low-pressure mercury lamp, high-pressure mercury lamp or metal halide lamp, for thereby rendering the first resist pattern insoluble in alkaline developer and resist solvent. A second resist composition is further applied onto the first resist pattern-bearing substrate, followed by exposure and development to form a second resist pattern in the space area of the first resist pattern. Then the substrate can be processed by a single dry etching. The present invention is predicated on this discovery.

In a preferred embodiment, the first and second resist compositions are chemically amplified positive resist compositions, specifically comprising a base resin comprising at least recurring units having an acid labile group and recurring units having hydroxynaphthyl and/or hydroxyacenaphthylene.

It is well known in the art that phenols crosslink and cure upon exposure to radiation with a wavelength of up to 200 nm. However, cresol novolac resins and polyhydroxystyrene cannot form a pattern by the ArF excimer laser lithography because they have very strong absorption to radiation of 193 nm wavelength. By contrast, naphthol having a phenolic hydroxyl group undergoes accelerated crosslinking upon exposure to radiation with a wavelength of up to 200 nm. Also naphthol has moderate absorption at wavelength 193 nm. Then a resist material based on a polymer having adhesive groups of naphthol, i.e., hydroxynaphthyl and/or hydroxyacenaphthylene can form a pattern by the ArF excimer laser lithography.

If a resist film is irradiated in air with light of up to 200 nm wavelength, especially up to 180 nm wavelength, ozone generates. Upon contact with ozone, the resist film is oxidized and eventually decomposed into carbon dioxide and water so that the film is substantially thinned. To prevent ozone generation, the oxygen concentration must be reduced below 10 ppm. To this end, the system is purged with an inert gas such as nitrogen, helium, argon or krypton.

Purging of the system with an inert gas for every single wafer is undesired because of reduced throughputs.

In general, it is not believed that phenols crosslink through coupling upon exposure to light with a wavelength of more than 200 nm. Quite unexpectedly, the inventors have found that a hydroxynaphthalene-containing material undergoes crosslinking reaction upon exposure to light with a wavelength of more than 200 nm. Naphthalene as irradiated exhibits an absorption maximum near 240 nm because its conjugation is shifted toward the longer wavelength side. It is believed that irradiation of light in the wavelength band where strong absorption occurs allows crosslinking reaction to proceed efficiently.

7-Oxanorbornane ring has the nature that its film cures through crosslinking reaction induced by acid and heat. By combining a curing reaction of hydroxynaphthyl and/or hydroxyacenaphthylene upon light exposure with a crosslinking reaction of 7-oxanorbornane ring induced by the acid generated upon light exposure and heat, a more robust film which is insoluble in solvent and alkaline developer can be formed.

The chemically amplified positive resist composition is firmly adherent to substrates due to inclusion of recurring units having adhesive groups of hydroxynaphthyl and/or hydroxyacenaphthylene in the base resin. Additional inclusion of recurring units having acid labile groups in the base resin allows the composition to form a pattern at a very high accuracy through the mechanism that the acid labile groups are deprotected by the acid generated from the acid generator upon light exposure so that the exposed areas of the resist are converted to be soluble in a developer.

In the patterning process of the invention, a chemically amplified positive resist composition is used in forming the first resist pattern. The composition comprises a polymer as the base resin, specifically a polymer comprising recurring units having hydroxynaphthyl and/or hydroxyacenaphthyl-ene as adhesive groups, more specifically hydroxynaphthyl-bearing recurring units.

The hydroxynaphthyl-bearing recurring units (a1) have the following general formula.

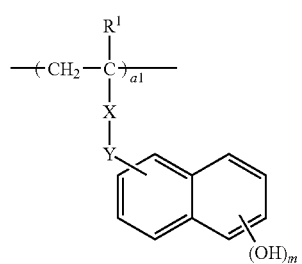

(a1)

Herein $R^1$ is at each occurrence hydrogen or methyl, X is a single bond or —C(=O)—O—, Y is a single bond or a straight or branched $C_1$-$C_6$ alkylene group which may contain an ester (—COO—) radical or ether (—O—) radical, and m is equal to 1 or 2.

Exemplary $C_1$-$C_6$ alkylene groups include methylene, ethylene, n-propylene, isopropylene, n-butylene, isobutylene, sec-butylene, n-pentylene, isopentylene, cyclopentylene, n-hexylene, and cyclohexylene.

Monomers from which recurring units (a1) are derived include those having the following general formulae Ma1 wherein $R^1$, X, Y and m are as defined above.

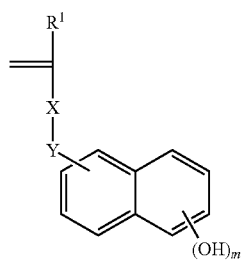

Ma1

Examples of suitable monomers Ma1 are illustrated below.

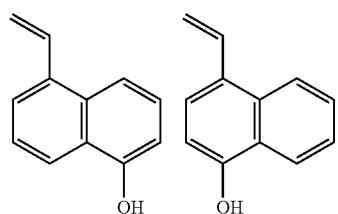

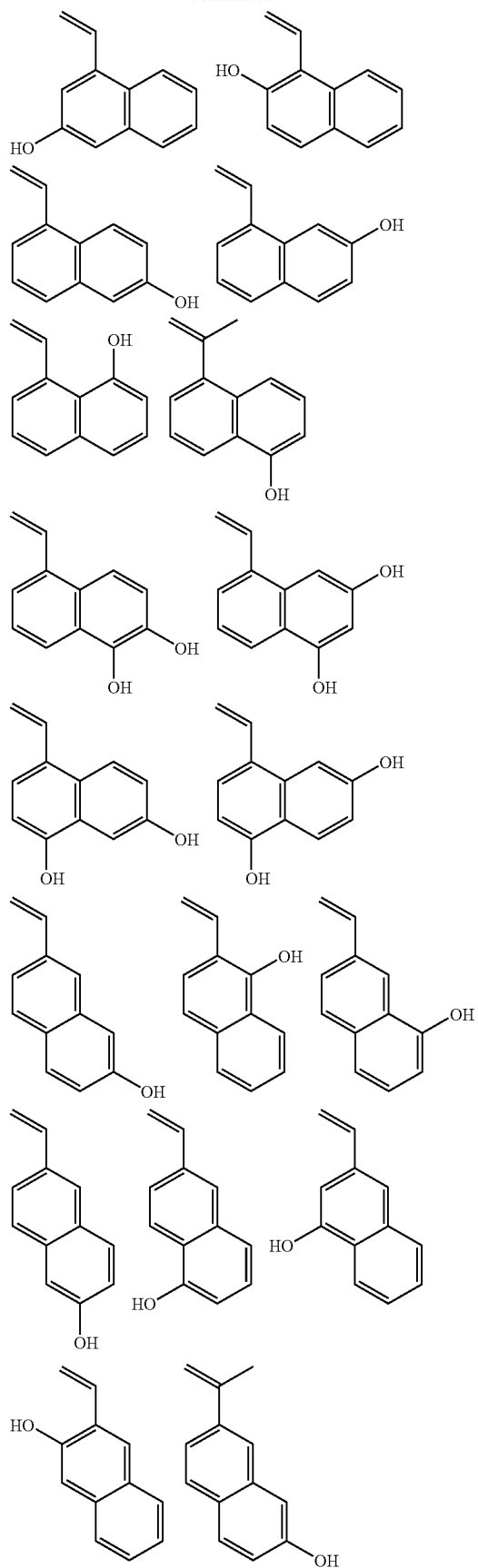

13
-continued
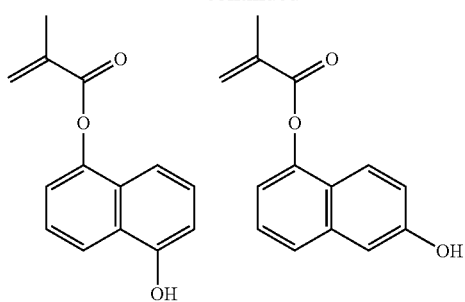
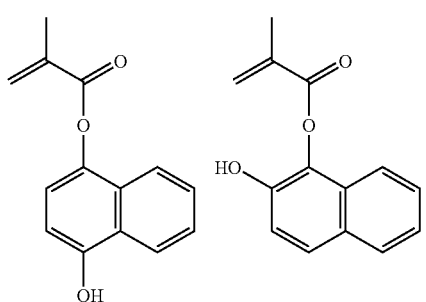
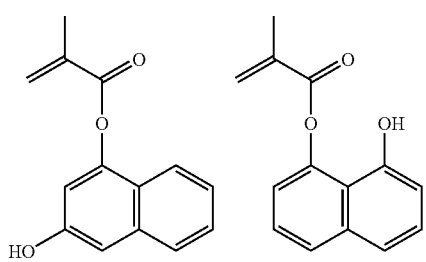
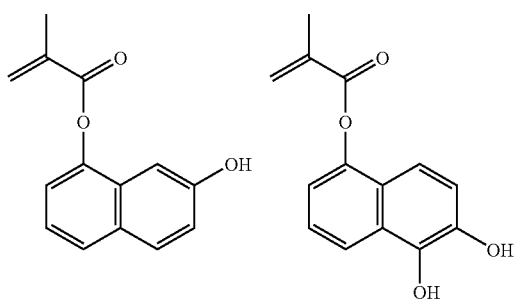
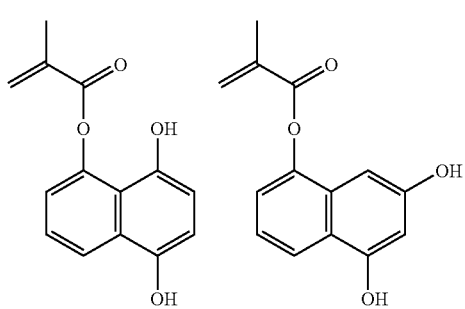
14
-continued
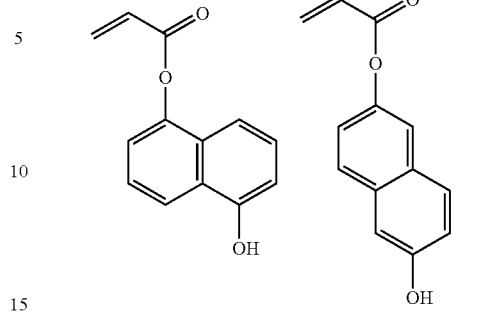
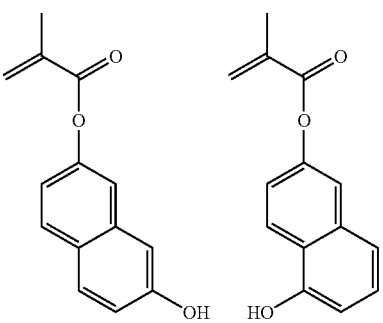
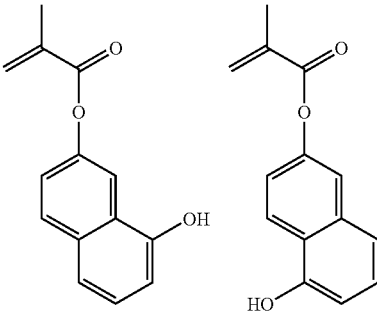
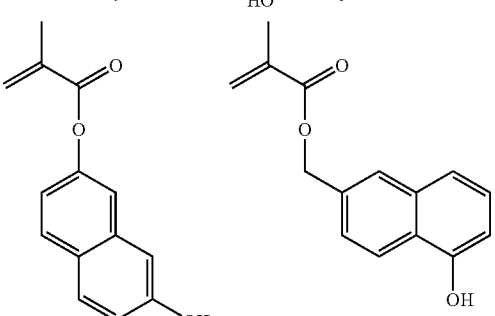
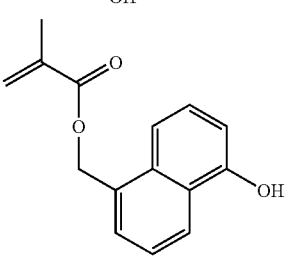

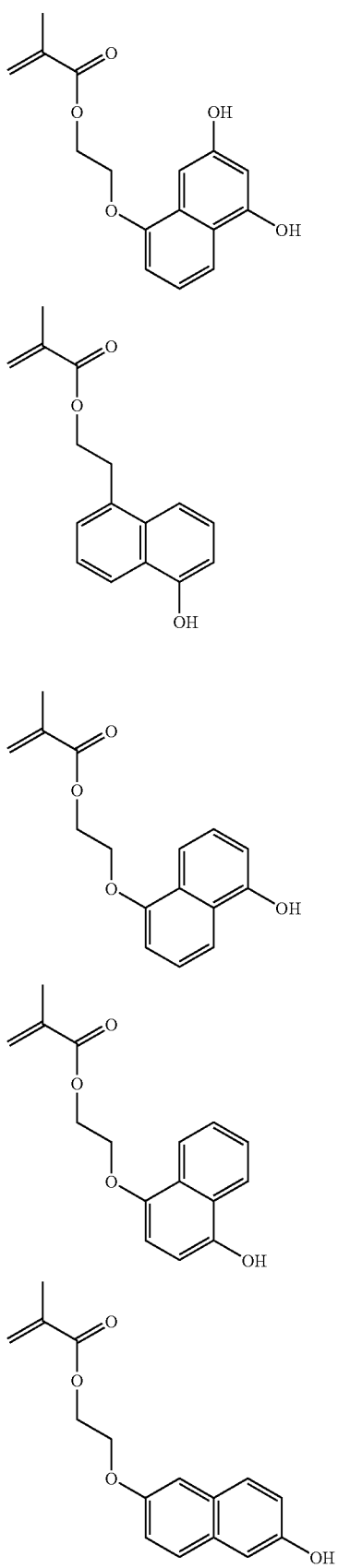
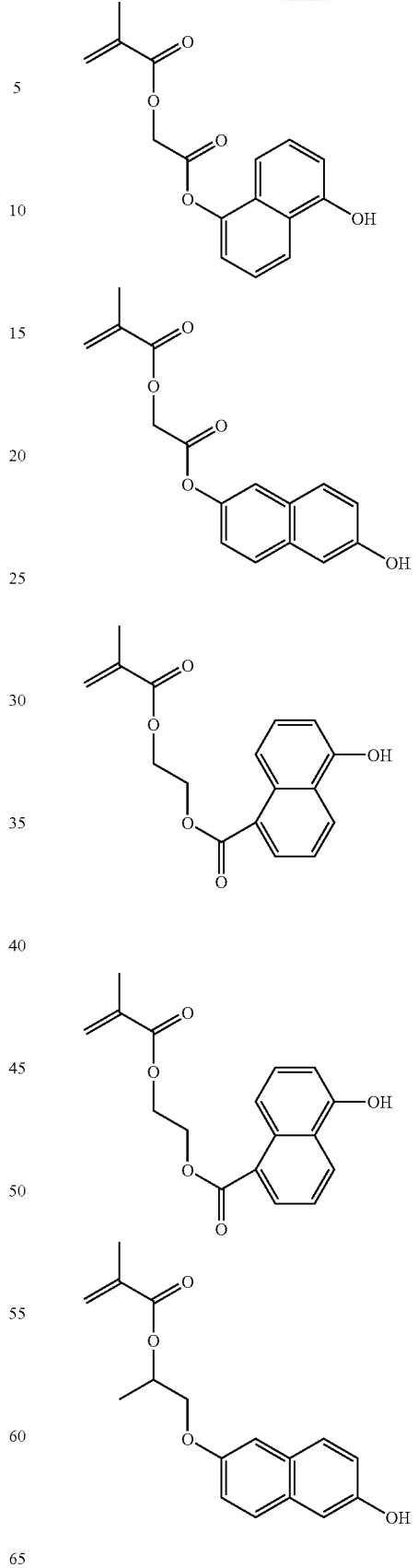
The hydroxyacenaphthylene-bearing recurring units (a2) have the following general formula.

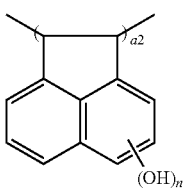

(a2)

Herein n is equal to 1 or 2.

Monomers from which recurring units (a2) are derived include those having the following general formulae Ma2 wherein n is as defined above.

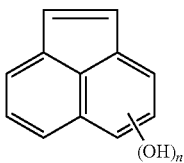

Ma2

Examples of suitable monomers Ma2 are illustrated below.

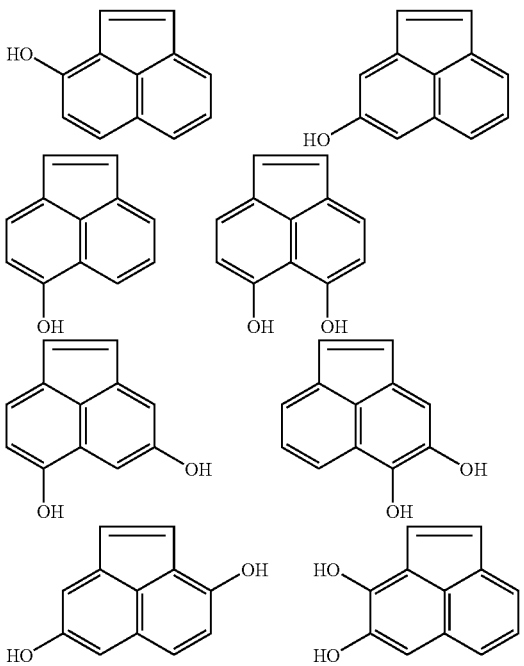

The monomers Ma1 and Ma2 used in polymerization may be those wherein a hydroxyl group is substituted by an acetal group or a formyl, acetyl or pivaloyl group. After polymerization, the acetal group can be converted back to a hydroxy group by hydrolysis with a weak acid (e.g., oxalic acid) with which the acid labile groups in recurring units (b) are not eliminated. The formyl, acetyl or pivaloyl group can be converted back to a hydroxy group by alkaline hydrolysis.

In addition to recurring units (a1) and/or (a2) shown in formula (1), the preferred polymer as the base resin in the first positive resist composition may further comprise recurring units (b) having an acid labile group.

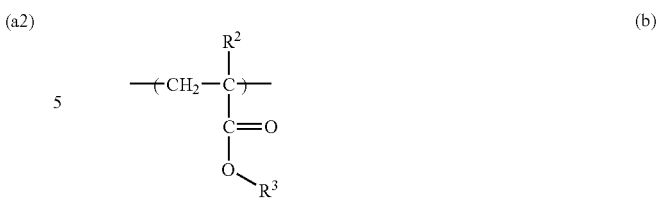

(b)

Herein $R^2$ is hydrogen or methyl and $R^3$ is an acid labile group.

Monomers from which acid labile group-bearing recurring units (b) shown in formula (1) are derived include those having the following general formula Mb wherein $R^2$ and $R^3$ are as defined above.

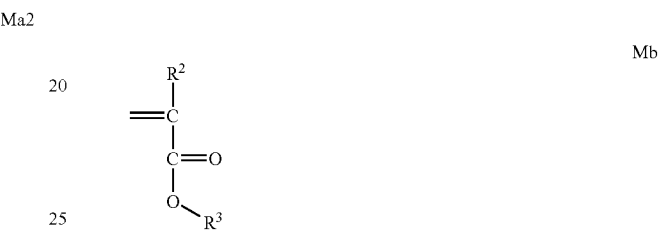

Mb

The acid labile groups represented by $R^3$ in recurring units (b) may be selected from a variety of such groups. Preferred acid labile groups are groups of formulae (AL-10) and (AL-11), tertiary alkyl groups of 4 to 40 carbon atoms represented by formula (AL-12), and oxoalkyl groups of 4 to 20 carbon atoms, but not limited thereto.

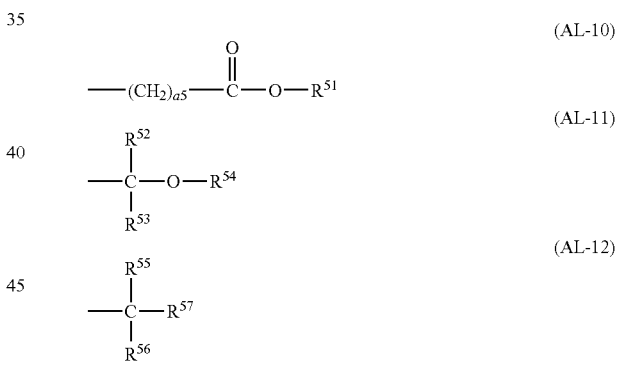

In formulae (AL-10) and (AL-11), $R^{51}$ and $R^{54}$ each are a monovalent hydrocarbon group, typically a straight, branched or cyclic alkyl group of 1 to 40 carbon atoms, more specifically 1 to 20 carbon atoms, which may contain a heteroatom such as oxygen, sulfur, nitrogen or fluorine. The subscript "a5" is an integer of 0 to 10. $R^{52}$ and $R^{53}$ each are hydrogen or a monovalent hydrocarbon group, typically a straight, branched or cyclic $C_1$-$C_{20}$ alkyl group, which may contain a heteroatom such as oxygen, sulfur, nitrogen or fluorine. Alternatively, a pair of $R^{52}$ and $R^{53}$, $R^{52}$ and $R^{54}$, or $R^{53}$ and $R^{54}$, taken together, may form a ring, specifically aliphatic ring, with the carbon atom or the carbon and oxygen atoms to which they are attached, the ring having 3 to 20 carbon atoms, especially 4 to 16 carbon atoms.

In formula (AL-12), $R^{55}$, $R^{56}$ and $R^{57}$ each are a monovalent hydrocarbon group, typically a straight, branched or cyclic $C_1$-$C_{20}$ alkyl group, which may contain a heteroatom such as oxygen, sulfur, nitrogen or fluorine. Alternatively, a pair of $R^{55}$ and $R^{56}$, $R^{55}$ and $R^{57}$, or $R^{56}$ and $R^{57}$, taken together, may form a ring, specifically aliphatic ring, with the carbon atom to which they are attached, the ring having 3 to 20 carbon atoms, especially 4 to 16 carbon atoms.

Illustrative examples of the groups of formula (AL-10) include tert-butoxycarbonyl, tert-butoxycarbonylmethyl, tert-amyloxycarbonyl, tert-amyloxycarbonylmethyl, 1-ethoxyethoxycarbonylmethyl, 2-tetrahydropyranyloxycarbonylmethyl and 2-tetrahydrofuranyloxycarbonylmethyl as well as substituent groups of the following formulae (AL-10)-1 to (AL-10)-10.

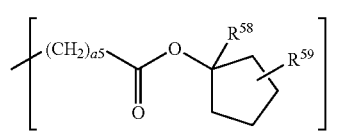
(AL-10)-1

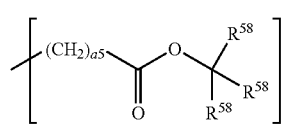
(AL-10)-2

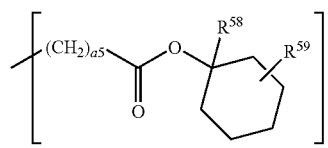
(AL-10)-3

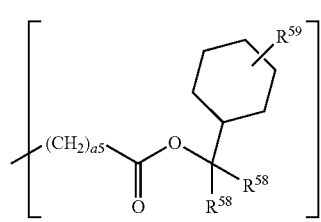
(AL-10)-4

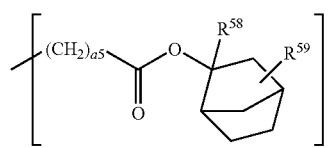
(AL-10)-5

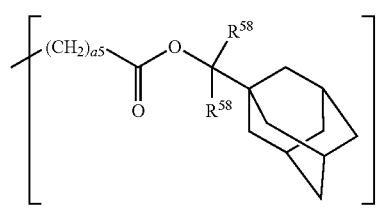
(AL-10)-6

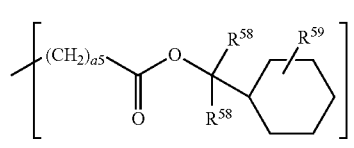
(AL-10)-7

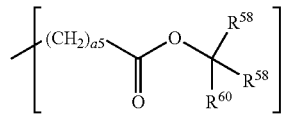
(AL-10)-8

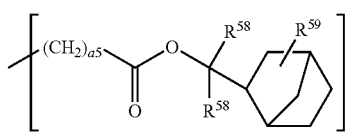
(AL-10)-9

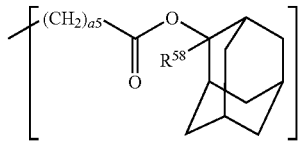
(AL-10)-10

In formulae (AL-10)-1 to (AL-10)-10, $R^{58}$ is independently a straight, branched or cyclic $C_1$-$C_8$ alkyl group, $C_6$-$C_{20}$ aryl group or $C_7$-$C_{20}$ aralkyl group; $R^{59}$ is hydrogen or a straight, branched or cyclic $C_1$-$C_{20}$ alkyl group; $R^{60}$ is a $C_6$-$C_{20}$ aryl group or $C_7$-$C_{20}$ aralkyl group; and "a5" is an integer of 0 to 10 as defined above.

Illustrative examples of the acetal group of formula (AL-11) include those of the following formulae (AL-11)-1 to (AL-11)-34.

—$CH_2$—O—$CH_3$ (AL-11)-1

—$CH_2$—O—$CH_2$—$CH_3$ (AL-11)-2

—$CH_2$—O—$(CH_2)_2$—$CH_3$ (AL-11)-3

—$CH_2$—O—$(CH_2)_3$—$CH_3$ (AL-11)-4

$$—CH_2—O—\underset{\underset{CH_3}{|}}{CH}—CH_3$$ (AL-11)-5

$$—CH_2—O—\underset{\underset{CH_3}{|}}{\overset{\overset{CH_3}{|}}{C}}—CH_3$$ (AL-11)-6

$$—\underset{\underset{CH_3}{|}}{CH}—O—CH_3$$ (AL-11)-7

$$—\underset{\underset{CH_3}{|}}{\underset{|}{CH}}—O—CH_3 \quad \begin{array}{c} CH_3 \\ | \\ CH_2 \end{array}$$ (AL-11)-8

$$\begin{array}{c} CH_3 \\ | \\ (CH_2)_2 \\ | \\ —CH—O—CH_3 \end{array}$$ (AL-11)-9

$$\begin{array}{c} CH_3 \\ | \\ —CH—O—CH_2—CH_3 \end{array}$$ (AL-11)-10

$$\begin{array}{c} CH_3 \\ | \\ CH_2 \\ | \\ —CH—O—CH_2—CH_3 \end{array}$$ (AL-11)-11

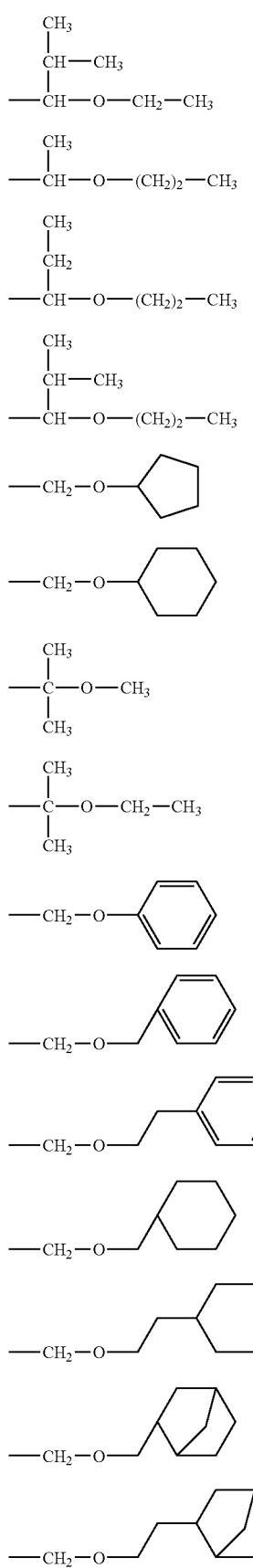
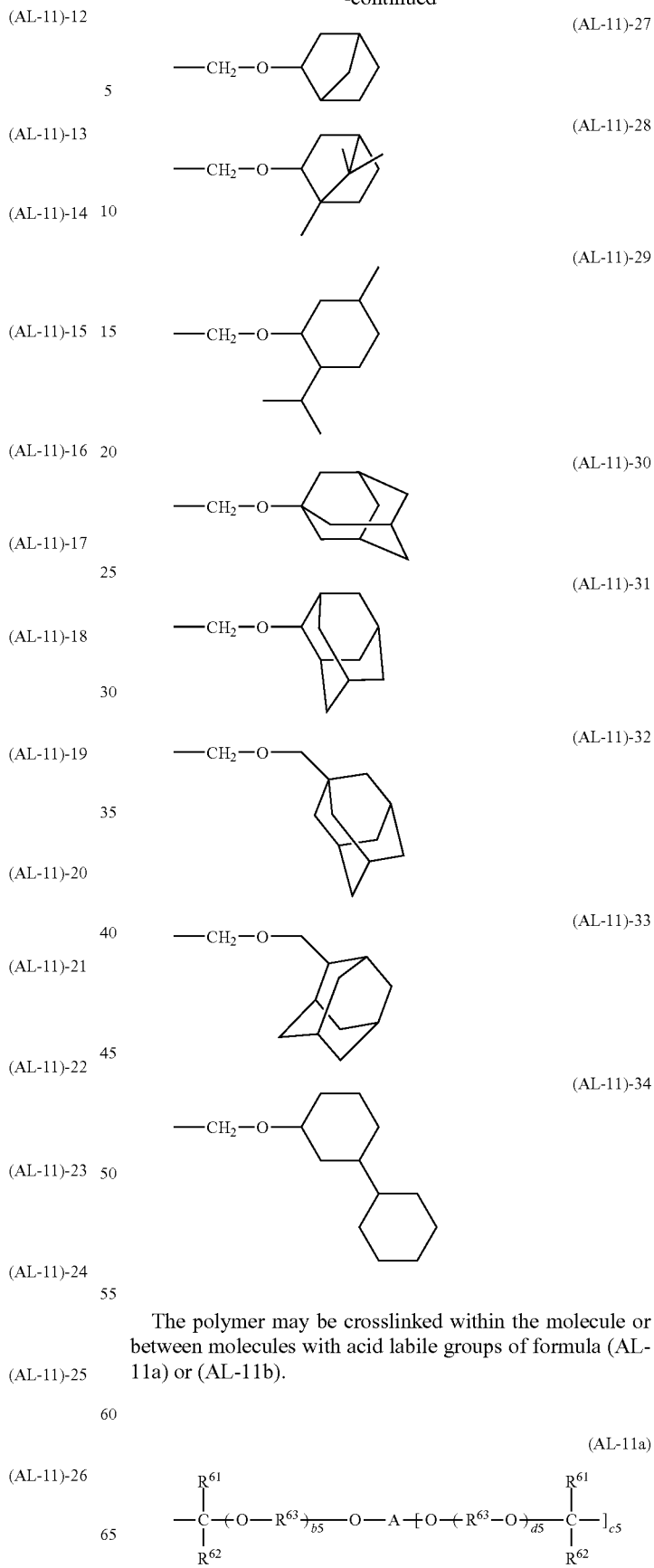
The polymer may be crosslinked within the molecule or between molecules with acid labile groups of formula (AL-11a) or (AL-11b).

(AL-11b)

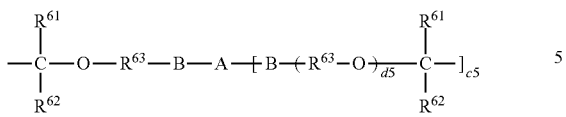

Herein $R^{61}$ and $R^{62}$ each are hydrogen or a straight, branched or cyclic $C_1$-$C_8$ alkyl group, or $R^{61}$ and $R^{62}$, taken together, may form a ring with the carbon atom to which they are attached, and $R^{61}$ and $R^{62}$ are straight or branched $C_1$-$C_8$ alkylene groups when they form a ring. $R^{63}$ is a straight, branched or cyclic $C_1$-$C_{10}$ alkylene group. Each of b5 and d5 is 0 or an integer of 1 to 10, preferably 0 or an integer of 1 to 5, and c5 is an integer of 1 to 7. "A" is a (c5+1)-valent aliphatic or alicyclic saturated hydrocarbon group, aromatic hydrocarbon group or heterocyclic group having 1 to 50 carbon atoms, which may be separated by a heteroatom such as oxygen, sulfur or nitrogen or in which some of the hydrogen atoms attached to carbon atoms may be substituted by hydroxyl, carboxyl, carbonyl groups or fluorine atoms. "B" is —CO—O—, —NHCO—O— or —NHCONH—.

Preferably, "A" is selected from divalent to tetravalent, straight, branched or cyclic $C_1$-$C_{20}$ alkylene, alkanetriyl and alkanetetrayl groups, and $C_6$-$C_{30}$ arylene groups, which may be separated by a heteroatom such as oxygen, sulfur or nitrogen or in which some of the hydrogen atoms attached to carbon atoms may be substituted by hydroxyl, carboxyl, acyl groups or halogen atoms. The subscript c5 is preferably an integer of 1 to 3.

The crosslinking acetal groups of formulae (AL-11a) and (AL-11b) are exemplified by the following formulae (AL-11)-35 through (AL-11)-42.

Illustrative examples of the tertiary alkyl of formula (AL-12) include tert-butyl, triethylcarbyl, 1-ethylnorbornyl, 1-methylcyclohexyl, 1-ethylcyclopentyl, and tert-amyl groups as well as those of (AL-12)-1 to (AL-12)-16.

(AL-12)-1
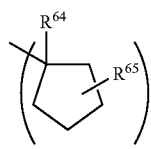

(AL-12)-2
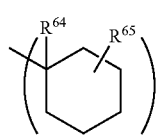

(AL-12)-3
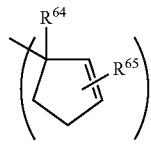

(AL-12)-4
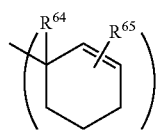

(AL-11)-35

(AL-11)-36
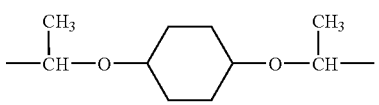

(AL-11)-37

(AL-11)-38

(AL-11)-39
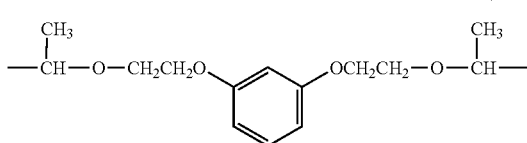

(AL-11)-40
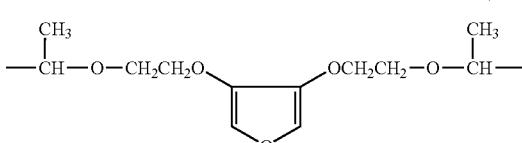

(AL-11)-41
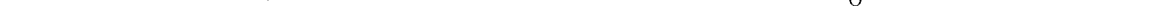

(AL-11)-42
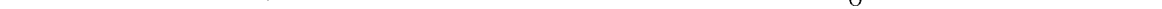

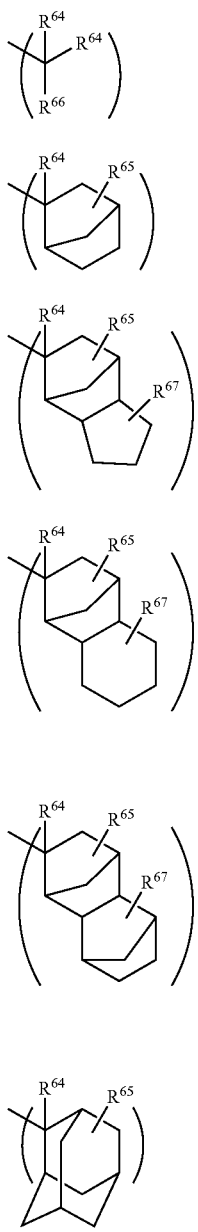

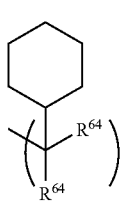

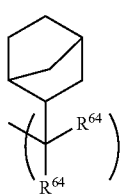

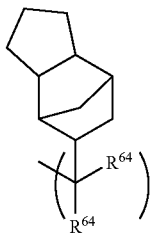

(AL-12)-5

(AL-12)-6

(AL-12)-7

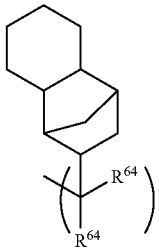

(AL-12)-8

(AL-12)-9

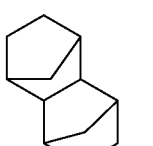

(AL-12)-10

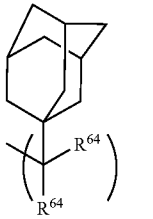

(AL-12)-11

(AL-12)-12

(AL-12)-13

(AL-12)-14

(AL-12)-15

(AL-12)-16

Herein $R^{64}$ is independently a straight, branched or cyclic $C_1$-$C_8$ alkyl group, $C_6$-$C_{20}$ aryl group or $C_7$-$C_{20}$ aralkyl group; $R^{65}$ and $R^{67}$ each are hydrogen or a straight, branched or cyclic $C_1$-$C_{20}$ alkyl group; and $R^{66}$ is a $C_6$-$C_{20}$ aryl group or $C_7$-$C_{20}$ aralkyl group.

With $R^{68}$ representative of a di- or more valent alkylene or arylene group being included as shown in formulae (AL-12)-17 and (AL-12)-18, the polymer may be crosslinked within the molecule or between molecules.

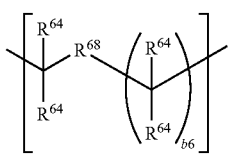

(AL-12)-17

(AL-12)-18

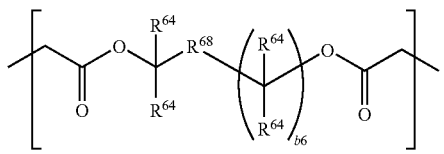

In formulae (AL-12)-17 and (AL-12)-18, $R^{64}$ is as defined above; $R^{68}$ is a straight, branched or cyclic $C_1$-$C_{20}$ alkylene group or arylene group which may contain a heteroatom such as oxygen, sulfur or nitrogen; and b6 is an integer of 1 to 3.

The groups represented by $R^{64}$, $R^{65}$, $R^{66}$ and $R^{67}$ may contain a heteroatom such as oxygen, nitrogen or sulfur. Such groups are exemplified by those of the following formulae (AL-13)-1 to (AL-13)-7.

 (AL-13)-1

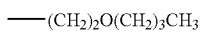 (AL-13)-2

 (AL-13)-3

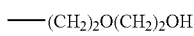 (AL-13)-4

 (AL-13)-5

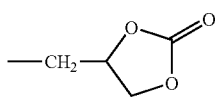 (AL-13)-6

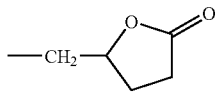 (AL-13)-7

Of the acid labile groups of formula (AL-12), recurring units having an exo-form structure represented by the formula (AL-12)-19 are preferred.

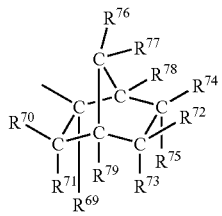 (AL-12)-19

Herein, $R^{69}$ is a straight, branched or cyclic $C_1$-$C_8$ alkyl group or a substituted or unsubstituted $C_6$-$C_{20}$ aryl group; $R^{70}$ to $R^{75}$, $R^{78}$ and $R^{79}$ are each independently hydrogen or a monovalent hydrocarbon group, typically alkyl, of 1 to 15 carbon atoms which may contain a heteroatom; and $R^{76}$ and $R^{77}$ are hydrogen. Alternatively, a pair of $R^{70}$ and $R^{71}$, $R^{72}$ and $R^{74}$, $R^{72}$ and $R^{75}$, $R^{73}$ and $R^{75}$, $R^{73}$ and $R^{79}$, $R^{74}$ and $R^{78}$, $R^{76}$ and $R^{77}$, or $R^{77}$ and $R^{78}$ may bond together to form a ring with the carbon atom to which they are attached, and in this case, each group participating in ring formation is a divalent hydrocarbon group, typically alkylene, of 1 to 15 carbon atoms which may contain a heteroatom. Also, a pair of $R^{70}$ and $R^{79}$, $R^{76}$ and $R^{79}$, or $R^{72}$ and $R^{74}$ which are attached to vicinal carbon atoms may bond together directly to form a double bond. The formula also represents an enantiomer.

The ester form monomers from which recurring units having an exo-form structure represented by the formula (AL-12)-19 shown below are derived are described in U.S. Pat. No. 6,448,420 (JP-A 2000-327633).

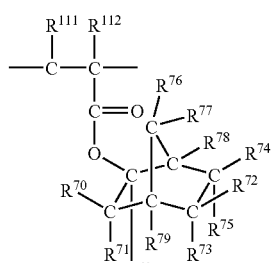

Illustrative non-limiting examples of suitable monomers are given below wherein $R^{111}$ and $R^{112}$ are each independently hydrogen, methyl, —$COOCH_3$ or —$CH_2COOCH_3$.

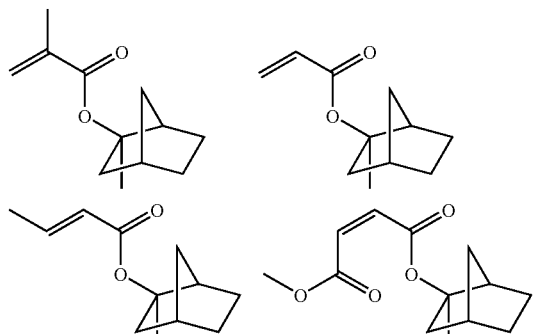

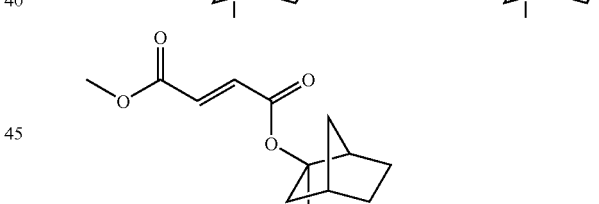

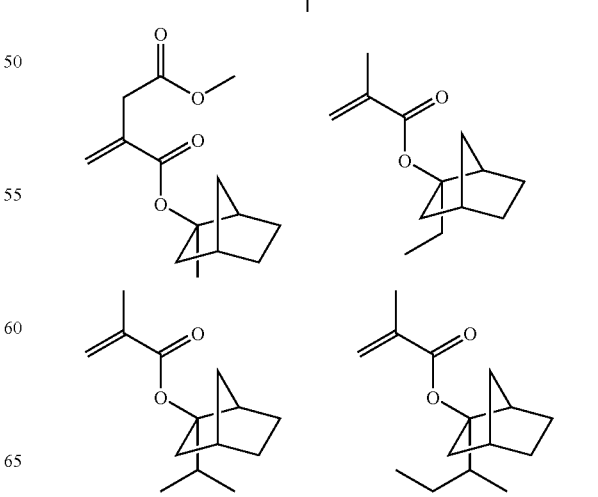

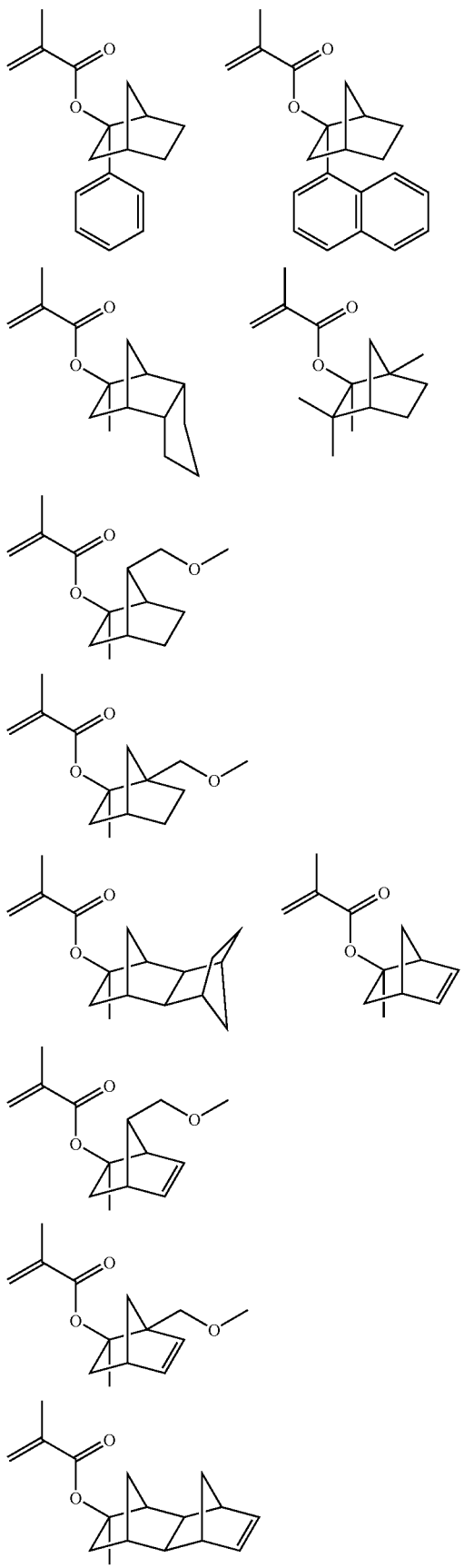

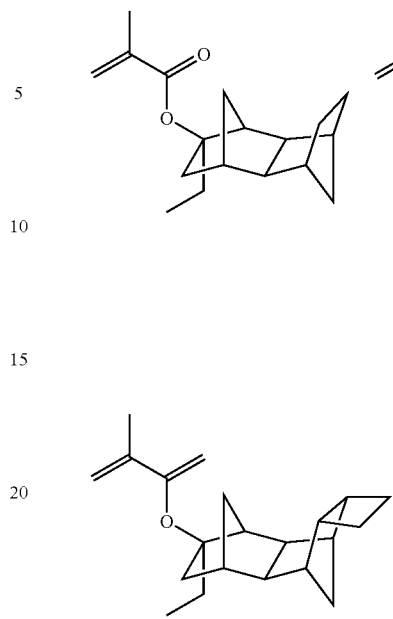

Also included in the acid labile groups of formula (AL-12) are acid labile groups having furandiyl, tetrahydrofurandiyl or oxanorbornanediyl as represented by the following formula (AL-12)-20.

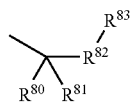
(AL-12)-20

Herein, $R^{80}$ and $R^{81}$ are each independently a monovalent hydrocarbon group, typically a straight, branched or cyclic $C_1$-$C_{10}$ alkyl group. $R^{80}$ and $R^{81}$, taken together, may form an aliphatic hydrocarbon ring of 3 to 20 carbon atoms with the carbon atom to which they are attached. $R^{82}$ is a divalent group selected from furandiyl, tetrahydrofurandiyl and oxanorbornanediyl. $R^{83}$ is hydrogen or a monovalent hydrocarbon group, typically a straight, branched or cyclic $C_1$-$C_{10}$ alkyl group, which may contain a heteroatom.

Examples of the monomers from which the recurring units substituted with an acid labile group having furandiyl, tetrahydrofurandiyl or oxanorbornanediyl as represented by the formula:

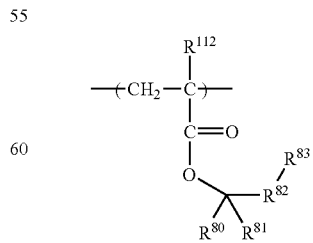

(wherein $R^{80}$ to $R^{83}$ and $R^{112}$ are as defined above) are derived are shown below. Note that Me is methyl and Ac is acetyl.

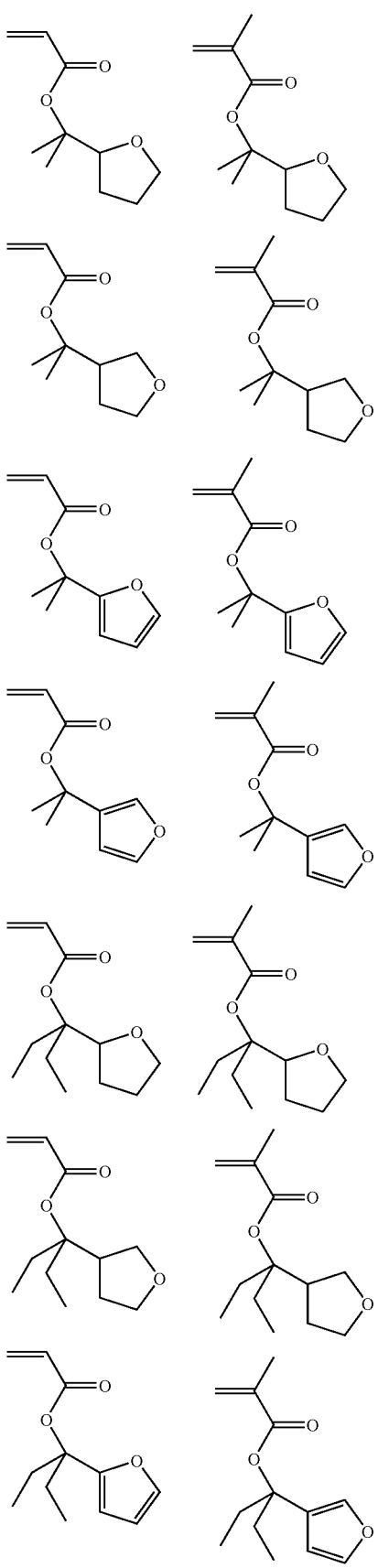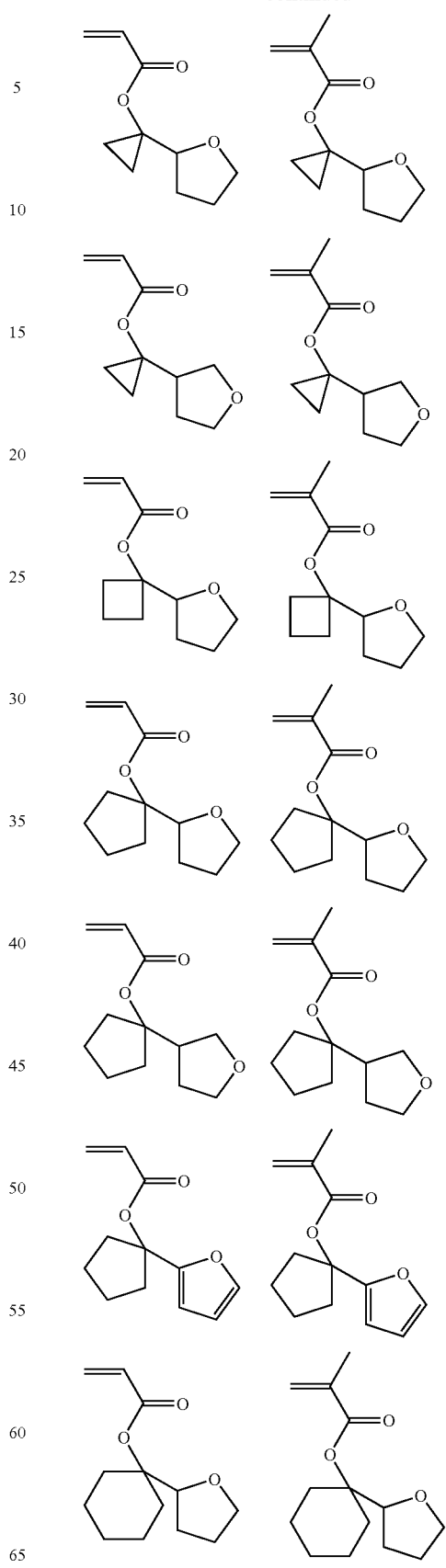

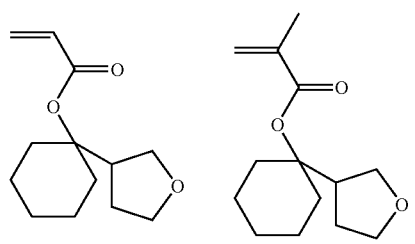
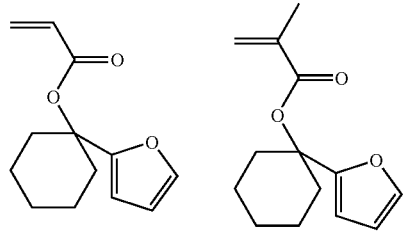
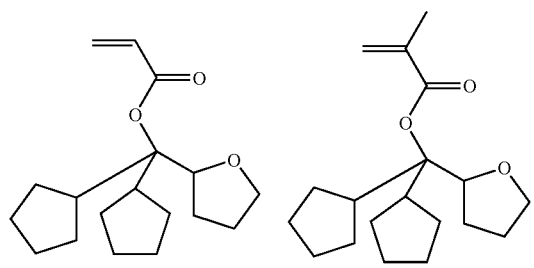
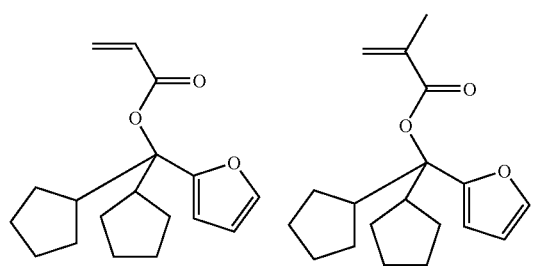
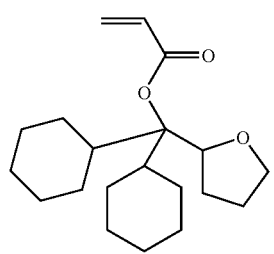
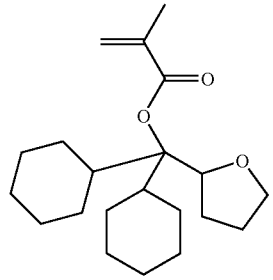
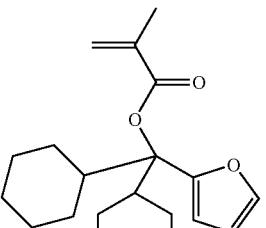
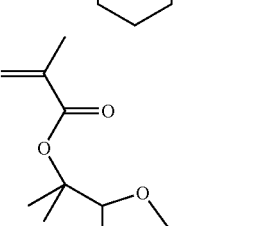
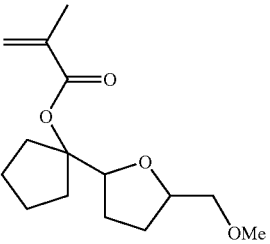
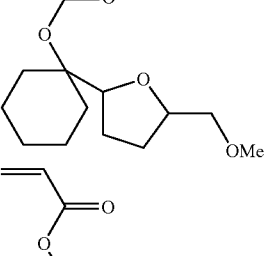
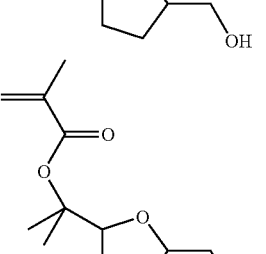
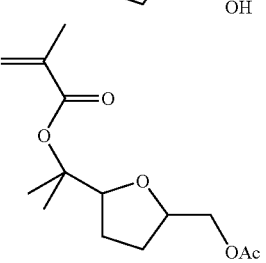

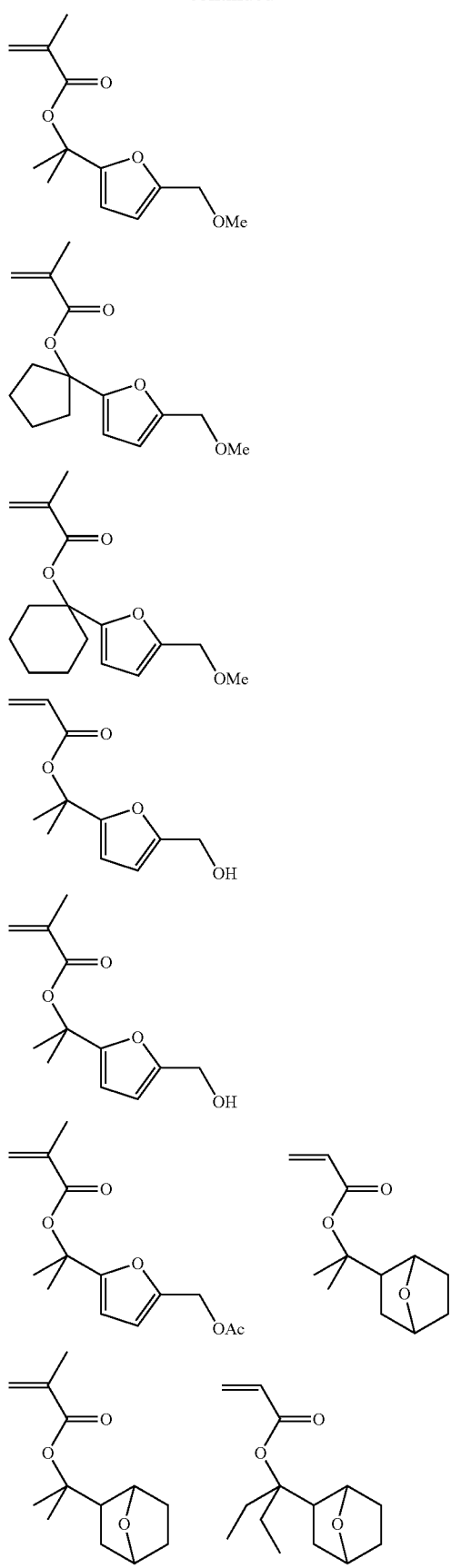
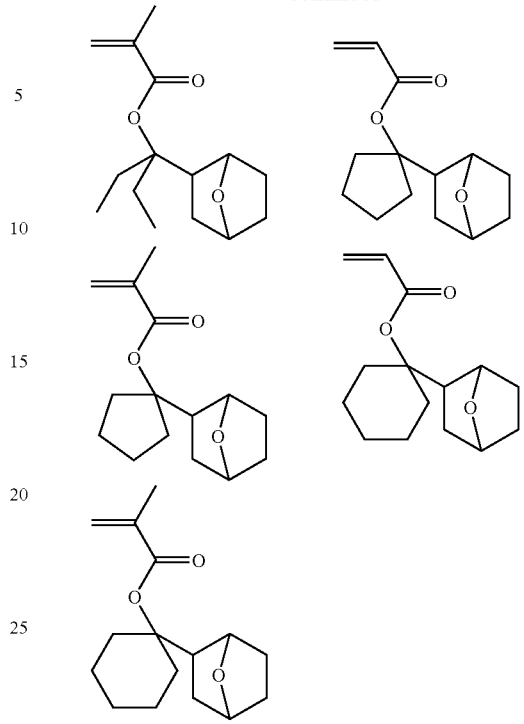
Preferably the polymer used herein may further comprise 7-oxanorbornane ring-bearing recurring units (c1) or (c2) as shown below.
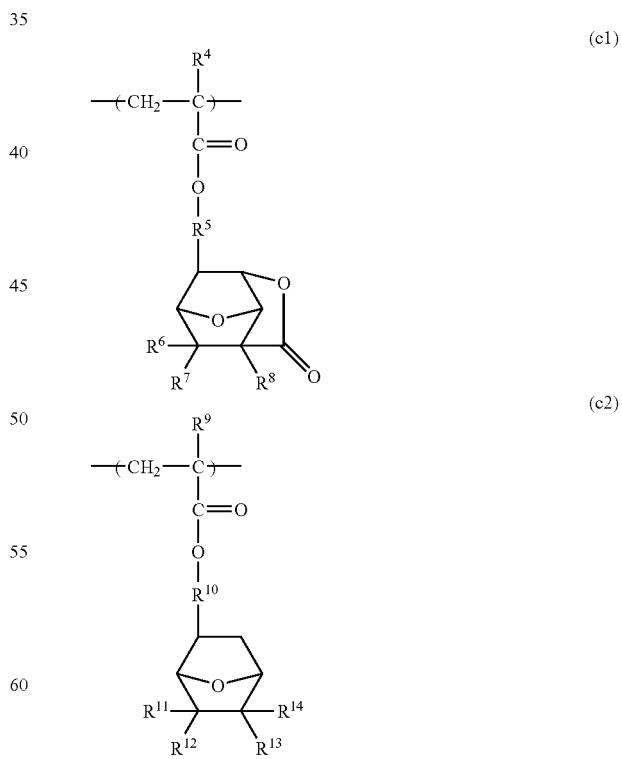
Herein $R^4$ and $R^9$ are hydrogen or methyl. $R^5$ and $R^{10}$ are each independently a single bond or a straight, branched or cyclic $C_1$-$C_6$ alkylene group which may have an ether or ester radical, with the proviso that when $R^5$ and $R^{10}$ each are a straight, branched or cyclic $C_1$-$C_6$ alkylene group, it has a carbon atom attached to the ester moiety in the formula which is primary or secondary. $R^6$, $R^7$, $R^8$, $R^{11}$, $R^{12}$, $R^{13}$, and $R^{14}$ are each independently hydrogen or a straight, branched or cyclic $C_1$-$C_6$ alkyl group.

Monomers from which 7-oxanorbornane ring-bearing recurring units are derived include those having the following general formulae Mc1 and Mc2 wherein $R^4$ to $R^{14}$ are as defined above.

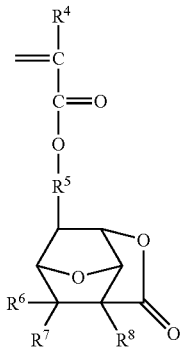

Mc1

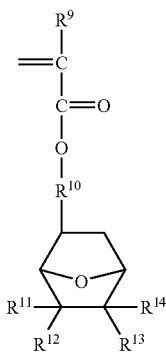

Mc2

Examples of monomers Mc1 and Mc2 are illustrated below.

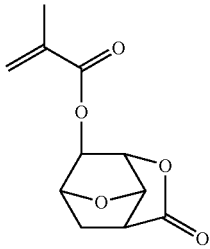 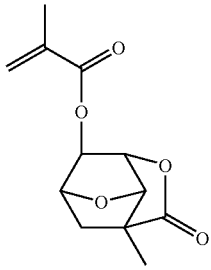

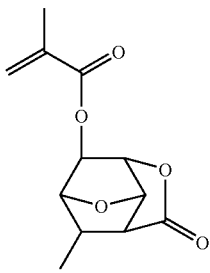 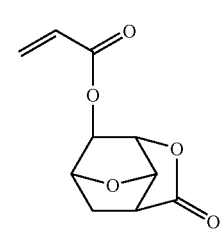

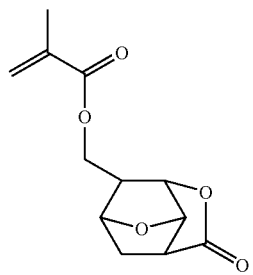

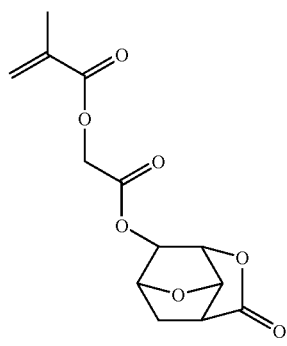

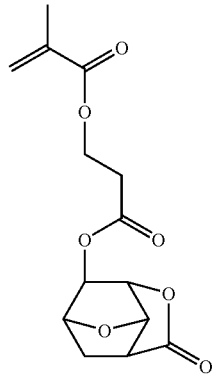 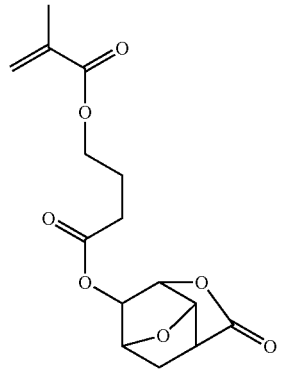

-continued

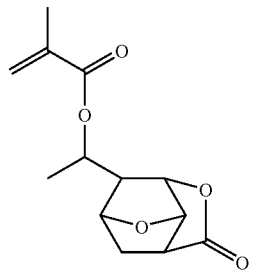 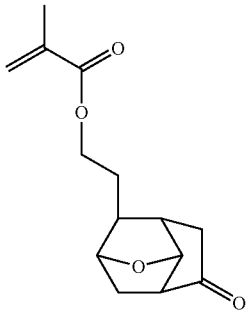

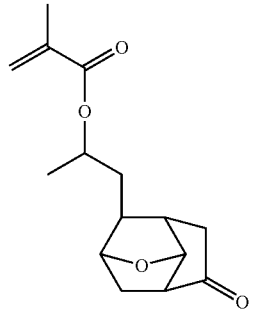 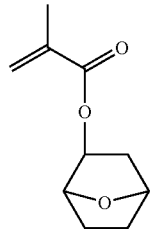

-continued

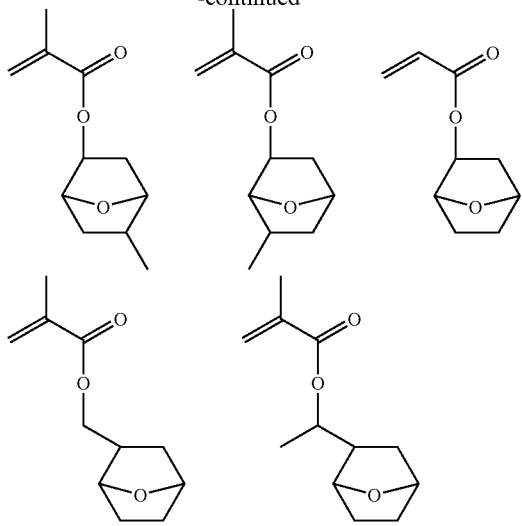

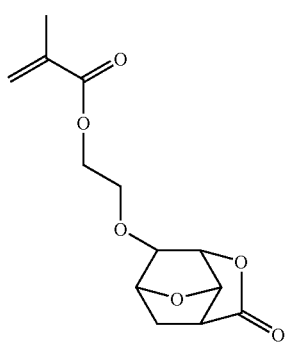

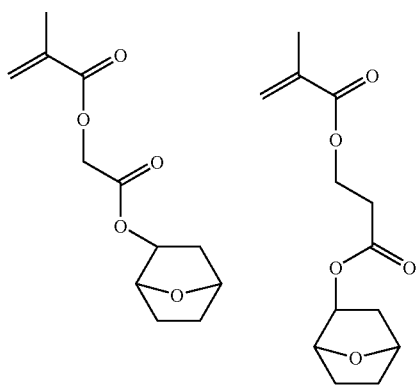

-continued

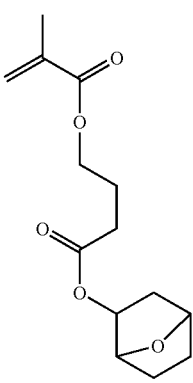

In summary, the first positive resist composition preferably comprises as the base resin a polymer comprising recurring units (a1), (a2) and (b) as shown in formula (1), and more preferably a polymer comprising recurring units (a1), (a2), (b), (c1) and (c2) as shown in formula (2).

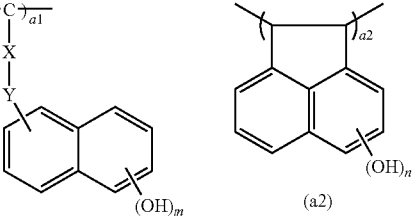

(1)

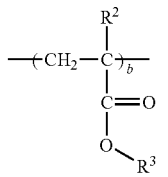

(b)

Herein $R^1$, $R^2$, X, Y, m, n, and $R^3$ are as defined above, a1, a2 and b are numbers in the range: $0 \leq a1 < 1.0$, $0 \leq a2 < 1.0$, $0 < b < 1.0$, $0 < a1+a2 < 1.0$, and $0 < a1+a2+b \leq 1.0$.

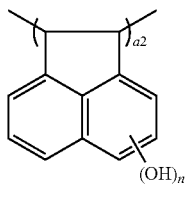

(2)

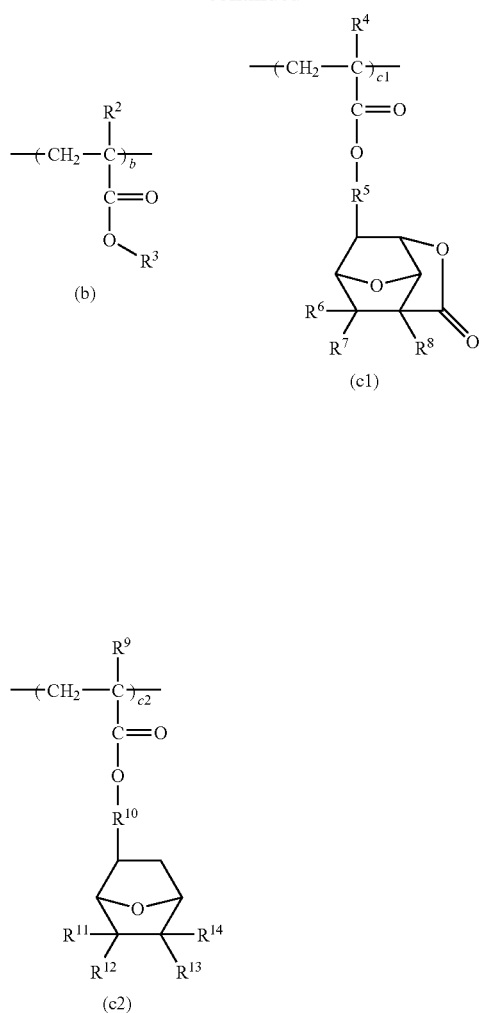

(b)

(c1)

(c2)

Herein $R^1$ to $R^{14}$, X, Y, m, and n are as defined above, a1, a2, b, c1, and c2 are numbers in the range: $0 \leq a1 < 1.0$, $0 \leq a2 < 1.0$, $0 < a1+a2 < 1.0$, $0 < b < 1.0$, $0 \leq c1 < 1.0$, $0 \leq c2 < 1.0$, $0 < c1+c2 < 1.0$, and $0 < a1+a2+b+c1+c2 \leq 1.0$.

While the polymer used herein preferably includes recurring units (a1) and/or (a2), recurring units (b), and recurring units (c1) and/or (c2), it may have copolymerized therein recurring units (d) derived from monomers having adhesive groups such as hydroxy, cyano, carbonyl, ester, ether groups, lactone rings, carbonyl groups or carboxylic anhydride groups. Examples of monomers from which recurring units (d) are derived are given below.

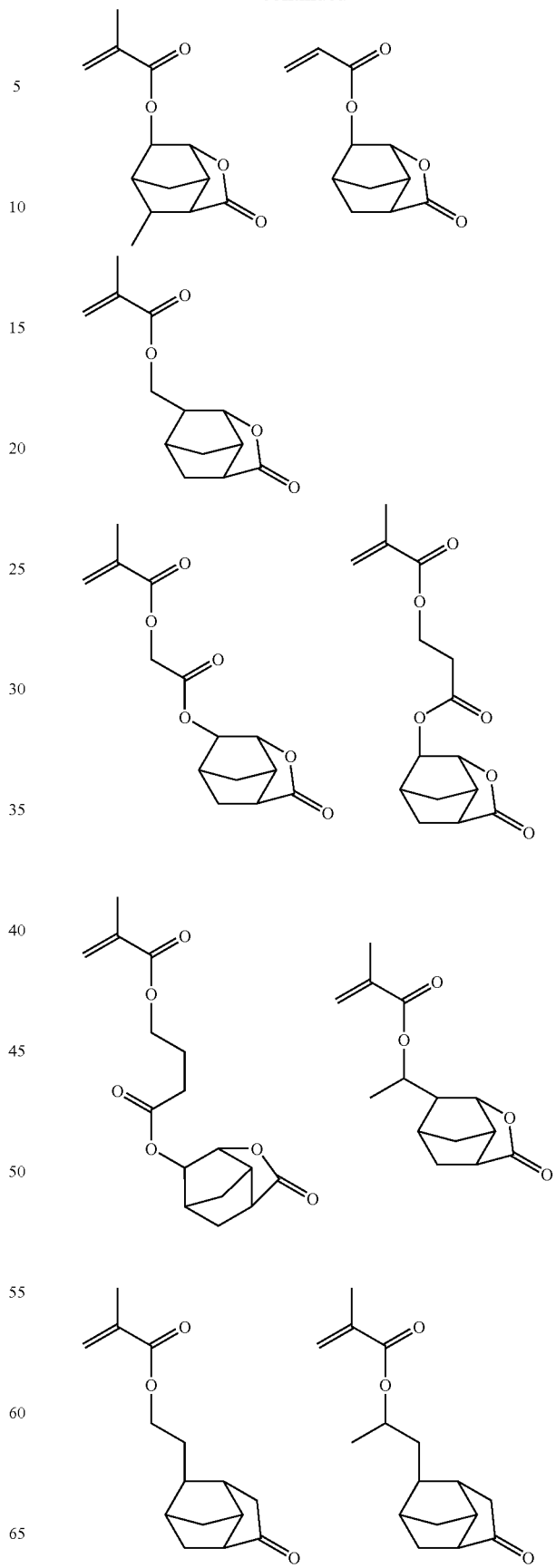

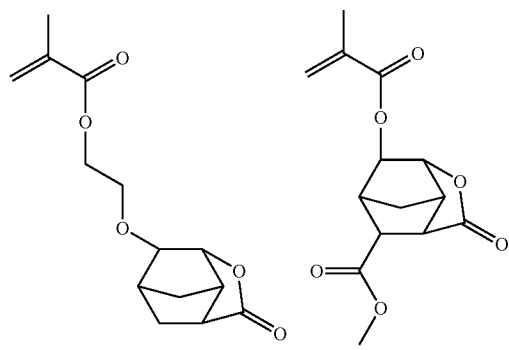
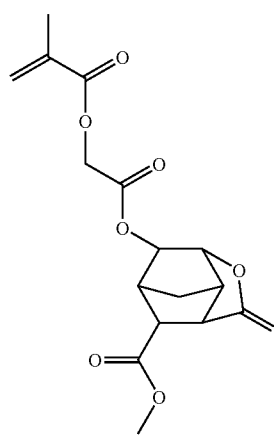
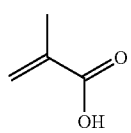
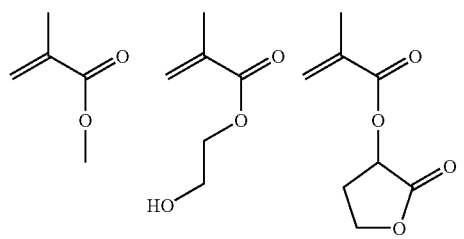
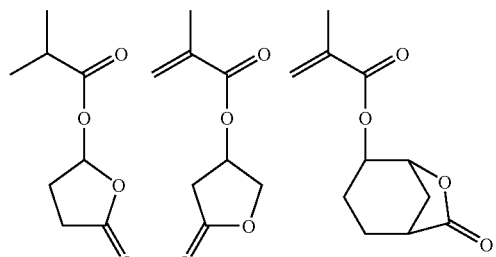
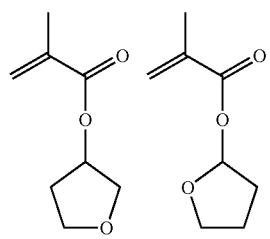
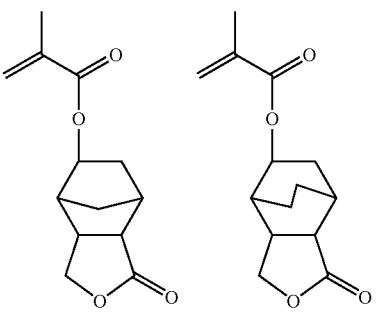
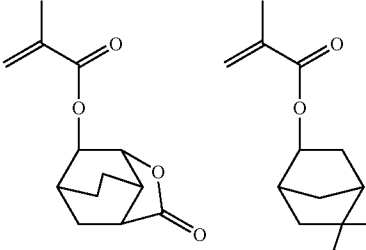
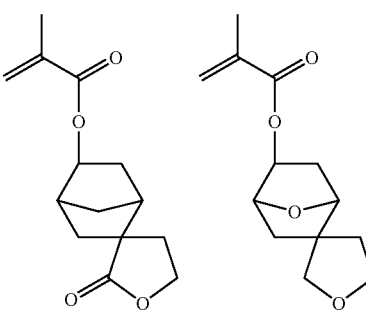
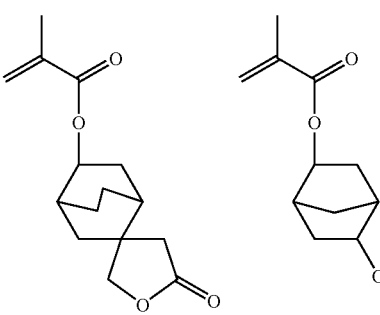
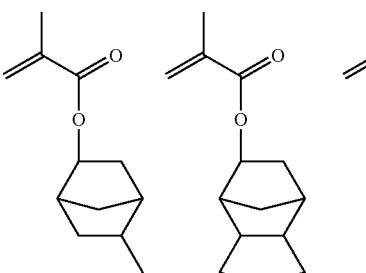

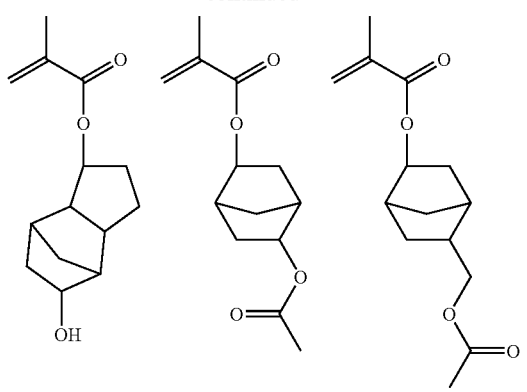
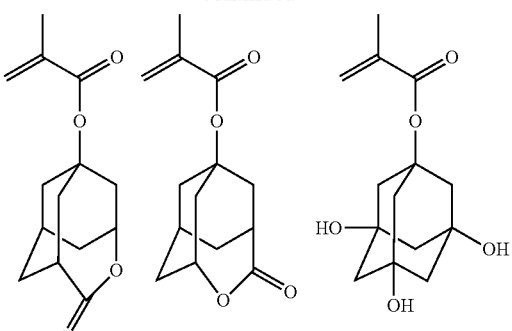
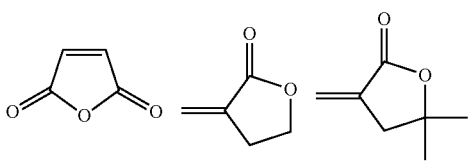
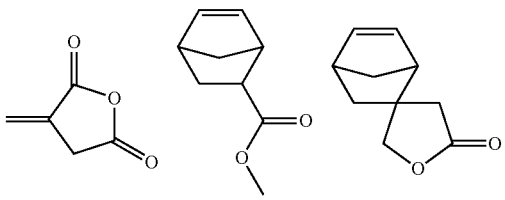
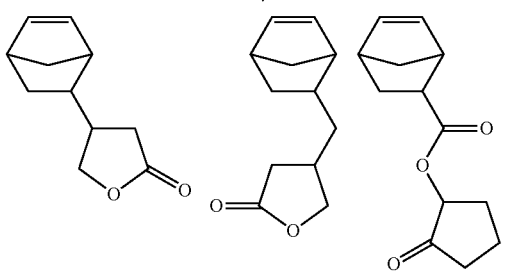
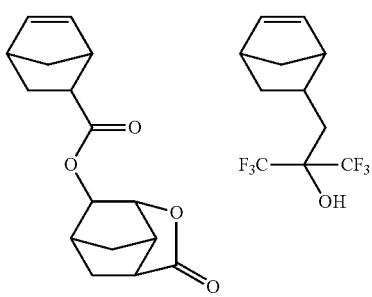
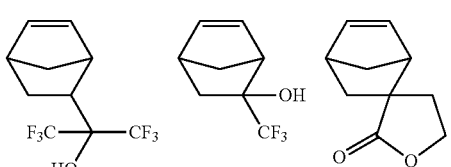
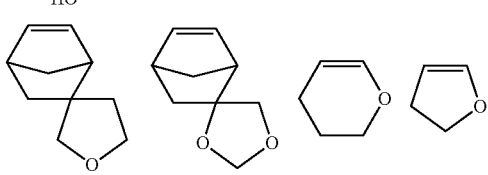

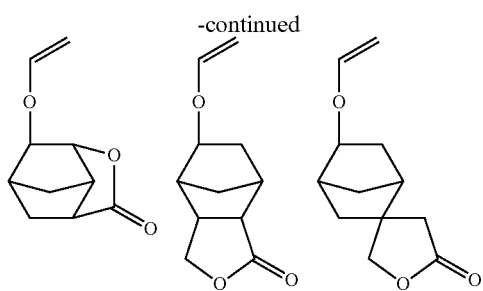
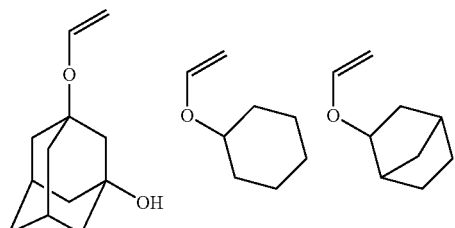
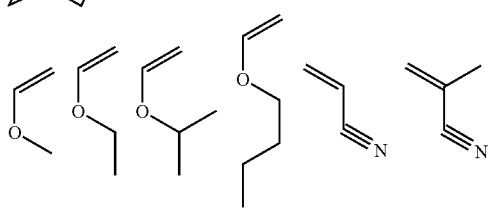
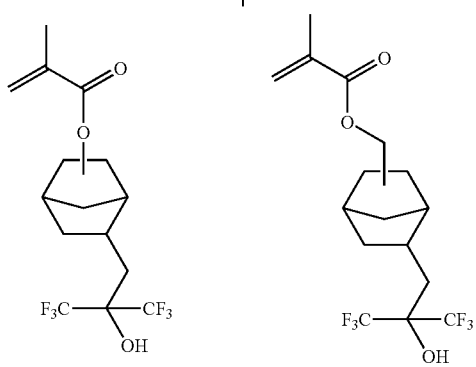
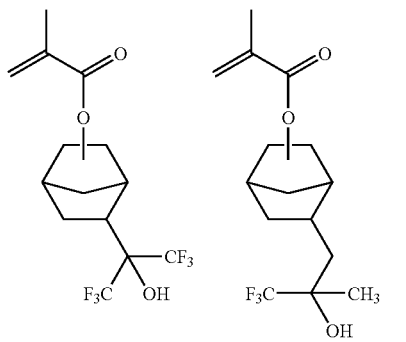
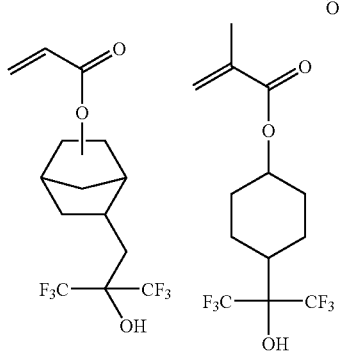
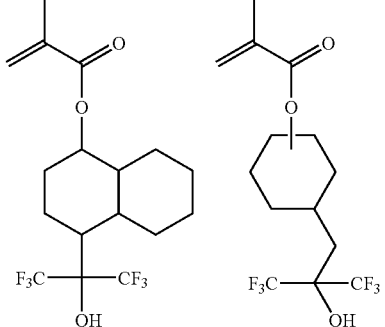
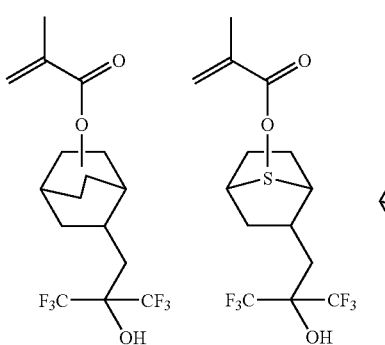
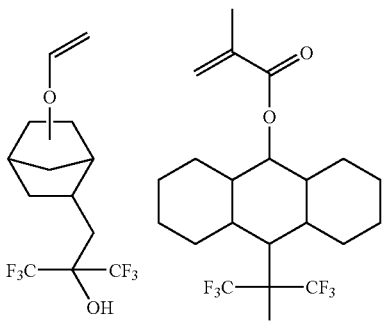
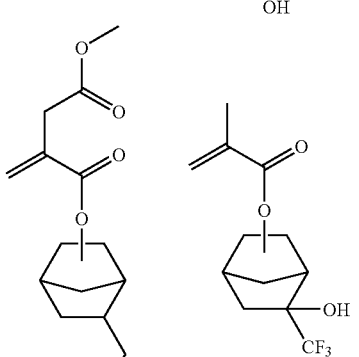
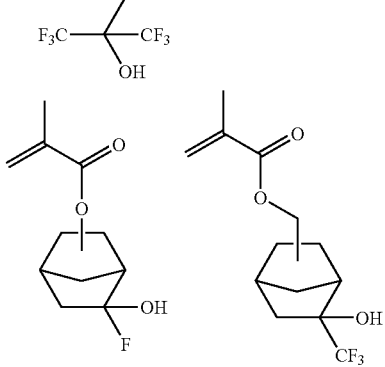

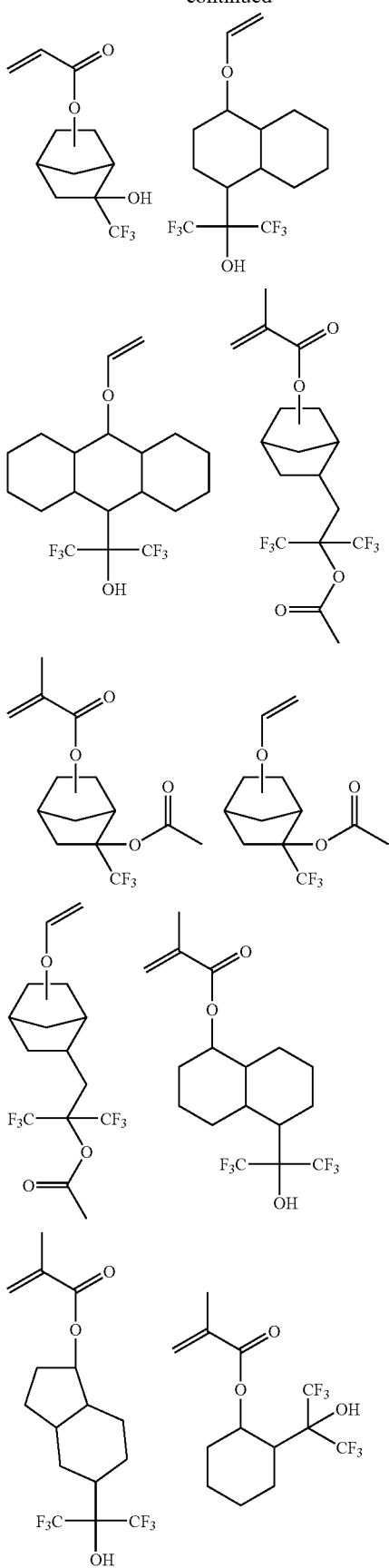
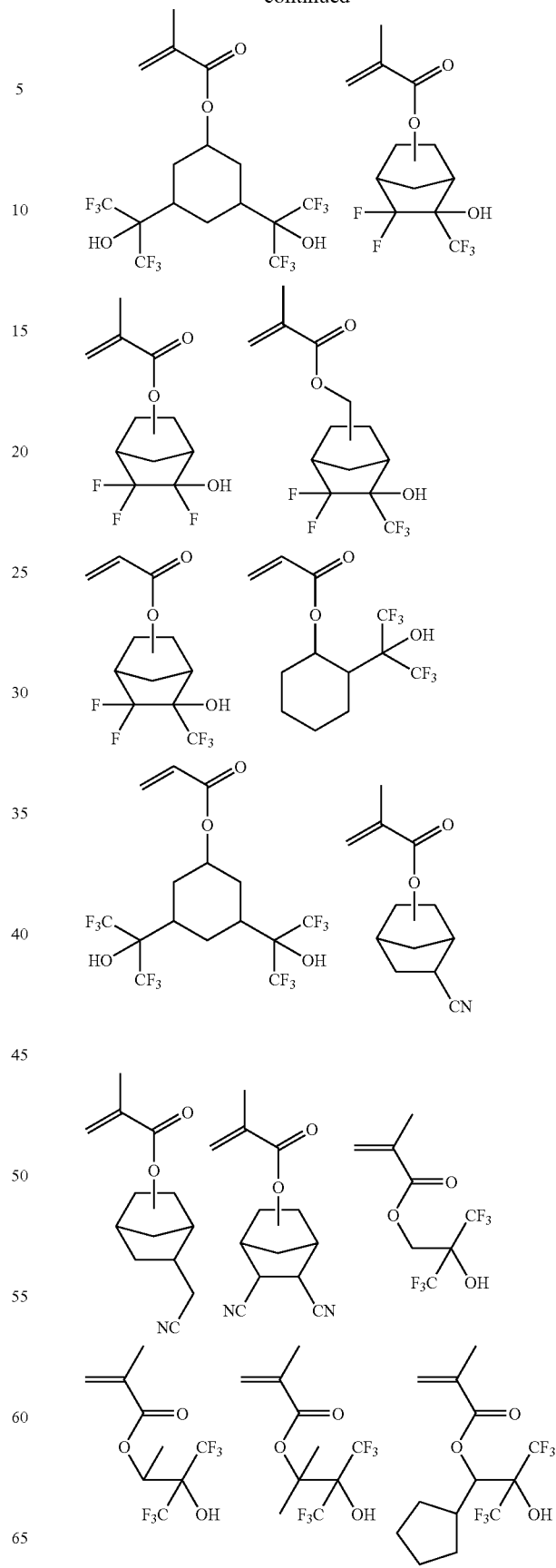

-continued
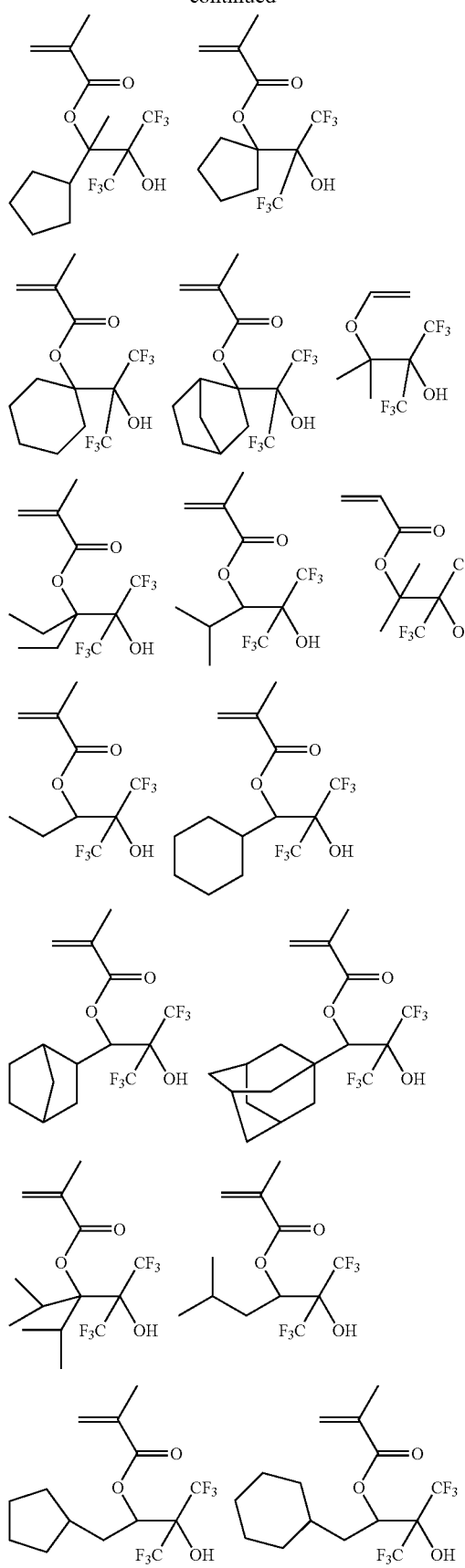
-continued
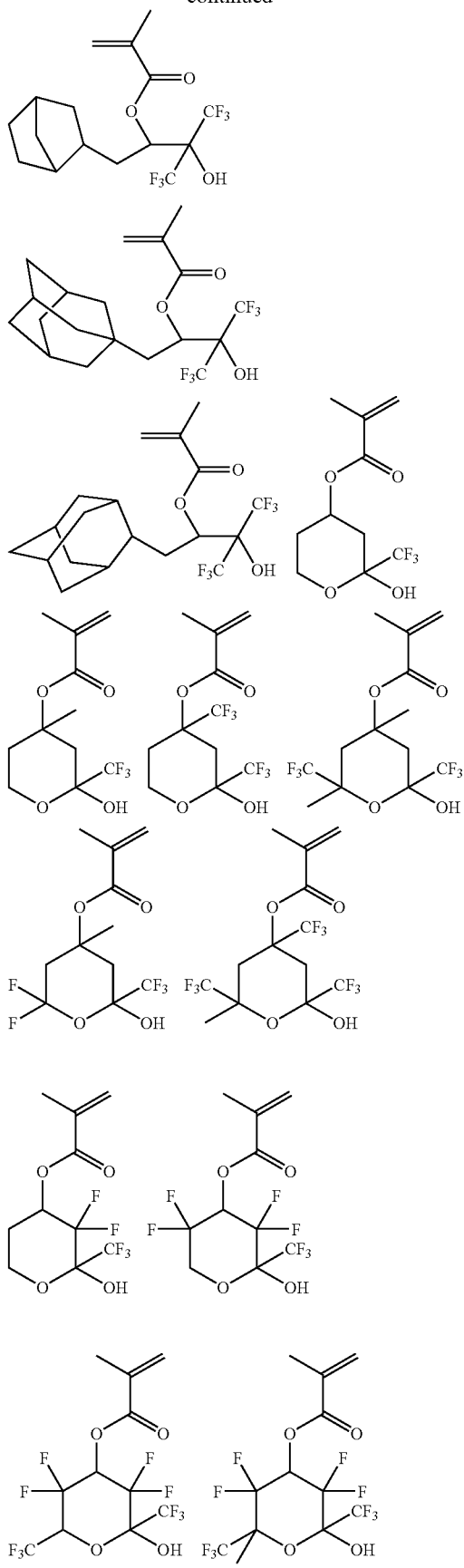

53
-continued
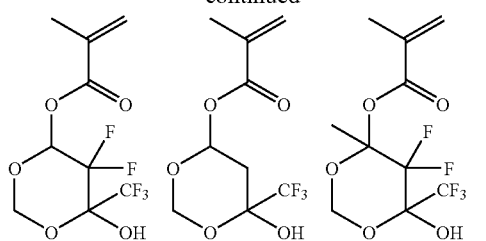
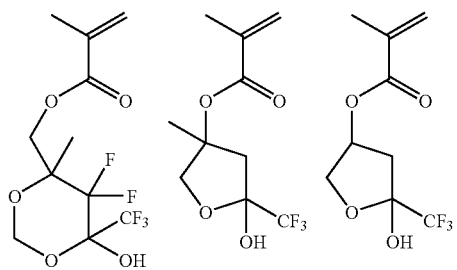
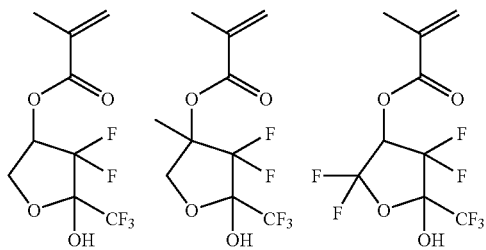
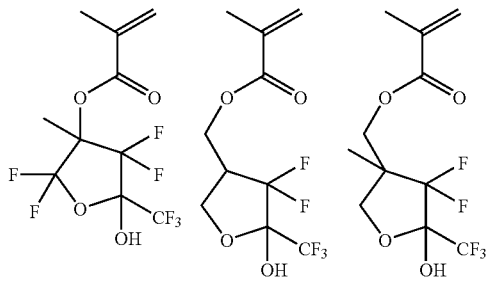
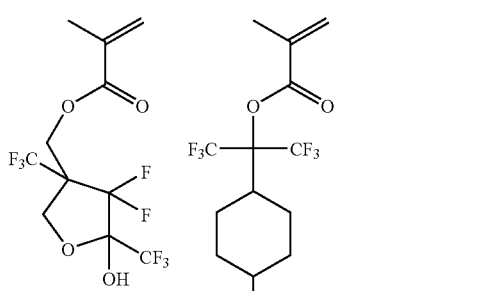
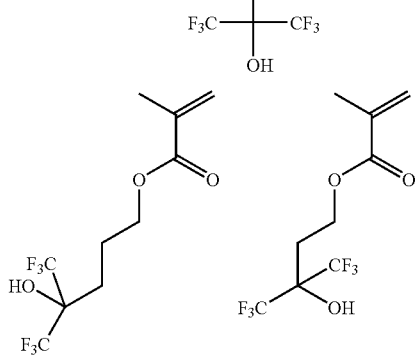
54
-continued
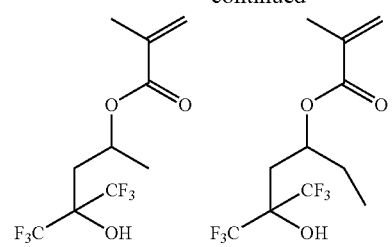
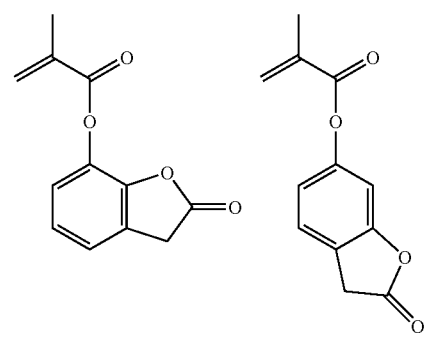
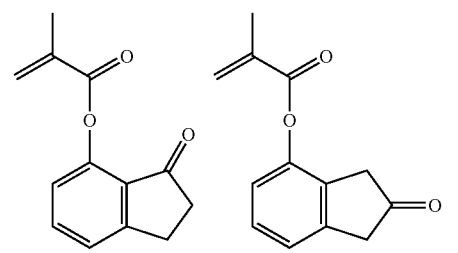
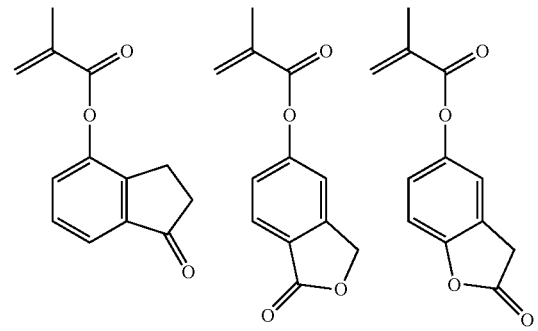
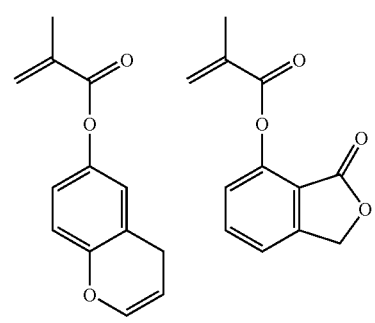

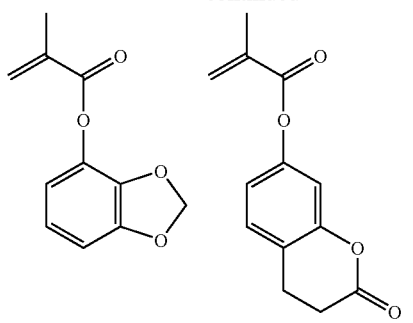
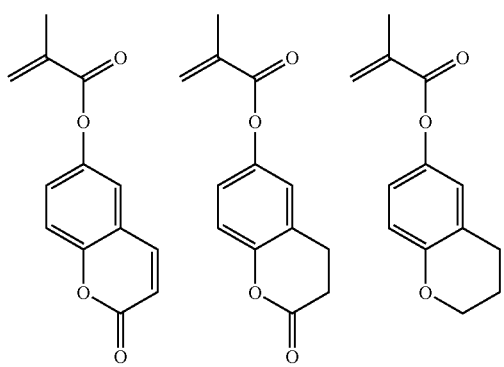
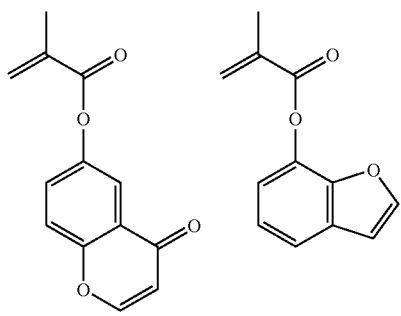
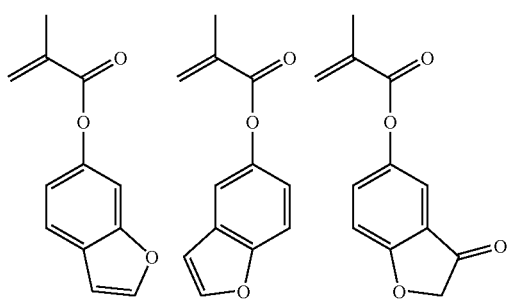
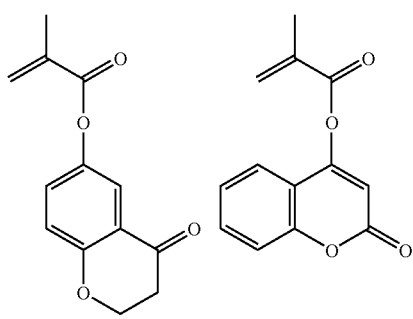
-continued
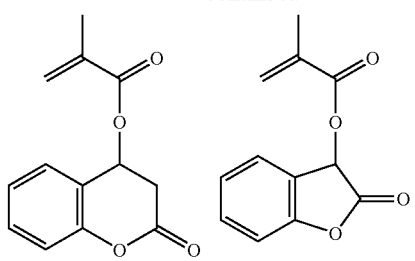
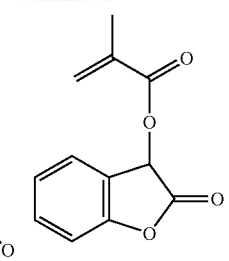
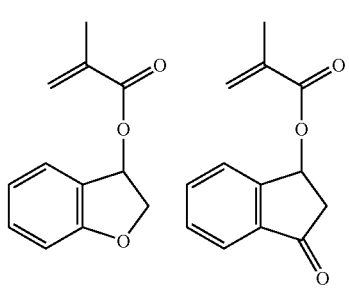
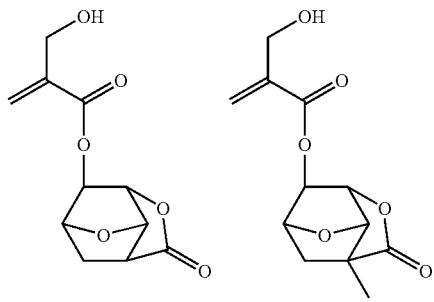
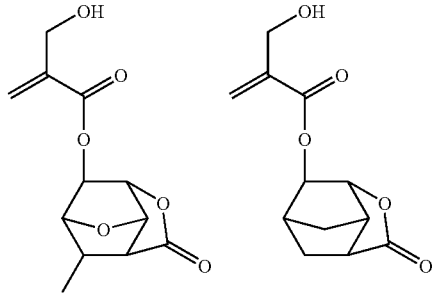
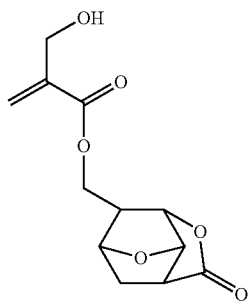

57
-continued
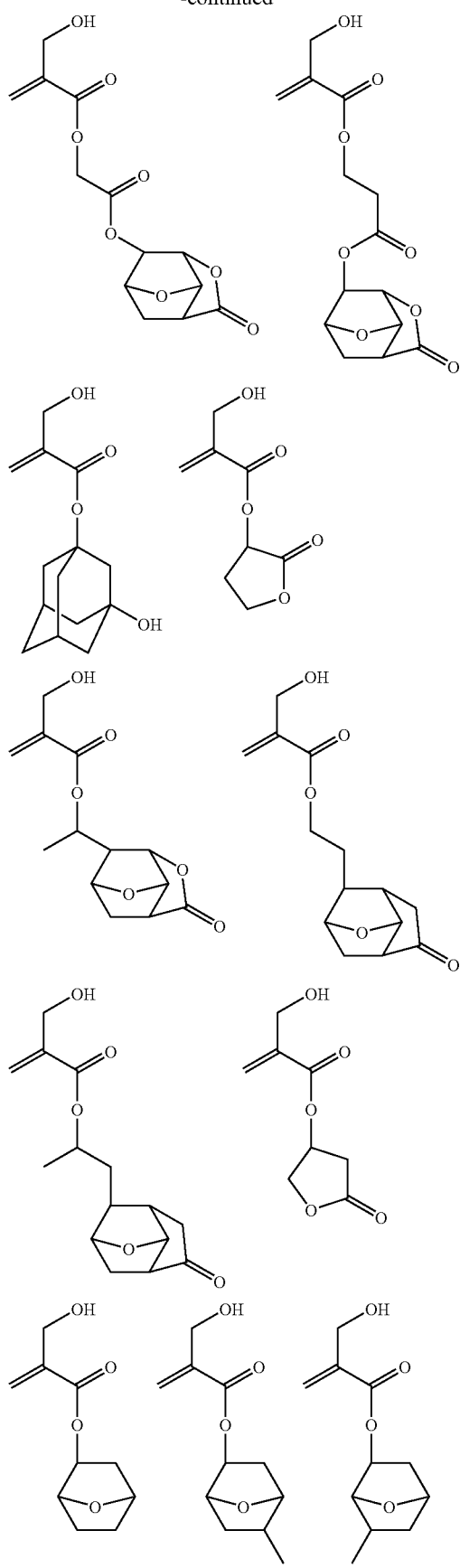
58
-continued
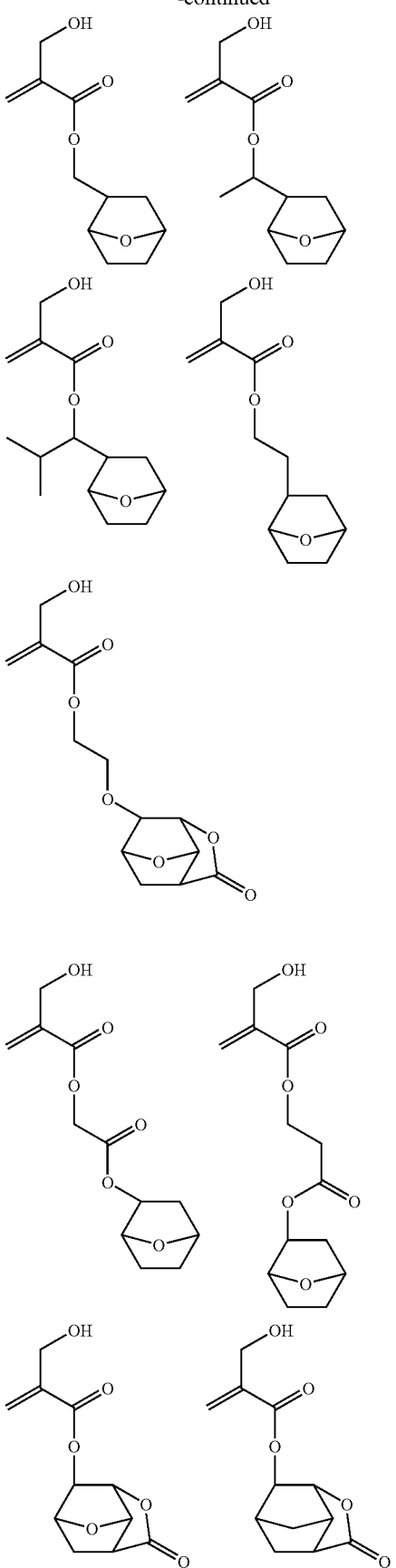

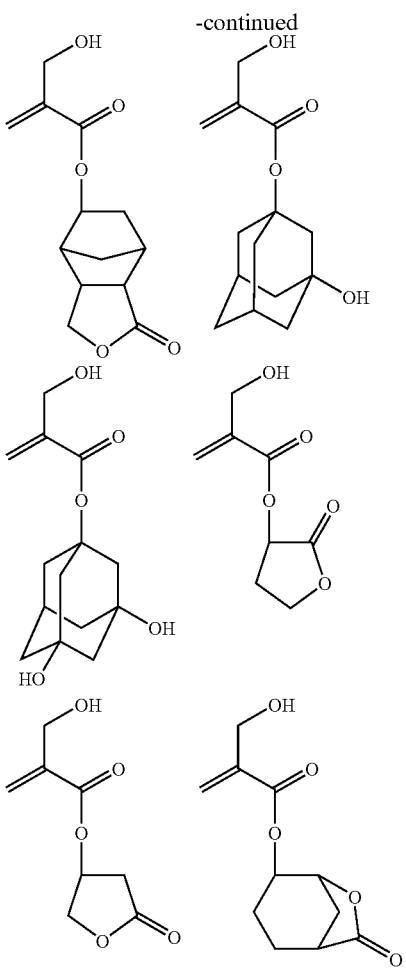

In the polymer, the recurring units (a1), (a2), (b), (c1), (c2), and (d) are present in proportions a1, a2, b, c1, c2, and d, respectively, which satisfy the range: $0 \leq a1 < 1.0$, $0 \leq a2 < 1.0$, $0 < a1+a2 < 1.0$, $0 < b < 1.0$, $0 \leq c1 < 1.0$, $0 \leq c2 < 1.0$, $0 \leq d < 1.0$, and $0 < a1+a2+b+c1+c2+d \leq 1.0$, and preferably the range: $0.02 \leq a1+a2 \leq 0.8$ and $0 < c1+c2 < 1.0$, and also preferably $0 < a1+a2+b+c1+c2 \leq 1.0$.

The preferred range is $0 \leq a1 \leq 0.8$, $0 \leq a2 \leq 0.8$, $0.02 \leq a1+a2 \leq 0.8$, $0.1 \leq b \leq 0.8$, $0 \leq c1 \leq 0.8$, $0 \leq c2 \leq 0.8$, $0 \leq d \leq 0.8$, and $0.2 \leq a1+a2+b+c1+c2+d \leq 1.0$, and especially $0.1 \leq c1+c2 \leq 0.8$ and $0.3 \leq a1+a2+b+c1+c2+d \leq 1.0$.

The more preferred range is $0 \leq a1 \leq 0.7$, $0 \leq a2 \leq 0.7$, $0.05 \leq a1+a2 \leq 0.7$, $0.12 \leq b \leq 0.7$, $0 \leq c1 \leq 0.7$, $0 \leq c2 \leq 0.7$, $0 \leq d \leq 0.7$, and $0.3 \leq a1+a2+b+c1+c2+d \leq 1.0$, and especially $0.2 \leq c1+c2 \leq 0.7$ and $0.5 \leq a1+a2+b+c1+c2+d \leq 1.0$.

Preferred is $a1+a2+b+c1+c2+d=1.0$. It is noted that the meaning of $a1+a2+b+c1+c2=1$ is that in a polymer comprising recurring units a1, a2, b, c1 and c2, the sum of recurring units a1, a2, b, c1 and c2 is 100 mol % based on the total amount of entire recurring units. The meaning of $a1+a2+b+c1+c2<1$ is that in a polymer comprising recurring units a1, a2, b, c1 and c2, the sum of recurring units a1, a2, b, c1 and c2 is less than 100 mol % based on the total amount of entire recurring units, indicating the inclusion of other recurring units, for example, units (d).

The polymer serving as the base polymer in the resist used in the pattern forming process of the invention should preferably have a weight average molecular weight (Mw) in the range of 1,000 to 500,000, and more preferably 2,000 to 30,000 as measured by gel permeation chromatography (GPC) using polystyrene standards. With too low a Mw, the efficiency of thermal crosslinking in the resist material after development may become low. With too high a Mw, the polymer is likely to lose alkali solubility and to give rise to a footing phenomenon after pattern formation.

If a polymer as used in the resist composition has a wide molecular weight distribution or dispersity (Mw/Mn), which indicates the presence of lower and higher molecular weight polymer fractions, there is a possibility that foreign matter is left on the pattern or the pattern profile is degraded. The influences of molecular weight and dispersity become stronger as the pattern rule becomes finer.

Therefore, the multi-component copolymer should preferably have a narrow dispersity (Mw/Mn) of 1.0 to 2.0, especially 1.0 to 1.5, in order to provide a resist composition suitable for micropatterning to a small feature size. It is understood that a blend of two or more polymers which differ in compositional ratio, molecular weight or dispersity is acceptable.

The polymer as used herein may be synthesized by any desired method, for example, by dissolving unsaturated bond-containing monomers corresponding to the respective units (a1), (a2), (b), (c1), (c2), and (d) in an organic solvent, adding a radical polymerization initiator thereto, and effecting heat polymerization. Examples of the organic solvent which can be used for polymerization include toluene, benzene, tetrahydrofuran, diethyl ether and dioxane. Examples of the polymerization initiator used herein include 2,2'-azobisisobutyronitrile (AIBN), 2,2'-azobis(2,4-dimethyl-valeronitrile), dimethyl 2,2-azobis(2-methylpropionate), benzoyl peroxide, and lauroyl peroxide. Preferably the system is heated at 50 to 80° C. for polymerization to take place. The reaction time is about 2 to 100 hours, preferably about 5 to 20 hours. The acid labile group that has been incorporated in the monomers may be kept as such, or the acid labile group may be once removed with an acid catalyst and thereafter protected or partially protected. Notably, the polymer serving as the base resin may be added alone or in admixture of two or more. Inclusion of more than one polymer enables to tailor the resist composition for a particular performance.

The resist composition used herein may include an acid generator in order for the composition to function as a chemically amplified positive resist composition. Typical of the acid generator used herein is a photoacid generator (PAG) capable of generating an acid in response to actinic light or radiation. It is any compound capable of generating an acid upon exposure to high-energy radiation. Suitable photoacid generators include sulfonium salts, iodonium salts, sulfonyldiazomethane, N-sulfonyloxyimide, and oxime-O-sulfonate acid generators. The acid generators may be used alone or in admixture of two or more. Exemplary acid generators are described in U.S. Pat. No. 7,537,880 (JP-A 2008-111103, paragraphs [0122] to [0142]).

The resist composition may further comprise an organic solvent, basic compound, dissolution regulator, surfactant, and acetylene alcohol, alone or in combination. Their examples are described in JP-A 2008-111103. Specifically, exemplary organic solvents are described in paragraphs [0144] to [0145], exemplary basic compounds in paragraphs [0146] to [0164], and exemplary surfactants in paragraphs [0165] to [0166]. Exemplary dissolution regulators are described in JP-A 2008-122932 (US 2008090172), paragraphs [0155] to [0178], and exemplary acetylene alcohols in paragraphs [0179] to [0182]. Also polymeric quenchers as described in U.S. Pat. No. 7,598,016 (JP-A 2008-239918) may be added. The polymeric quencher segregates toward the resist film surface after coating for eventually enhancing the rectangularity of a resist pattern. When a protective coating is applied in the immersion lithography, the polymeric quencher is also effective in preventing the pattern film from thinning or the pattern top from rounding.

These ingredients may be added in ordinary amounts well known for individual ingredients. For example, the acid generator may be added in an amount of 0.1 to 20 parts, and specifically 0.1 to 10 parts by weight per 100 parts by weight of the base resin. The organic solvent may be added in an amount of 200 to 3,000 parts, and specifically 400 to 2,500 parts by weight per 100 parts by weight of the base resin. The basic compound may be added in an amount of 0.001 to 4 parts, and specifically 0.01 to 2 parts by weight per 100 parts by weight of the base resin.

Process

Now, the double patterning process is described.

FIGS. 1 to 3 illustrate prior art processes. One exemplary double patterning process 1 is illustrated in FIG. 1. A photoresist film 30 is coated and formed on a processable substrate 20 on a substrate 10. To prevent the photoresist pattern from collapsing, the advanced technology intends to reduce the thickness of photoresist film. One approach taken to compensate for a lowering of etch resistance of thinner film is to process the processable substrate using a hard mask. The double patterning process illustrated in FIG. 1 uses a multilayer coating in which a hard mask 40 is laid between the photoresist film 30 and the processable substrate 20 as shown in FIG. 1A. In the double patterning process, the hard mask is not always necessary, and an underlayer film in the form of a carbon film and a silicon-containing intermediate film may be laid instead of the hard mask, or an organic antireflective coating may be laid between the hard mask and the photoresist film. The hard mask used herein may be of $SiO_2$, SiN, SiON or p-Si, for example. The resist material used in double patterning process 1 is a positive resist composition. In the process, the resist film 30 is exposed and developed (FIG. 1B), the hard mask 40 is then dry etched (FIG. 1C), the photoresist film is stripped, and a second photoresist film 50 is coated, formed, exposed, and developed (FIG. 1D). Then the processable substrate 20 is dry etched (FIG. 1E). Since this etching is performed using the hard mask pattern and the second photoresist pattern as a mask, variations occur in the pattern size after etching of the processable substrate due to a difference in etch resistance between hard mask 40 and photoresist film 50.

To solve the above problem, a double patterning process 2 illustrated in FIG. 2 involves laying two layers of hard mask 41 and 42. The upper layer of hard mask 42 is processed using a first resist pattern, the lower layer of hard mask 41 is processed using a second resist pattern, and the processable substrate is dry etched using the two hard mask patterns. It is essential to establish a high etching selectivity between first hard mask 41 and second hard mask 42. Thus the process is rather complex.

FIG. 3 illustrates a double patterning process 3 using a trench pattern. This process requires only one layer of hard mask. However, since the trench pattern is lower in optical contrast than the line pattern, the process has the drawbacks of difficult resolution of the pattern after development and a narrow margin. It is possible to form a wide trench pattern and induce shrinkage by the thermal flow or RELACS method, but this process is more intricate. Using negative resist materials enables exposure at a high optical contrast, but the negative resist materials generally have the drawbacks of low contrast and low resolution capability as compared with positive resist materials. The trench process requires a very high accuracy of alignment because any misalignment between first and second trenches can lead to a deviation of the width of finally remaining lines.

The double patterning processes 1 to 3 described above have the drawback that two hard mask etchings are involved.

FIG. 4 illustrates a double patterning process of the invention. As in FIG. 1A, a first photoresist film 30 of a first positive resist material is formed on a processable substrate 20 on a substrate 10 via a hard mask 40 (FIG. 4A). The first resist film 30 is then exposed and developed (FIG. 4B). Then the first resist film 30 is crosslinked and cured by irradiation of UV radiation having a wavelength of more than 200 nm to 320 nm, forming a crosslinked resist film 30a (FIG. 4C). Prior to or after the irradiation of UV of more than 200 nm to 320 nm wavelength, heat may be applied to initiate or promote crosslinking. A combination of UV-induced crosslinking with thermal crosslinking yields a more robust film or pattern. Heat is preferably applied at a temperature of 150° C. to 300° C. for 5 to 600 seconds. At a temperature below 150° C., crosslinking may be short so that the first resist pattern may be dissolved upon coating of a second resist material or during second development. At a temperature above 300° C., the polymer backbone may be degraded or the pattern may be deformed due to thermal flow. Further, a second resist material is coated on the first resist pattern-bearing substrate to form a second resist film 50, which is exposed and developed to form a pattern of second photoresist film 50 in the space area of the pattern of first resist film 30, i.e., crosslinked resist film 30a (FIG. 4D). Then the hard mask 40 is etched (FIG. 4E). The processable substrate 20 is dry etched, and finally, the crosslinked resist film 30a and second resist film 50 are removed (FIG. 4F).

Figure 5A:
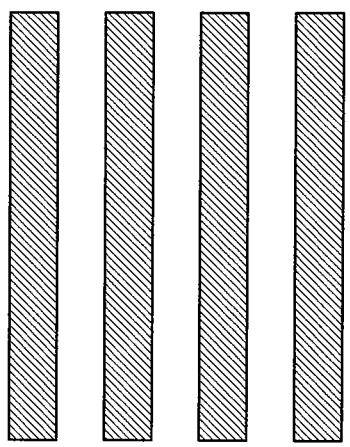
FIG. 5 is a plan view of an exemplary double patterning process in one embodiment of the invention, FIG. 5A showing a first pattern being formed, and FIG. 5B showing a second pattern being formed so as to cross the first pattern.
Figure 5B:
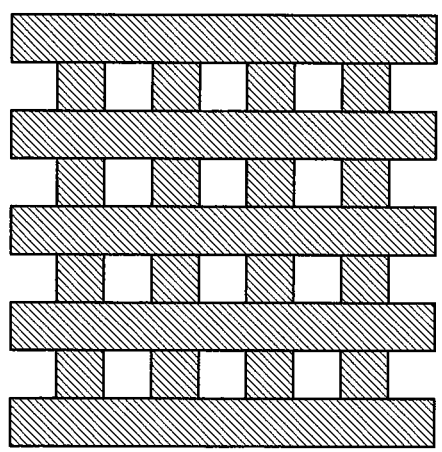
Figure 6A:
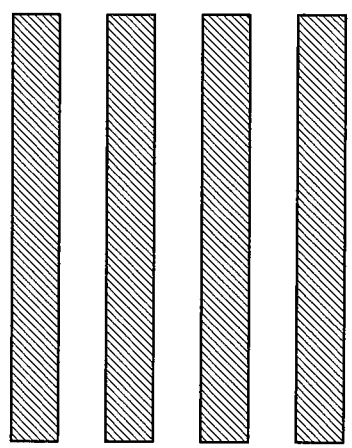
FIG. 6 is a plan view of an exemplary double patterning process in another embodiment of the invention, FIG. 6A showing a first pattern being formed, and FIG. 6B showing a second pattern spaced apart from the first pattern being formed.
Figure 6B:
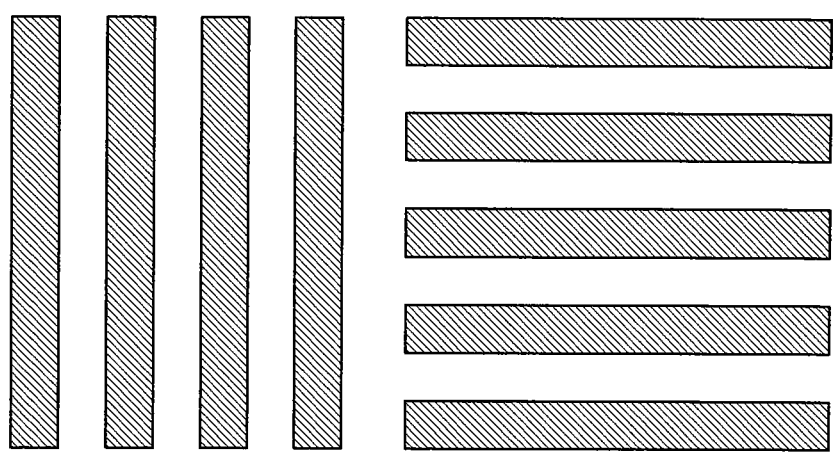

Although the process illustrated in FIG. 4 forms the second pattern between lines of the first pattern, it is also acceptable to form the second pattern so as to cross the first pattern orthogonally as shown in FIG. 5. Although such a pattern may be formed through a single exposure step, an orthogonal line pattern may be formed at a very high contrast by a combination of dipolar illumination with polarized illumination. Specifically, pattern lines in Y direction are formed as shown in FIG. 5A and then insolubilized by the process of the invention. Thereafter, a second resist is coated and processed to form pattern lines in X direction as shown in FIG. 5B. Combining X and Y lines defines a grid pattern while empty areas become holes. The pattern that can be formed by such a process is not limited to the orthogonal pattern, and may include a T-shaped pattern (not shown) or a separated pattern as shown in FIG. 6B.

The substrate 10 used herein is generally a silicon substrate. The processable substrate 20 used herein includes $SiO_2$, SiN, SiON, SiOC, p-Si, $\alpha$-Si, TiN, WSi, BPSG, SOG, Cr, CrO, CrON, MoSi, low dielectric film, and etch stopper film. The hard mask 40 is as described above. Understandably, an undercoat film in the form of a carbon film and an intermediate intervening layer in the form of a silicon-containing intermediate film or organic antireflective coating may be formed instead of the hard mask.

In the process of the invention, a first resist film of a first positive resist material is formed on the processable substrate directly or via the intermediate intervening layer. The first resist film preferably has a thickness of 10 to 1,000 nm, and more preferably 20 to 500 nm. The first resist film is heated or pre-baked prior to exposure, with the preferred pre-baking conditions including a temperature of 60 to 180° C., especially 70 to 150° C. and a time of 10 to 300 seconds, especially 15 to 200 seconds.

This is followed by patternwise exposure. For the exposure, preference is given to high-energy radiation having a wavelength of 140 to 250 nm, and especially ArF excimer laser radiation of 193 nm. The exposure may be done either in air or in a dry atmosphere with a nitrogen stream, or by immersion lithography in water. The ArF immersion lithography uses deionized water or liquids having a refractive index of at least 1 and highly transparent to the exposure wavelength such as alkanes as the immersion solvent. The immersion lithography involves prebaking a resist film and exposing the resist film to light through a projection lens, with water introduced between the resist film and the projection lens. Since this allows lenses to be designed to a NA of 1.0 or higher, formation of finer feature size patterns is possible. The immersion lithography is important for the ArF lithography to survive to the 45-nm node. In the case of immersion lithography, deionized water rinsing (or post-soaking) may be carried out after exposure for removing water droplets left on the resist film, or a protective coating may be applied onto the resist film after pre-baking for preventing any leach-outs from the resist film and improving water slip on the film surface. The resist protective coating used in the immersion lithography is preferably formed from a solution of a polymer having 1,1,1,3,3,3-hexafluoro-2-propanol residues which is insoluble in water, but soluble in an alkaline developer liquid, in a solvent selected from alcohols of at least 4 carbon atoms, ethers of 8 to 12 carbon atoms, and mixtures thereof. After formation of the photoresist film, deionized water rinsing (or post-soaking) may be carried out for extracting the acid generator and the like from the film surface or washing away particles, or after exposure, rinsing (or post-soaking) may be carried out for removing water droplets left on the resist film.

Exposure is preferably carried out so as to provide an exposure dose of about 1 to 200 mJ/cm², more preferably about 10 to 100 mJ/cm². This is followed by baking on a hot plate at 60 to 150° C. for 1 to 5 minutes, preferably at 80 to 120° C. for 1 to 3 minutes (post-exposure baking=PEB).

Thereafter the resist film is developed with a developer in the form of an aqueous alkaline solution, for example, an aqueous solution of 0.1 to 5 wt %, preferably 2 to 3 wt % tetramethylammonium hydroxide (TMAH) for 0.1 to 3 minutes, preferably 0.5 to 2 minutes by conventional techniques such as dip, puddle or spray techniques. In this way, a desired resist pattern is formed on the substrate.

The first resist pattern as developed is then cured through crosslinking which can be induced by application of radiation with more than 200 nm to 320 nm wavelength and optionally heat. Irradiated after development is high-energy radiation having a wavelength of more than 200 nm to 320 nm, for example, KrBr excimer light of 206 nm wavelength, KrCl excimer light of 222 nm wavelength, KrF excimer light of 248 nm wavelength, XeBr excimer light of 283 nm wavelength, XeCl excimer light of 308 nm wavelength, or emission spanning 254 nm wavelength from a low-pressure mercury lamp, high-pressure mercury lamp or metal halide lamp. Irradiation of UV light with more than 200 nm to 320 nm wavelength not only causes the photoacid generator to generate an acid, but also promotes photo-induced crosslinking reaction. When a thermal acid generator in the form of an ammonium salt has been added to the first photoresist composition in an amount of 0.001 to 20 parts, preferably 0.01 to 10 parts by weight per 100 parts by weight of the base resin, an acid can be generated by heating. In this case, acid generation and crosslinking reaction proceed simultaneously. The preferred heating conditions include a temperature of 100 to 300° C., and especially 130 to 250° C., and a time of 10 to 300 seconds. The timing of heating may be before or during the irradiation. As a result, a crosslinked resist film is formed which is insoluble in solvents and alkaline developers.

Suitable ammonium salts serving as the thermal acid generator include compounds of the formula (P1a-2).

(P1a-2)

Herein $R^{101d}$, $R^{101e}$, $R^{101f}$, and $R^{101g}$ are each independently hydrogen, a straight, branched or cyclic alkyl, alkenyl, oxoalkyl or oxoalkenyl group of 1 to 12 carbon atoms, an aryl group of 6 to 20 carbon atoms, or an aralkyl or aryloxoalkyl group of 7 to 12 carbon atoms, in which some or all hydrogen atoms may be substituted by alkoxy groups. Alternatively, $R^{101d}$ and $R^{101e}$, or $R^{101d}$, $R^{101e}$ and $R^{101f}$ may bond together to form a ring with the nitrogen atom to which they are attached, and each of $R^{101e}$ and $R^{101f}$ or each of $R^{101d}$, $R^{101e}$ and $R^{101f}$ is a $C_3$-$C_{10}$ alkylene group or a hetero-aromatic ring having incorporated therein the nitrogen atom when they form a ring. $K^-$ is a sulfonate having at least one fluorine substituted at α-position, or perfluoroalkylimidate or perfluoroalkylmethidate.

Examples of $K^-$ include perfluoroalkanesulfonates such as triflate and nonaflate, imidates such as bis(trifluoromethylsulfonyl)imide, bis(perfluoroethylsulfonyl)imide, and bis(perfluorobutylsulfonyl)imide, methidates such as tris(trifluoromethylsulfonyl)methide and tris(perfluoroethylsulfonyl)methide, and sulfonates having fluorine substituted at α-position, represented by the formula (K-1), and sulfonates having fluorine substituted at α-position, represented by the formula (K-2).

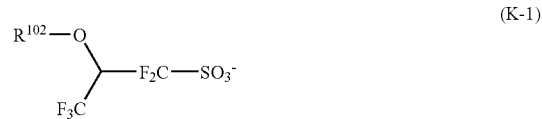

(K-1)

(K-2)

In formula (K-1), $R^{102}$ is hydrogen, a straight, branched or cyclic $C_1$-$C_{20}$ alkyl or acyl group, $C_2$-$C_{20}$ alkenyl group or $C_6$-$C_{20}$ aryl or aryloxy group, which may have an ether, ester, carbonyl group or lactone ring and in which some or all hydrogen atoms may be substituted by fluorine atoms. In formula (K-2), $R^{103}$ is hydrogen, a straight, branched or cyclic $C_1$-$C_{20}$ alkyl group, $C_2$-$C_{20}$ alkenyl group or $C_6$-$C_{20}$ aryl group.

Irradiation of UV light with more than 200 nm to 320 nm wavelength has the advantage that no ozone is generated even when irradiation is performed in air. This eliminates a need for purging with an inert gas such as nitrogen gas for preventing ozone generation and leads to outstandingly increased throughputs. The ArF excimer laser of 193 nm wavelength corresponds to the shortest wavelength at which no ozone is generated without nitrogen purge. In this sense, the resist film may be cured by irradiation from the ArF excimer laser. However, since the ArF excimer laser is expensive, it is not acceptable from the economic aspect to use the ArF scanner for the curing purpose only. On the other hand, the ArF excimer lamp is relatively inexpensive and capable of illuminating over a large area, but has too low a power to produce acceptable throughputs.

Examples of high-energy radiation having a wavelength of more than 200 nm to 320 nm include KrBr excimer light of 206 nm wavelength, KrCl excimer light of 222 nm wavelength, KrF excimer light of 248 nm wavelength, XeCl excimer light of 308 nm wavelength, and emission spanning 254 nm wavelength from a low-pressure mercury lamp, high-pressure mercury lamp or metal halide lamp. Of these, KrCl excimer light of 222 nm wavelength and KrF excimer light of 248 nm wavelength are preferred, with the KrCl excimer light of 222 nm wavelength being most preferred. The reason is that the KrCl excimer light has a high energy density due to the shortest wavelength among the high-energy radiation having a wavelength of more than 200 nm to 320 nm, and most of the irradiated energy is absorbed since naphthalene has high absorption near 200 to 240 nm wavelength.

The high-pressure mercury lamp emits lines at 254, 264, 291, 297, 302, 313, 365, 405, 436, 546, and 577 nm. Since light with a wavelength longer than 365 nm is less likely to cause decomposition of the acid generator added to the photoresist, irradiation of light with a wavelength shorter than 320 nm is effective. Light with a wavelength longer than 320 nm may be cut off by providing the optical system with a filter or mirror and in some cases, such cut-off may be omitted. The metal halide lamp emits a broad continuous spectrum of UV rather than the high intensity spectrum of the high-pressure mercury lamp, and in this case, the longer wavelength side may or may not be cut off. The high-pressure mercury lamp and metal halide lamp have the advantages of a low cost, a high intensity, a wide wavelength range of light, and no generation of standing waves, ensuring that acid generation and curing prevail throughout the pattern in the film direction Next, a second resist material is coated onto the intermediate intervening layer of hard mask or the like having the pattern of crosslinked resist film formed thereon, thereby forming a second resist film. The second resist material used herein is preferably a positive resist composition, and more preferably a chemically amplified positive resist composition. The second resist material may be the same as the first resist composition disclosed herein or any of well-known resist compositions. The pattern forming process of the invention is characterized by the crosslinking reaction of the first resist pattern after development, while the crosslinking reaction of the second resist pattern after development is not necessarily needed. Namely, the hydroxynaphthyl and/or hydroxyacenaphthylene as shown in formula (1) is not essential for the resist material for forming the second resist pattern, and any prior art well-known chemically amplified positive resist compositions may be used.

The chemically amplified positive resist composition for forming the second resist film may be a known composition, typically comprising a polymer comprising recurring units of formula (1), especially formula (2), or any well-known polymer as a base resin, a photoacid generator, an organic solvent, and optionally, a basic compound, a dissolution regulator, a surfactant, an acetylene alcohol, and the like. Each of these components may be selected from well-known compounds and added in commonly used amounts. The base resin used herein preferably has a Mw and Mw/Mn in the same range as the base resin in the first resist composition.

Preferably the second resist film is exposed and developed in a conventional way to form a pattern of second resist film in the space area of the first pattern of crosslinked resist film, for thereby reducing the distance between pattern features to one half. The conditions of exposure and development and the thickness of the second resist film may be the same as described above.

Next, using the crosslinked resist film and second resist film as a mask, the intermediate intervening layer of hard mask or the like is etched, and the processable substrate further etched. For etching of the intermediate intervening layer of hard mask or the like, dry etching with fluorocarbon or halogen gases may be used. For etching of the processable substrate, the etching gas and conditions may be properly chosen so as to establish an etching selectivity relative to the hard mask, and specifically, dry etching with fluorocarbon, halogen, oxygen, hydrogen or similar gases may be used. Thereafter, the crosslinked resist film and second resist film are removed. Removal of these films may be carried out after etching of the intermediate intervening layer of hard mask or the like. It is noted that removal of the crosslinked resist film may be achieved by dry etching with oxygen or radicals and removal of the second resist film may be achieved as previously described, or using strippers such as amines, sulfuric acid/aqueous hydrogen peroxide or organic solvents.

EXAMPLE

Examples of the invention are given below by way of illustration and not by way of limitation. The abbreviations used herein are GPC for gel permeation chromatography, Mw for weight average molecular weight, Mn for number average molecular weight, Mw/Mn for molecular weight distribution or dispersity, NMR for nuclear magnetic resonance, PGMEA for propylene glycol monomethyl ether acetate, and TMAH for tetramethylammonium hydroxide. For all polymers, Mw and Mn are determined by GPC versus polystyrene standards.

Synthesis Examples

Polymers to be used in resist compositions were prepared by combining various monomers, effecting copolymerization reaction in tetrahydrofuran medium, crystallization in methanol, repeatedly washing with hexane, isolation, and drying. The resulting polymers (Polymers 1 to 15 and Comparative Polymer 1) had the composition shown below. The composition of each polymer was analyzed by $^1$H-NMR, and the Mw and Mw/Mn determined by GPC.

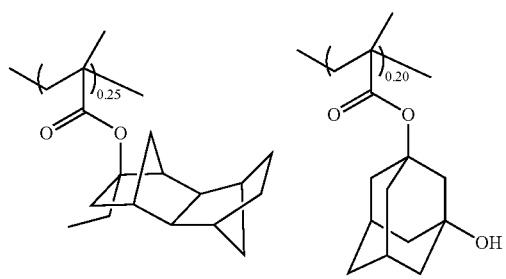

Polymer 1

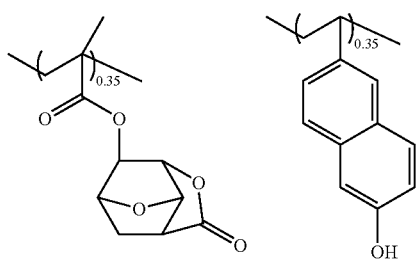
Mw = 8,200
Mw/Mn = 1.96
Polymer 2
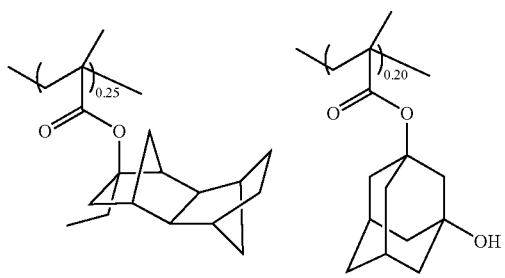
Mw = 8,800
Mw/Mn = 1.77
Polymer 3
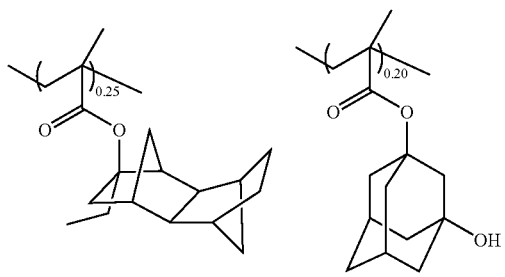
Mw = 7,600
Mw/Mn = 1.80
Polymer 4
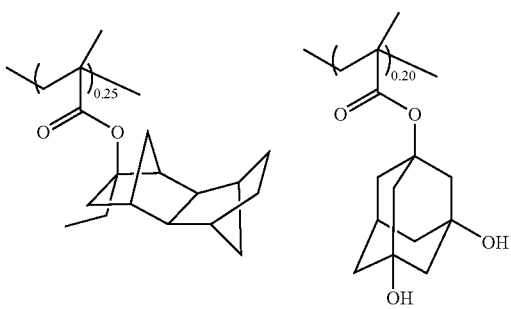
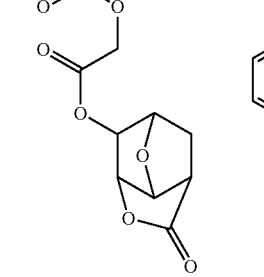
Mw = 9,100
Mw/Mn = 1.72
Polymer 5
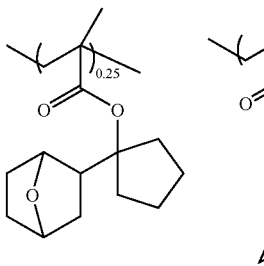
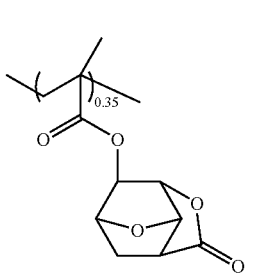
Mw = 7,800
Mw/Mn = 1.79

-continued
Polymer 6
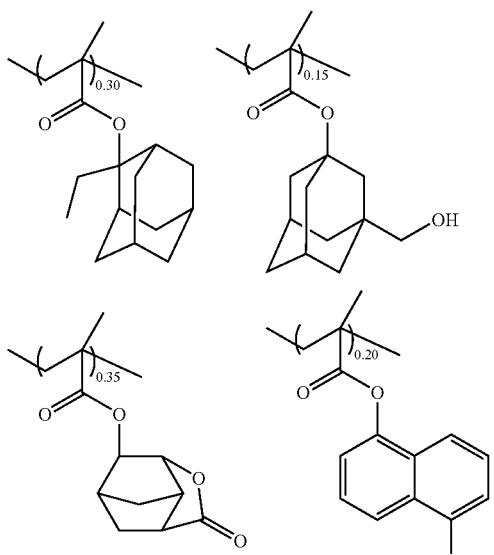
Mw = 7,600
Mw/Mn = 1.79
Polymer 7
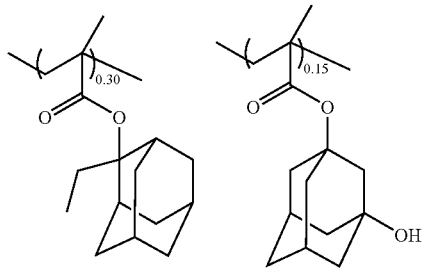
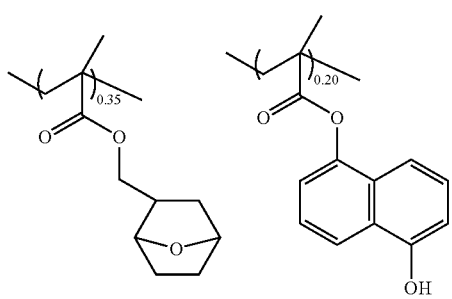
Mw = 8,900
Mw/Mn = 1.84
Polymer 8
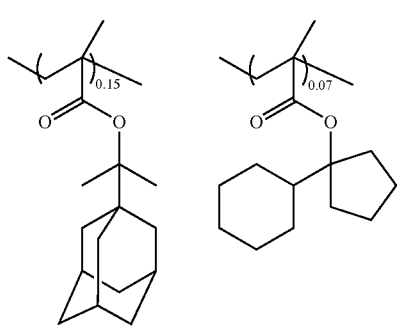
-continued
Polymer 8 (cont.)
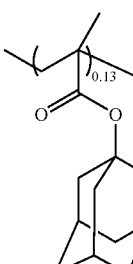
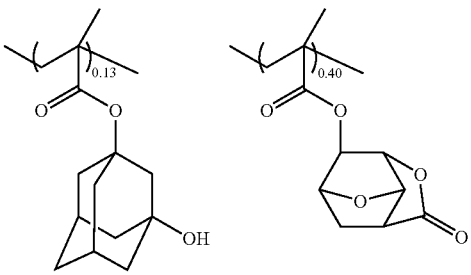
Mw = 7,200
Mw/Mn = 1.75
Polymer 9
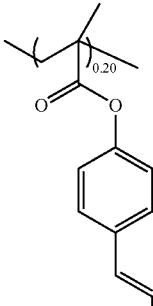
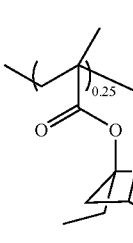
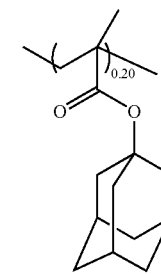
Mw = 8,600
Mw/Mn = 1.98
Polymer 10
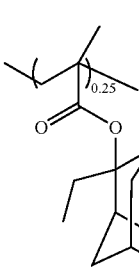

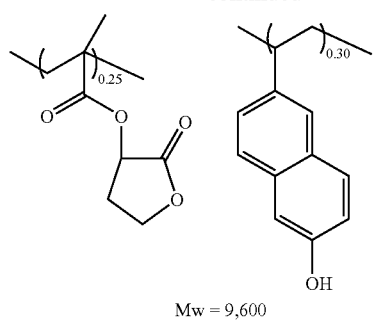
Mw = 9,600
Mw/Mn = 1.92
Polymer 11
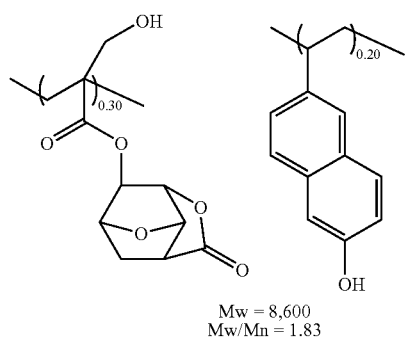
Mw = 8,600
Mw/Mn = 1.83
Polymer 12
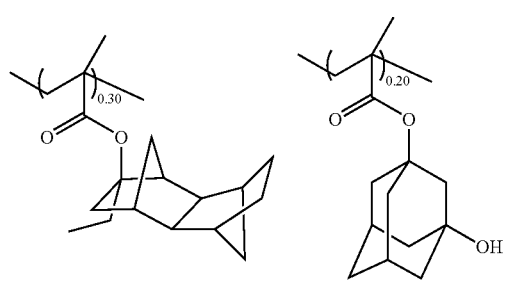
Mw = 8,600
Mw/Mn = 1.91
Polymer 13
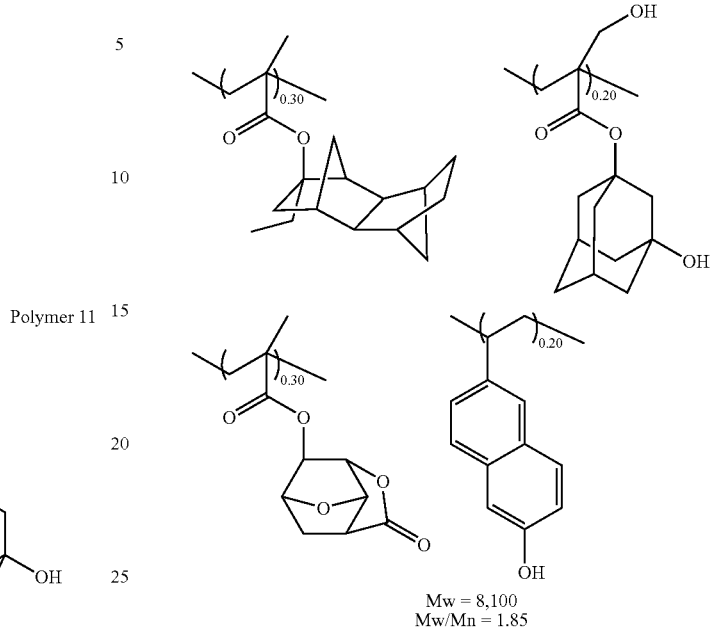
Mw = 8,100
Mw/Mn = 1.85
Polymer 14
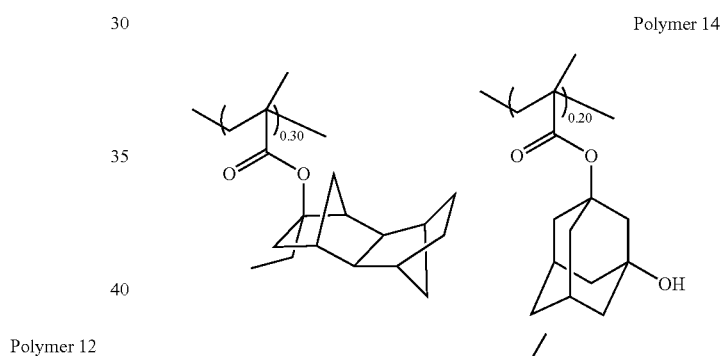
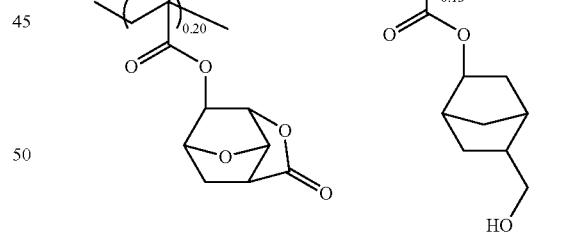
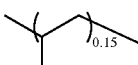
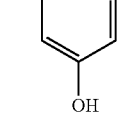
Mw = 8,300
Mw/Mn = 1.74

Polymer 15

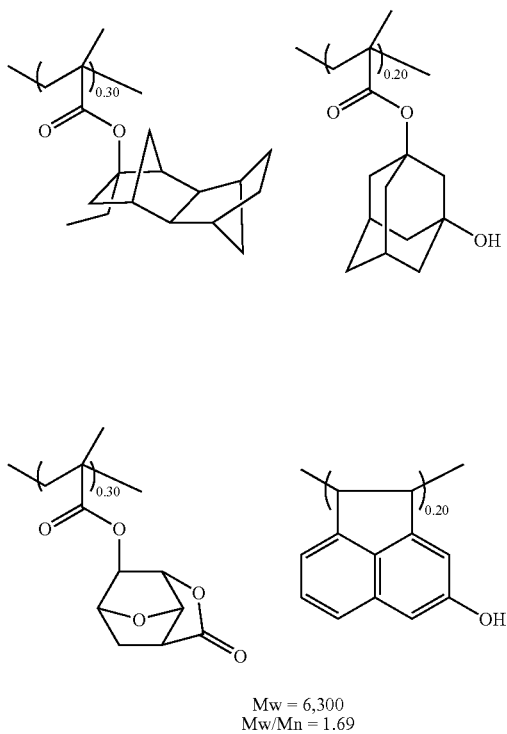

Mw = 6,300
Mw/Mn = 1.69

Comparative Polymer 1

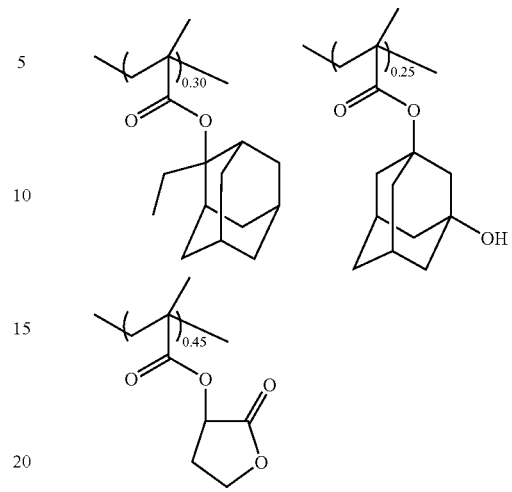

Mw = 8,900
Mw/Mn = 1.86

Preparation of Positive Resist Composition

A resist solution was prepared by dissolving each polymer and an acid generator in a solvent in accordance with the recipe shown in Table 1, and filtering through a Teflon® filter with a pore size of 0.2 μm. The solvent contained 100 ppm of surfactant FC-4430 (3M-Sumitomo Co., Ltd.).

TABLE 1

|  | Polymer (pbw) | Acid generator (pbw) | Basic compound (pbw) | Organic solvent (pbw) |
| --- | --- | --- | --- | --- |
| Resist 1 | Polymer 1 (100) | PAG1 (14.0) | Quencher 1 (0.5) Quencher 2 (2.0) | PGMEA (2,000) CyH (500) |
| Resist 2 | Polymer 2 (100) | PAG1 (14.0) | Quencher 1 (0.5) Quencher 2 (2.0) | PGMEA (2,000) CyH (500) |
| Resist 3 | Polymer 3 (100) | PAG1 (14.0) | Quencher 1 (1.6) | PGMEA (2,000) CyH (500) |
| Resist 4 | Polymer 4 (100) | PAG1 (14.0) | Quencher 1 (1.6) | PGMEA (2,000) CyH (500) |
| Resist 5 | Polymer 5 (100) | PAG1 (14.0) | Quencher 1 (1.6) | PGMEA (2,000) CyH (500) |
| Resist 6 | Polymer 6 (100) | PAG1 (14.0) | Quencher 1 (1.6) | PGMEA (2,000) CyH (500) |
| Resist 7 | Polymer 7 (100) | PAG1 (14.0) | Quencher 1 (1.6) | PGMEA (2,000) CyH (500) |
| Resist 8 | Polymer 8 (100) | PAG1 (14.0) | Quencher 1 (1.6) | PGMEA (2,000) CyH (500) |
| Resist 9 | Polymer 9 (100) | PAG1 (14.0) | Quencher 1 (1.6) | PGMEA (2,000) CyH (500) |
| Resist 10 | Polymer 10 (100) | PAG1 (14.0) | Quencher 1 (1.6) | PGMEA (2,000) CyH (500) |
| Resist 11 | Polymer 2 (100) | PAG2 (14.0) | Quencher 1 (1.6) | PGMEA (2,000) CyH (500) |
| Resist 12 | Polymer 2 (100) | PAG1 (12.0) TAG1 (1.0) | Quencher 1 (1.4) | PGMEA (2,000) CyH (500) |
| Resist 13 | Polymer 11 (100) | PAG1 (12.0) TAG1 (1.0) | Quencher 1 (1.4) | PGMEA (2,000) CyH (500) |
| Resist 14 | Polymer 12 (100) | PAG1 (10.0) TAG1 (1.0) | Quencher 1 (1.3) | PGMEA (2,000) CyH (500) |
| Resist 15 | Polymer 13 (100) | PAG1 (11.0) TAG1 (1.0) | Quencher 1 (1.4) | PGMEA (2,000) CyH (500) |

TABLE 1-continued

| | Polymer (pbw) | Acid generator (pbw) | Basic compound (pbw) | Organic solvent (pbw) |
|---|---|---|---|---|
| Resist 16 | Polymer 14 (100) | PAG1 (11.0) TAG1 (1.0) | Quencher 1 (0.5) Quencher 2 (2.0) | PGMEA (2,000) CyH (500) |
| Resist 17 | Polymer 15 (100) | PAG1 (14.0) | Quencher 1 (1.6) | PGMEA (2,000) CyH (500) |
| Comparative Resist 1 | Comparative Polymer 1 (100) | PAG1 (14.0) | Quencher 1 (1.6) | PGMEA (2,000) CyH (500) |

The components in Table 1 are identified below.

Acid generator: PAG1, PAG2 and TAG1 of the following structural formulae

PAG 1

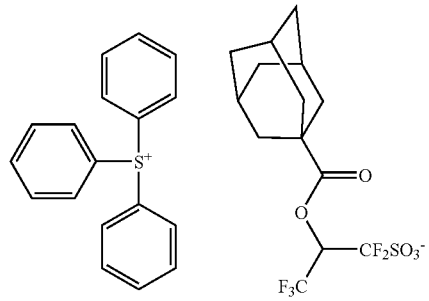

PAG 2

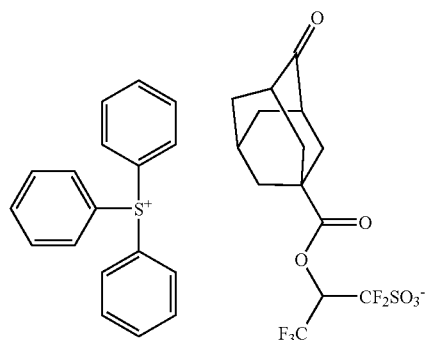

TAG 1

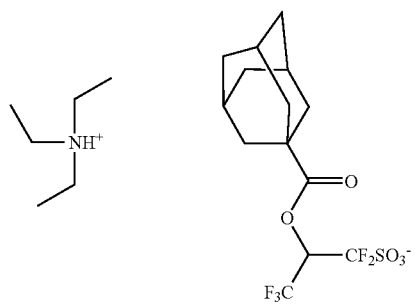

Basic compound: Quenchers 1 and 2 of the following structural formulae

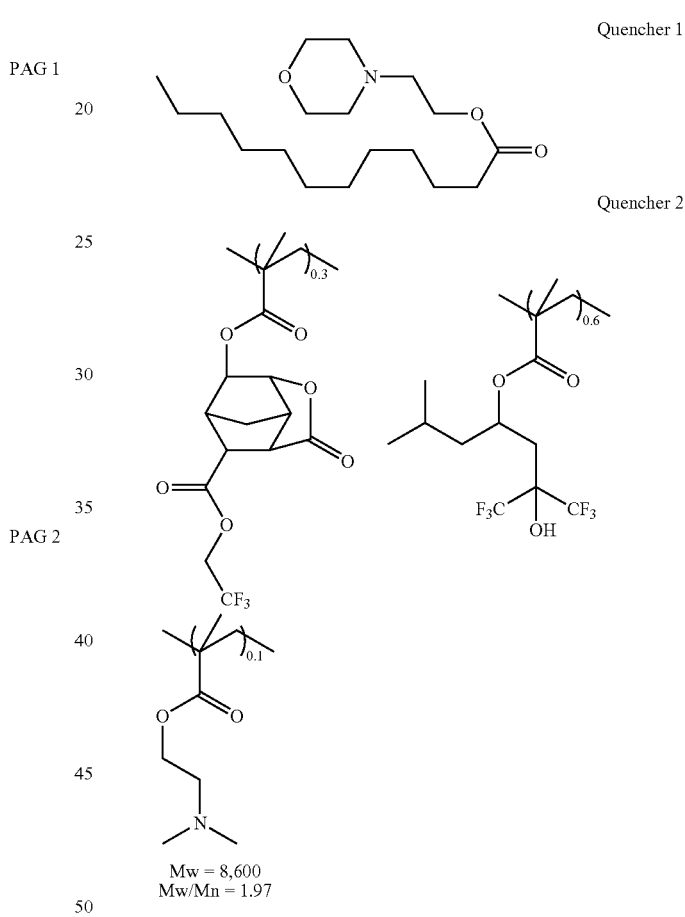

Organic solvent: PGMEA and cyclohexanone (CyH)

Absorbance of Positive Resist Material

Figure 7:
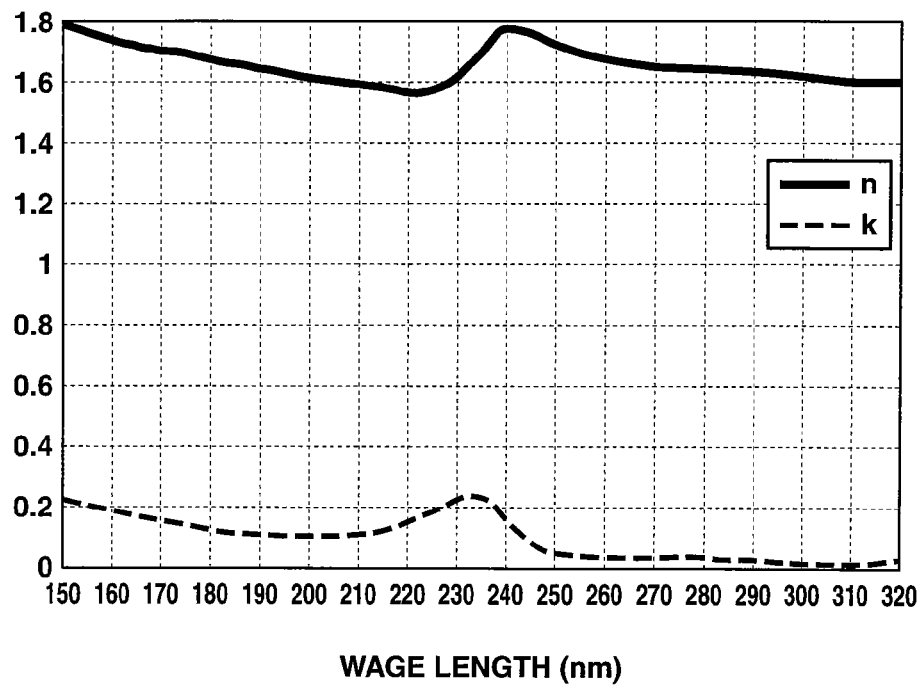
FIG. 7 is a graph showing the refractive index of inventive Resist 1 over a wavelength range of 150 to 320 nm.
Figure 8:
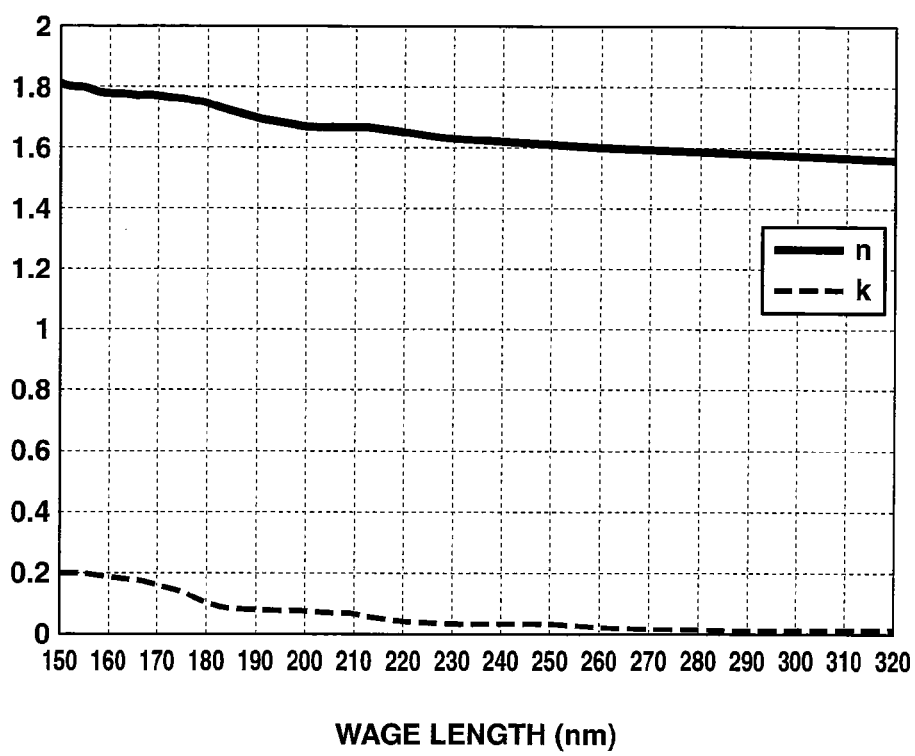
FIG. 8 is a graph showing the refractive index of Comparative Resist 1 over a wavelength range of 150 to 320 nm.

Resist 1 or Comparative Resist 1 shown in Table 1 was coated on a silicon substrate and baked at 100° C. for 60 seconds to form a resist film of 100 nm thick. Using a variable angle spectroscopic ellipsometer (VUV-VASE®) of J. A. Woollam Co., the optical constants (refractive index n and extinction coefficient k) of the film over a wavelength range of 150 nm to 320 nm were determined. The data of measurement from Resist 1 and Comparative Resist 1 are shown in FIGS. 7 and 8, respectively.

The extinction coefficient k represents absorption. An absorbance is computed from a k value. An absorbance per film thickness 1 µm is computed according to the equation:

$$K \times 4 \times \pi / \text{wavelength}(0.193)$$

An absorbance at each wavelength is computed according to this equation, with the results shown in Table 2. It is demonstrated that Resist 1 containing hydroxynaphthalene exhibits a strong absorption at wavelength 220 to 240 nm.

TABLE 2

| | Absorbance | | | |
|---|---|---|---|---|
| | 172 nm | 193 nm | 222 nm | 248 nm |
| Resist 1 | 9.46 | 6.47 | 9.64 | 3.28 |
| Comparative Resist 1 | 8.84 | 4.21 | 1.79 | 1.29 |

Curing of Positive Resist Material

On a substrate (silicon wafer) having an antireflective coating (ARC-29A, Nissan Chemical Industries, Ltd.) of 80 nm thick, each resist composition (Resists 1 to 17, Comparative Resist 1 in Table 1) was spin coated, then baked on a hot plate at 100° C. for 60 seconds to form a resist film of 100 nm thick. The resist film was irradiated with UV radiation and baked for 60 seconds, after which the thickness of the resist film was measured by an optical thickness gauge. Liquid PGMEA was statically dispensed on the resist film for 20 seconds, followed by spin drying and baking at 100° C. for 60 seconds for evaporating off PGMEA. At this point, the thickness of the resist film was measured again. A film thickness reduction before and after PGMEA treatment was determined.

Separately, each resist composition was similarly spin coated on a substrate (silicon wafer) having an antireflective coating (ARC-29A) of 80 nm thick, then baked on a hot plate at 100° C. for 60 seconds to form a resist film of 100 nm thick. The resist film was irradiated with UV radiation and baked for 60 seconds, after which the thickness of the resist film was measured by an optical thickness gauge. The resist film was developed with a developer, i.e., an aqueous solution of 2.38 wt % TMAH for 30 seconds, after which the thickness of the resist film was measured again. A film thickness reduction before and after development was determined.

For UV irradiation, a KrCl excimer lamp (wavelength 222 nm, 5 mW/cm$^2$, by Ushio Inc.), a KrF excimer scanner S203B (wavelength 248 nm, by Nikon Corp.), and a high-pressure mercury lamp (100 W/cm$^2$, by Ushio Inc.) were used. With every system, UV irradiation was performed in air.

In Comparative Example 2, a Xe excimer lamp (wavelength 172 nm, 10 mW/cm$^2$, by Ushio Inc.) was used. The chamber was loaded with the wafer and purged with nitrogen at a flow rate of 1,000 mL/min for 5 minutes, before irradiation with 172 nm radiation. In Comparative Example 3, irradiation with 172 nm radiation was performed in air.

The results are shown in Table 3.

TABLE 3

| | | Resist material | Irradiation wavelength (nm) | Irradiation dose (mJ/cm$^2$) | PEB temperature (° C.) | Film thickness after baking (nm) | Film thinning by solvent (nm) | Film thinning by development (nm) |
|---|---|---|---|---|---|---|---|---|
| Example | 1 | Resist 1 | 222 | 50 | 200 | 85 | 0.3 | 0.4 |
| | 2 | Resist 1 | 248 | 100 | 200 | 84 | 0.5 | 0.6 |
| | 3 | Resist 2 | 248 | 100 | 200 | 82 | 0.5 | 0.5 |
| | 4 | Resist 3 | 222 | 50 | 200 | 82 | 0.5 | 0.6 |
| | 5 | Resist 4 | 222 | 50 | 200 | 88 | 0.5 | 0.6 |
| | 6 | Resist 5 | 222 | 50 | 200 | 88 | 0.4 | 0.2 |
| | 7 | Resist 6 | 222 | 50 | 200 | 88 | 0.6 | 0.5 |
| | 8 | Resist 7 | 222 | 50 | 200 | 83 | 0.3 | 0.2 |
| | 9 | Resist 8 | 222 | 50 | 200 | 81 | 0.6 | 0.7 |
| | 10 | Resist 9 | 222 | 50 | 200 | 81 | 0.6 | 0.6 |
| | 11 | Resist 10 | 222 | 50 | 200 | 81 | 0.7 | 0.8 |
| | 12 | Resist 11 | 222 | 50 | 200 | 84 | 0.3 | 0.4 |
| | 13 | Resist 12 | 222 | 50 | 200 | 85 | 0.5 | 0.7 |
| | 14 | Resist 13 | 222 | 50 | 200 | 84 | 0.3 | 0.3 |
| | 15 | Resist 14 | 222 | 50 | 200 | 83 | 0.3 | 0.3 |
| | 16 | Resist 15 | 222 | 50 | 200 | 84 | 0.3 | 0.3 |
| | 17 | Resist 16 | 222 | 50 | 200 | 86 | 0.3 | 0.4 |
| | 18 | Resist 1 | 222 | 20 | 200 | 85 | 0.7 | 0.9 |
| | 19 | Resist 1 | 222 | 30 | 200 | 85 | 0.5 | 0.8 |
| | 20 | Resist 1 | 222 | 100 | 200 | 85 | 0.3 | 0.3 |
| | 21 | Resist 1 | 222 | 50 | 220 | 84 | 0.2 | 0.3 |
| | 22 | Resist 1 | 222 | 50 | 190 | 84 | 0.3 | 0.4 |
| | 23 | Resist 17 | 222 | 100 | 200 | 90 | 0.3 | 0.4 |
| | 24 | Resist 1 | 10 sec exposure to HP Hg lamp (1 J/cm$^2$ overall wavelength) | 100 | 200 | 90 | 0.5 | 0.5 |
| Comparative Example | 1 | Comparative Resist 1 | 222 | 50 | 200 | 72 | 22 | 85 |
| | 2 | Resist 1 | 172 | 50 | 200 | 86 | 0.3 | 0.4 |
| | 3 | Resist 1 | 172 | 50 | 200 | 22 | 0.1 | 0.2 |

Resist Protective Coating Material for Immersion Lithography

A protective topcoat solution TC1 was prepared by dissolving a polymer and an additive in a solvent in accordance with the formulation of Table 4 and filtering through a Teflon® filter having a pore size of 0.2 μm.

TABLE 4

| Protective topcoat | Polymer (pbw) | Additive (pbw) | Organic solvent (pbw) |
|---|---|---|---|
| TC1 | Topcoat Polymer* (100) | tri-n-octylamine (0.2) | diisoamyl ether (2,700) + 2-methyl-1-butanol (270) |

*Topcoat Polymer
Mw = 8,800
Mw/Mn = 1.69

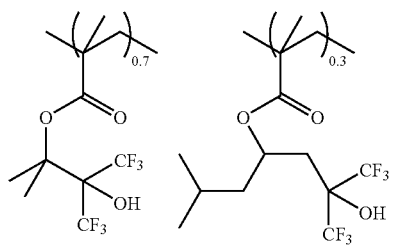

Double Patterning Test I

On a substrate (silicon wafer) having an antireflective coating (ARC-29A) of 80 nm thick, each of Resists 1, 2 and Comparative Resist 1 shown in Table 1 was spin coated, then baked on a hot plate at 95° C. for 60 seconds to form a resist film of 100 nm thick. The protective coating composition (TC1) shown in Table 4 was coated on the resist film and baked at 90° C. for 60 seconds to form a protective topcoat of 50 nm thick.

Using an ArF excimer laser immersion lithography scanner model NSR-S610C (Nikon Corp., NA 1.30, σ 0.98/0.78, 35° cross-pole illumination, azimuthally polarized illumination, 6% halftone phase shift mask), the coated substrate was exposed to a Y-direction 40-nm line/160-nm pitch pattern. Immediately after exposure, the resist film was baked (PEB) at 95° C. for 60 seconds and then developed for 30 seconds with a 2.38 wt % TMAH aqueous solution, obtaining a first line-and-space pattern having a line-to-space ratio of 1:3 and a line size of 40 nm.

The first pattern was irradiated in air with UV under the conditions shown in Table 5 and then baked at 200° C. for 60 seconds.

Figure 9:
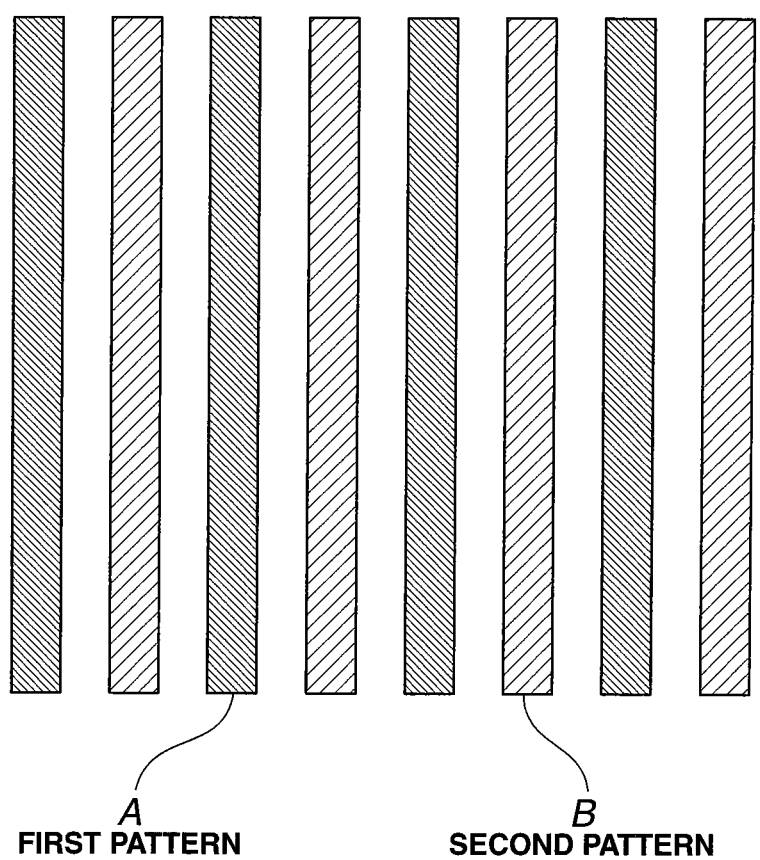
FIG. 9 is a plan view of a resist pattern evaluated by double patterning test I.

Next, the same resist composition and protective coating composition were coated on the first pattern-bearing substrate and baked under the same conditions as previous. Using an ArF excimer laser immersion lithography scanner model NSR-S610C (Nikon Corp., NA 1.30, σ 0.98/0.78, 35° cross-pole illumination, azimuthally polarized illumination, 6% halftone phase shift mask), the coated substrate was exposed to a Y-direction 40-nm line/160-nm pitch pattern which was shifted 80 nm from the first pattern in X direction. Immediately after exposure, the resist film was baked (PEB) at 100° C. for 60 seconds and then developed for 30 seconds with a 2.38 wt % TMAH aqueous solution, obtaining a second line-and-space pattern having a line size of 40 nm. There were formed parallel extending first pattern lines A and second pattern lines B as illustrated in FIG. 9. The line width of the first and second pattern lines was measured by a measuring SEM (S-9380, Hitachi, Ltd.).

The results are shown in Table 5.

TABLE 5

| | | Resist composition | Wavelength and dose of UV irradiation | Size of 1st pattern after 2nd pattern formation | Size of 2nd pattern |
|---|---|---|---|---|---|
| Example | 25 | Resist 1 | 222 nm, 50 mJ/cm² | 38 nm | 40 nm |
| | 26 | Resist 2 | 222 nm, 50 mJ/cm² | 36 nm | 40 nm |
| | 27 | Resist 1 | 248 nm, 100 mJ/cm² | 39 nm | 41 nm |
| | 28 | Resist 1 | 10 sec exposure to HP Hg lamp (1 J/cm² overall wavelength) | 37 nm | 41 nm |
| Comparative Example | 4 | Resist 1 | — | pattern vanished | 41 nm |
| | 5 | Comparative Resist 1 | 222 nm, 50 mJ/cm² | pattern vanished | 41 nm |

Double Patterning Test II

On a substrate (silicon wafer) having an antireflective coating (ARC-29A) of 80 nm thick, each of the resist compositions of Examples 1 to 17 and Comparative Example 1 shown in Table 3 was spin coated, then baked on a hot plate at 95° C. for 60 seconds to form a resist film of 100 nm thick. The protective coating composition (TC1) shown in Table 4 was coated on the resist film and baked at 90° C. for 60 seconds to form a protective topcoat of 50 nm thick.

Using an ArF excimer laser immersion lithography scanner model NSR-S610C (Nikon Corp., NA 1.30, σ 0.98/0.78, 35° dipole illumination, 6% halftone phase shift mask) with s-polarized illumination, the coated substrate was exposed to a X-direction 40-nm line-and-space pattern. Immediately after exposure, the resist film was baked (PEB) at 95° C. for 60 seconds and then developed for 30 seconds with a 2.38 wt % TMAH aqueous solution, obtaining a first line-and-space pattern having a size of 40 nm.

The first pattern was irradiated in air with UV under the conditions shown in Table 6 and then baked at 200° C. for 60 seconds.

Figure 10:
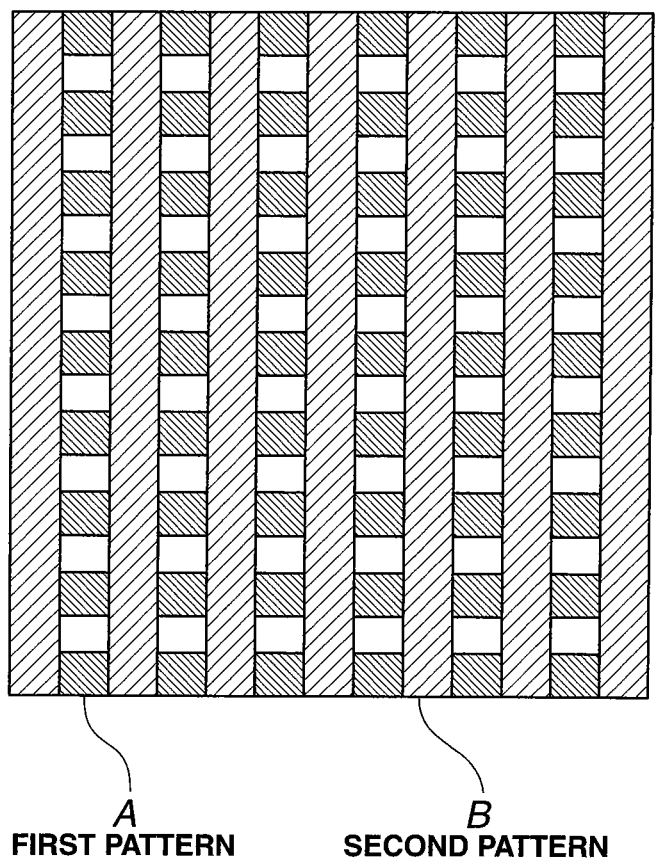
FIG. 10 is a plan view of a resist pattern evaluated by double patterning test II.

Next, the same resist composition and protective coating composition were coated on the first pattern-bearing substrate and baked under the same conditions as previous. Using an ArF excimer laser immersion lithography scanner model NSR-S610C (Nikon Corp., NA 1.30, σ 0.98/0.78, 35° dipole illumination, 6% halftone phase shift mask) with s-polarized illumination, the coated substrate was exposed to a Y-direction 40-nm line-and-space pattern. Immediately after exposure, the resist film was baked (PEB) at 100° C. for 60 seconds and then developed for 30 seconds with a 2.38 wt % TMAH aqueous solution, obtaining a second line-and-space pattern having a size of 40 nm. There were formed orthogonally crossing first pattern lines A and second pattern lines B as illustrated in FIG. 10. The line width of the first and second pattern lines was measured by a measuring SEM (S-9380, Hitachi, Ltd.).

The results are shown in Table 6.

TABLE 6

|  |  | Resist composition | Wavelength and dose of UV irradiation | Size of 1st Pattern after 2nd pattern formation | Size of 2nd pattern |
|---|---|---|---|---|---|
| Example | 29 | Resist 1 | 222 nm, 50 mJ/cm² | 40 nm | 40 nm |
|  | 30 | Resist 2 | 222 nm, 50 mJ/cm² | 41 nm | 40 nm |
|  | 31 | Resist 3 | 222 nm, 50 mJ/cm² | 40 nm | 40 nm |
|  | 32 | Resist 4 | 222 nm, 50 mJ/cm² | 42 nm | 40 nm |
|  | 33 | Resist 5 | 222 nm, 50 mJ/cm² | 40 nm | 41 nm |
|  | 34 | Resist 6 | 222 nm, 50 mJ/cm² | 41 nm | 42 nm |
|  | 35 | Resist 7 | 222 nm, 50 mJ/cm² | 42 nm | 41 nm |
|  | 36 | Resist 8 | 222 nm, 50 mJ/cm² | 41 nm | 39 nm |
|  | 37 | Resist 9 | 222 nm, 50 mJ/cm² | 41 nm | 38 nm |
|  | 38 | Resist 10 | 222 nm, 50 mJ/cm² | 40 nm | 40 nm |
|  | 39 | Resist 11 | 222 nm, 50 mJ/cm² | 43 nm | 40 nm |
|  | 40 | Resist 12 | 222 nm, 50 mJ/cm² | 42 nm | 40 nm |
|  | 41 | Resist 13 | 222 nm, 50 mJ/cm² | 42 nm | 41 nm |
|  | 42 | Resist 14 | 222 nm, 50 mJ/cm² | 39 nm | 39 nm |
|  | 43 | Resist 15 | 222 nm, 50 mJ/cm² | 38 nm | 40 nm |
|  | 44 | Resist 16 | 222 nm, 50 mJ/cm² | 39 nm | 40 nm |
|  | 45 | Resist 1 | 248 nm, 100 mJ/cm² | 40 nm | 40 nm |
|  | 46 | Resist 17 | 222 nm, 50 mJ/cm² | 40 nm | 40 nm |
|  | 47 | Resist 1 | 10 sec exposure to HP Hg lamp (1 J/cm² overall wavelength) | 39 nm | 40 nm |
| Comparative Example | 6 | Resist 1 | — | pattern vanished | 41 nm |
|  | 7 | Comparative Resist 1 | 222 nm, 150 mJ/cm² | pattern vanished | 41 nm |

In Examples 1 to 24, irradiation of UV (wavelength 222 nm, 248 nm, or exposure to high-pressure Hg lamp for 10 seconds in an overall wavelength dose of 1 J/cm²) caused the resist films to be insolubilized in the resist solvent and developer. In Comparative Examples 2 and 3, irradiation of the resist films with UV having 172 nm wavelength caused the resist films to be insolubilized in the developer if the system was previously purged with nitrogen gas for 5 minutes. Absent nitrogen purging, ozone generated and the resist films were substantially thinned. Nitrogen purging for every single wafer leads to a reduced throughput. In Comparative Example 1, the resist film of Comparative Resist 1 not containing hydroxynaphthyl remained dissolvable in the solvent and developer even after UV irradiation.

For the resist compositions of Examples 25 to 28, the formation of a 2nd pattern having lines located between lines of the 1st pattern was observed. In Comparative Examples 4 and 5, a 2nd pattern was formed, but the 1st pattern did not exist because it had been dissolved upon coating of the second resist material and/or because it had been dissolved in the developer as a result of exposure to light for the second resist pattern exposure.

For the resist compositions of Examples 29 to 47, the formation of a 2nd pattern having lines orthogonally crossing lines of the 1st pattern to define a rectangular capacitor contact pattern was observed. In Comparative Examples 6 and 7, a 2nd pattern was formed, but the 1st pattern did not exist because it had been dissolved upon coating of the second resist material and/or because it had been dissolved in the developer as a result of exposure to light for the second resist pattern exposure.

While the invention has been described with reference to a preferred embodiment, it will be understood by those skilled in the art that various changes may be made and equivalents may be substituted for elements thereof without departing from the scope of the invention. Therefore, it is intended that the invention not be limited to the particular embodiment disclosed as the best mode contemplated for carrying out this invention, but that the invention will include all embodiments falling within the scope of the appended claims.

Japanese Patent Application Nos. 2008-316688 and 2009-090895 are incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A process for forming a pattern, comprising the steps of:
applying a first positive resist composition comprising a copolymer comprising recurring units having hydroxynaphthyl and recurring units having an alkaline solubility that increases under the action of acid onto a substrate to form a first resist coating, heat treating, exposing the first resist coating to high-energy radiation, heat treating, and developing the exposed resist coating with a developer to form a first resist pattern,
said copolymer comprising recurring units having hydroxynaphthyl and recurring units having an alkaline solubility that increases under the action of acid comprising recurring units (a1) and recurring units (b) shown by the general formula (1):

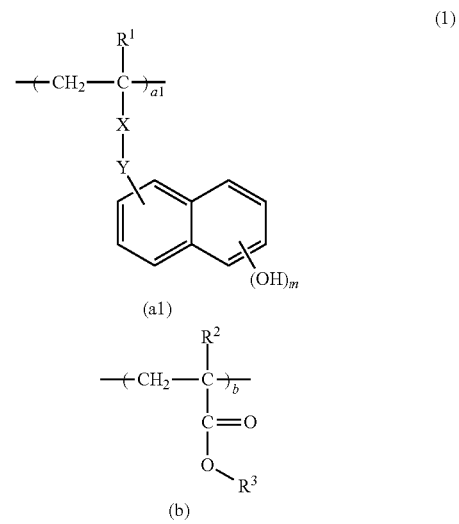

wherein $R^1$ and $R^2$ are each independently hydrogen or methyl, X is a single bond, Y is a single bond or a straight or branched $C_1$-$C_6$ alkylene group, m is 1 or 2, $R^3$ is an acid labile group, a1 and b are numbers in the range: $0 < a1 < 1.0$, $0 < b < 1.0$, and $0 < a1 + b < 1.0$,
causing the first resist coating to crosslink and cure by irradiation of high-energy radiation having a wavelength of more than 200 nm to 320 nm in air,
applying a second positive resist composition onto the first resist pattern-bearing substrate to form a second resist coating, heat treating, exposing the second resist coating to high-energy radiation, heat treating, and developing the second resist coating with a developer to form a second resist pattern.

2. A process for forming a pattern according to claim 1, comprising the steps of:
applying a first positive resist composition comprising a copolymer comprising recurring units having hydroxynaphthyl and recurring units having an alkaline solubility that increases under the action of acid onto a substrate to form a first resist coating, heat treating, exposing the first resist coating to high-energy radiation, heat treating, and developing the exposed resist coating with a developer to form a first resist pattern, said copolymer comprising recurring units having hydroxynaphthyl and recurring units having an alkaline solubility that increases under the action of acid comprising recurring units (a1) and recurring units (b) shown by the general formula (1):

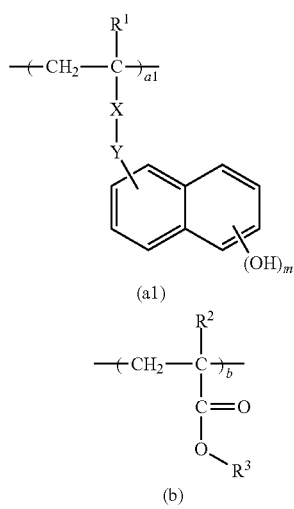

wherein $R^1$ and $R^2$ are each independently hydrogen or methyl, X is a single bond, Y is a single bond or a straight or branched $C_1$-$C_6$ alkylene group, m is 1 or 2, $R^3$ is an acid labile group, a1 and b are numbers in the range: 0<a1<1.0, 0<b<1.0, and 0<a1+b≦1.0, causing the first resist coating to crosslink and cure by irradiation of high-energy radiation having a wavelength of more than 200 nm to 320 nm in air and application of heat, applying a second positive resist composition onto the first resist pattern-bearing substrate to form a second resist coating, heat treating, exposing the second resist coating to high-energy radiation, heat treating, and developing the second resist coating with a developer to form a second resist pattern.

3. A process for forming a pattern according to claim 1, comprising the steps of:
applying a first positive resist composition comprising a copolymer comprising recurring units having hydroxynaphthyl and recurring units having an alkaline solubility that increases under the action of acid onto a substrate to form a first resist coating, heat treating, exposing the first resist coating to high-energy radiation, heat treating, and developing the exposed resist coating with a developer to form a first resist pattern, said copolymer comprising recurring units having hydroxynaphthyl and recurring units having an alkaline solubility that increases under the action of acid comprising recurring units (a1) and recurring units (b) shown by the general formula (1):

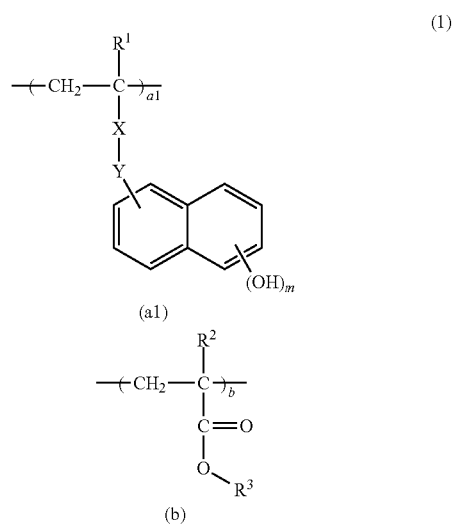

wherein $R^1$ and $R^2$ are each independently hydrogen or methyl, X is a single bond, Y is a single bond or a straight or branched $C_1$-$C_6$ alkylene group, m is 1 or 2, $R^3$ is an acid labile group, a1 and b are numbers in the range: 0<a1<1.0, 0<b<1.0, and 0<a1+b≦1.0, causing the first resist coating to crosslink and cure by application of heat and subsequent irradiation of high-energy radiation having a wavelength of more than 200 nm to 320 nm in air, applying a second positive resist composition onto the first resist pattern-bearing substrate to form a second resist coating, heat treating, exposing the second resist coating to high-energy radiation, heat treating, and developing the second resist coating with a developer to form a second resist pattern.

4. The process of claim 1 wherein the high-energy radiation having a wavelength of more than 200 nm to 320 nm used in the step of causing the first resist coating to crosslink and cure is KrBr excimer light of 206 nm wavelength, KrCl excimer light of 222 nm wavelength, KrF excimer light of 248 nm wavelength, XeBr excimer light of 283 nm wavelength, XeCl excimer light of 308 nm wavelength, or emission spanning 254 nm wavelength from a low-pressure mercury lamp, high-pressure mercury lamp or metal halide lamp.

5. The process of claim 1 wherein the exposure steps to form the first and second resist patterns are by immersion lithography using an ArF excimer laser of 193 nm wavelength and a liquid having a refractive index of at least 1.4 interposed between a lens and the substrate.

6. The process of claim 5 wherein the liquid is water.

7. The process of claim 1 wherein the first resist pattern includes spaces, the second resist pattern is formed in the spaces of the first resist pattern, whereby the distance between the first and second patterns is reduced.

8. The process of claim 1 wherein the first resist pattern crosses the second resist pattern.

9. The process of claim 1 wherein the second resist pattern is formed in a space area where the first resist pattern is not formed and in a different direction from the first resist pattern.

10. The process of claim 1, 2 or 3 wherein said copolymer comprising recurring units having hydroxynaphthyl and recurring units having an alkaline solubility that increases under the action of acid comprises recurring units (a1), (b), (c1), and (c2) shown by the general formula (2):

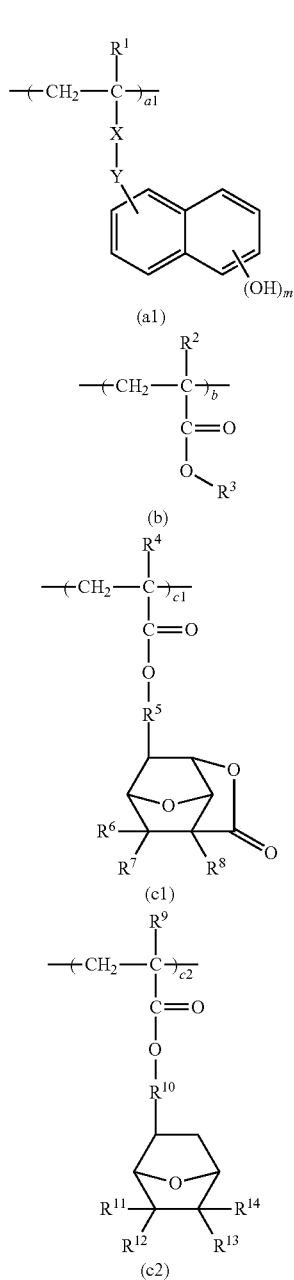

(2)

wherein $R^1$, $R^2$, $R^4$ and $R^9$ are each independently hydrogen or methyl, X is a single bond, Y is a single bond or a straight or branched $C_1$-$C_6$ alkylene group, m is 1 or 2, $R^3$ is an acid labile group, $R^5$ and $R^{10}$ are each independently a single bond or a straight, branched or cyclic $C_1$-$C_6$ alkylene group which may contain an ether or ester radical, the straight, branched or cyclic $C_1$-$C_6$ alkylene group having a primary or secondary carbon atom bonded to the ester moiety in the formula, $R^6$, $R^7$, $R^8$, $R^{11}$, $R^{12}$, $R^{13}$, and $R^{14}$ are each independently hydrogen or a straight, branched or cyclic $C_1$-$C_6$ alkyl group, a1, b, c1, and c2 are numbers in the range: $0<a1<1.0$, $0<b<1.0$, $0\leq c1<1.0$, $0\leq c2<1.0$, $0<c1+c2<1.0$, and $0<a1+b+c1+c2\leq 1.0$.

11. The process of claim 1, wherein said recurring units (a1) having hydroxynaphthyl is derived from at least one monomer selected from the group consisting of the following formulae:

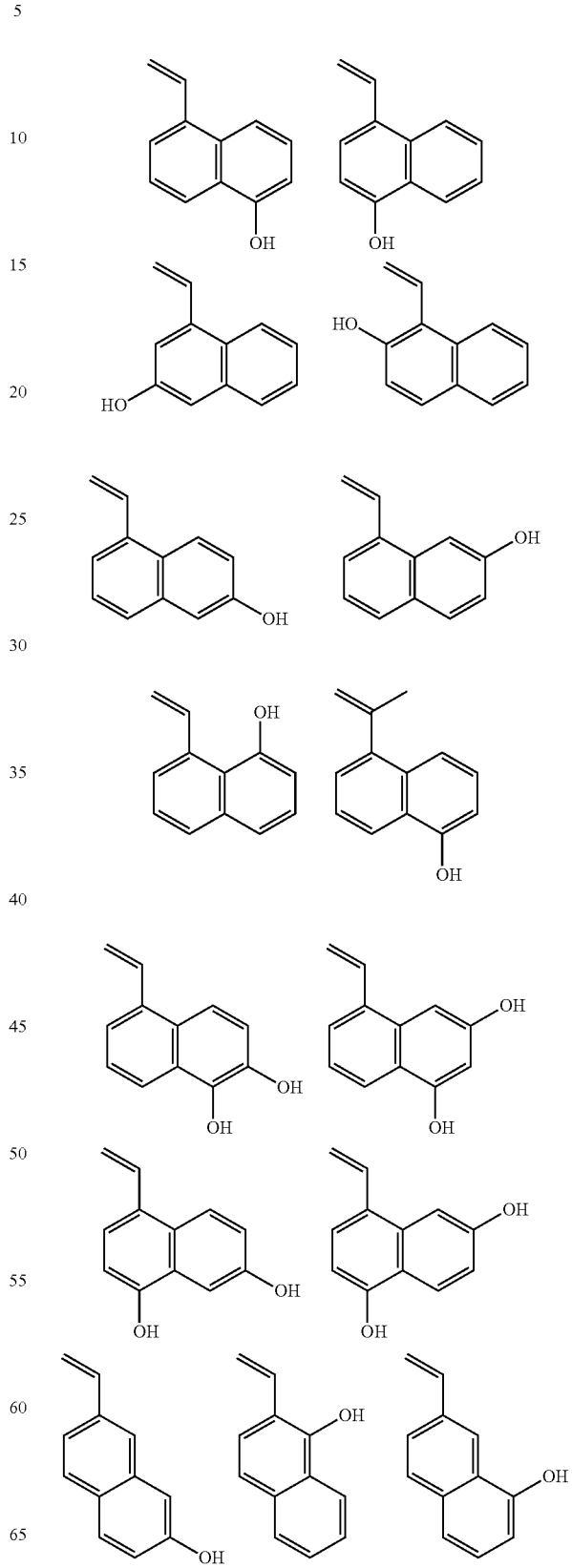

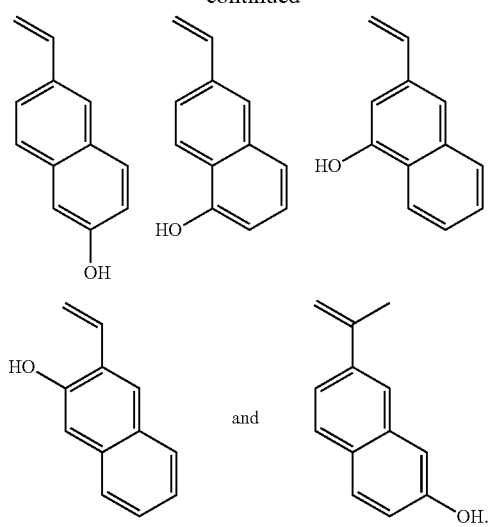
12. The process of claim 2, wherein said recurring units (a1) having hydroxynaphthyl is derived from at least one monomer selected from the group consisting of the following formulae:
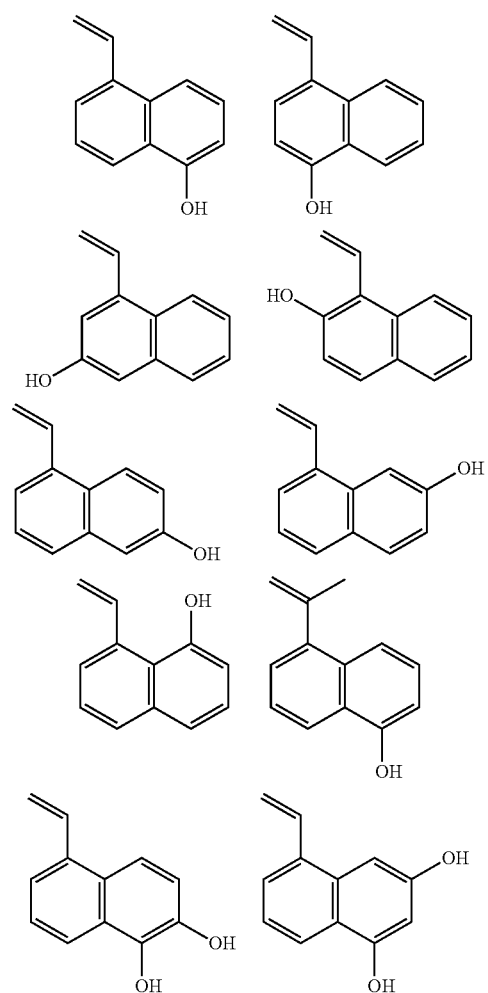
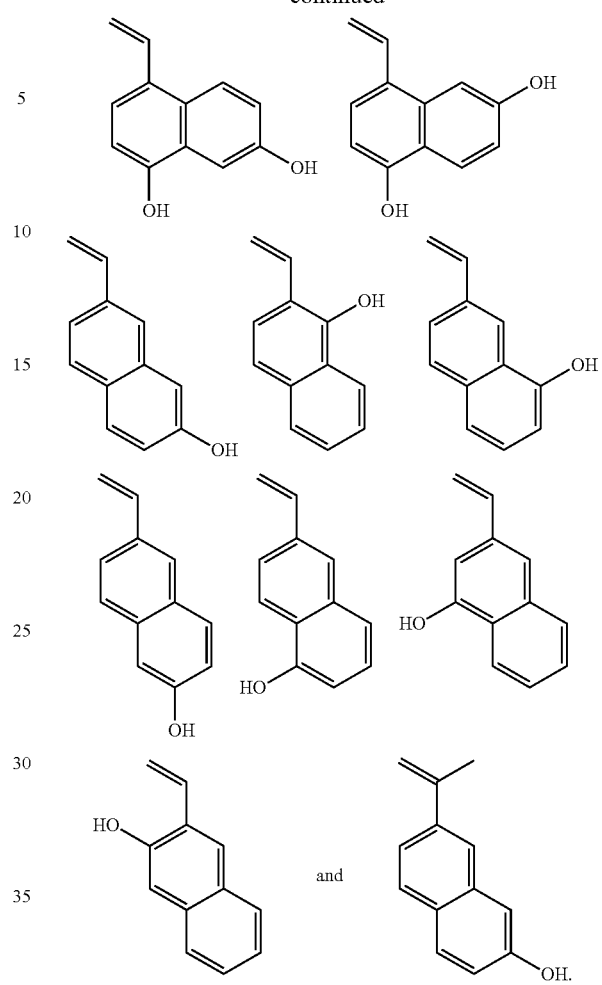
13. The process of claim 3, wherein said recurring units (a1) having hydroxynaphthyl is derived from at least one monomer selected from the group consisting of the following formulae:
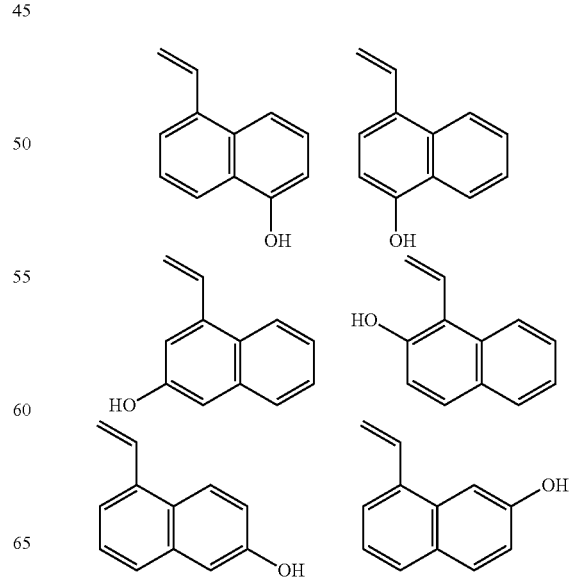

-continued
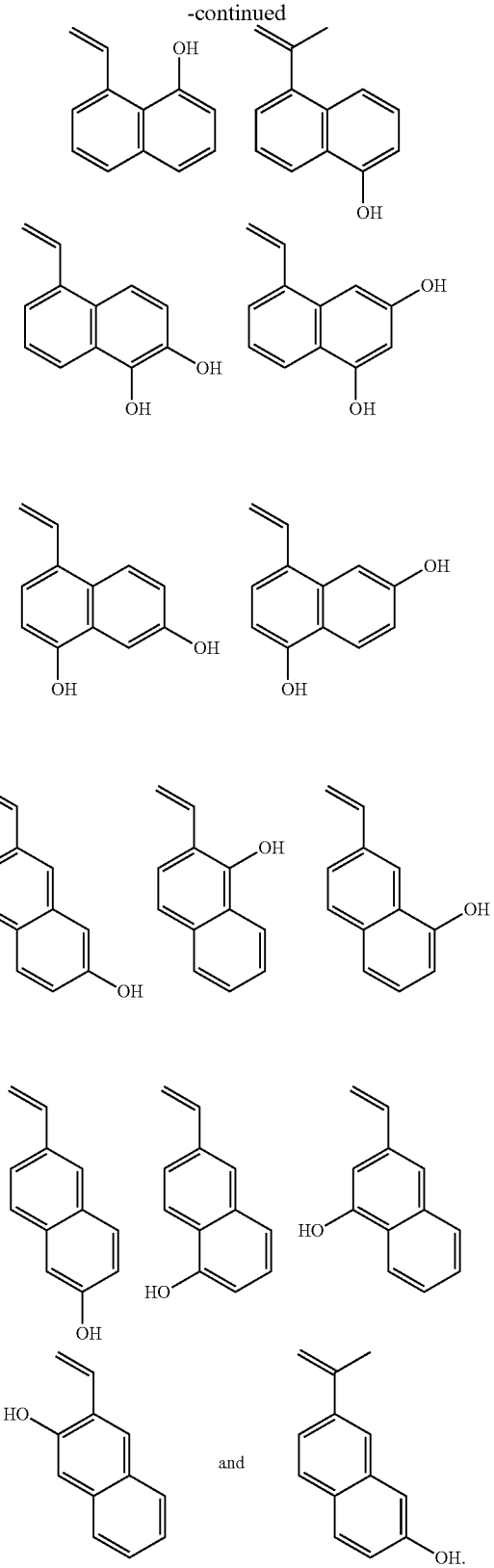
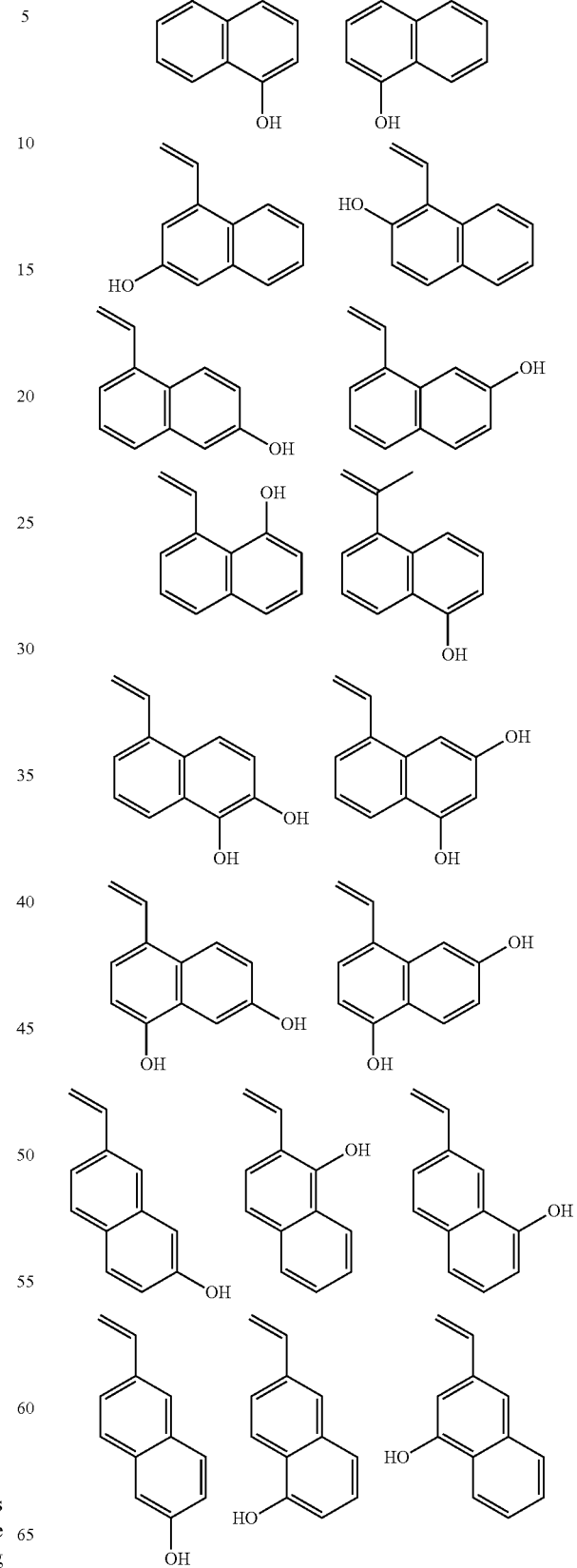
14. The process of claim 10, wherein said recurring units (a1) having hydroxynaphthyl is derived from at least one monomer selected from group consisting of the following formulae:

-continued
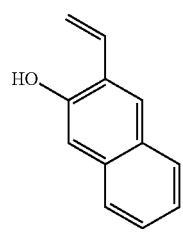 and 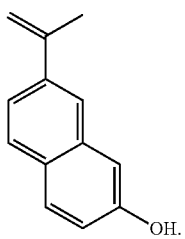
* * * * *